(12) United States Patent
Isshiki

(10) Patent No.: US 10,089,426 B2
(45) Date of Patent: Oct. 2, 2018

(54) LOGIC CIRCUIT GENERATION DEVICE AND METHOD

(71) Applicant: TOKYO INSTITUTE OF TECHNOLOGY, Meguro-ku, Tokyo (JP)

(72) Inventor: Tsuyoshi Isshiki, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 55 days.

(21) Appl. No.: 15/103,793

(22) PCT Filed: Dec. 11, 2014

(86) PCT No.: PCT/JP2014/082797
§ 371 (c)(1),
(2) Date: Jun. 10, 2016

(87) PCT Pub. No.: WO2015/087957
PCT Pub. Date: Jun. 18, 2015

(65) Prior Publication Data
US 2016/0299998 A1    Oct. 13, 2016

(30) Foreign Application Priority Data

Dec. 12, 2013  (JP) .................................. 2013-256881

(51) Int. Cl.
G06F 17/50    (2006.01)
(52) U.S. Cl.
CPC ........ G06F 17/505 (2013.01); *G06F 17/5022* (2013.01); *G06F 17/5045* (2013.01)
(58) Field of Classification Search
CPC . G06F 17/505; G06F 17/5045; G06F 17/5022
See application file for complete search history.

(56) References Cited

U.S. PATENT DOCUMENTS 5,530,841 A    6/1996 Gregory et al.
6,415,420 B1 *   7/2002 Cheng ................. G06F 17/5045
                                                716/103

(Continued)

FOREIGN PATENT DOCUMENTS

CN    102572390 A    7/2012
EP      0991000 A2    4/2000
(Continued)

OTHER PUBLICATIONS

Matsuba et al.: "Clock Frequency Enhancement by SSA Transformation of Hardware Behavioral Descriptions"; DA Symposium 2008, Aug. 19, 2008, pp. 103-108 with English Abstract.

(Continued)

Primary Examiner — Helen Rossoshek
(74) Attorney, Agent, or Firm — Merchant & Gould P.C.

(57) ABSTRACT

A specific information processing function, which assumes circuit implementation, is described in a programming language, and from this description, an RTL description that can be logic synthesized is automatically generated. A logic circuit generation device includes: a control flow graph generation unit that generates a control flow graph; a control flow degenerate conversion unit that generates a control flow degenerate program by removing all condition branch instructions from the control flow graph; a data flow graph generation unit that generates a data flow graph from the control flow degenerate program; and a logic circuit description output unit that generates logic circuit description indicating a sequential circuit in which a rooted branch of the data flow graph corresponds to the wiring of the logic circuit and a node of the data flow graph corresponds to a computing element of the logic circuit.

21 Claims, 34 Drawing Sheets

```
01: typedef int INT8, INT10;
02: typedef INT8 S_INT8, M_INT8;
03: typedef INT10 S_INT10;
04: #pragma bit_width 8 INT8      // INT8 TYPE: 8 BIT-WIDTH ATTRIBUTE
05: #pragma bit_width 10 INT10    // INT10 TYPE: 10 BIT-WIDTH ATTRIBUTE
06: #pragma memory M_INT8          // M_INT8 TYPE: MEMORY ATTRIBUTE
07: #pragma state S_INT8 S_INT10  // S_INT8 TYPE, S_INT10 TYPE: REGISTER ATTRIBUTE
08:
09: void top2(INT8 pin, S_INT8 pw[3][3]) {
10:     static S_INT10 pos = 0;    // 10 BIT-WIDTH ATTRIBUTE, REGISTER ATTRIBUTE (STATIC VARIABLE)
11:     static M_INT8 lbuf1[1024], lbuf2[1024];  // 8 BIT-WIDTH, 1024 WORD MEMORY
12:     INT8 lb1, lb2;
13:     lb1 = lbuf1[pos];
14:     lb2 = lbuf2[pos];
15:     lbuf1[pos] = pin;
16:     lbuf2[pos] = lb1;
17:     pw[0][2] = pw[0][1]; pw[0][1] = pw[0][0]; pw[0][0] = pin;
18:     pw[1][2] = pw[1][1]; pw[1][1] = pw[1][0]; pw[1][0] = lb1;
19:     pw[2][2] = pw[2][1]; pw[2][1] = pw[2][0]; pw[2][0] = lb2;
20:     pos = (pos + 1) & 0x3ff;   // pos : 0,1,2,..., 1022,1023,0,1, ...
21: }
```

(56) References Cited

U.S. PATENT DOCUMENTS

| | | | | |
|---|---|---|---|---|
| 6,625,797 | B1* | 9/2003 | Edwards | G06F 8/447 |
| | | | | 702/108 |
| 6,816,828 | B1* | 11/2004 | Ikegami | G06F 17/5022 |
| | | | | 703/13 |
| 7,017,043 | B1* | 3/2006 | Potkonjak | G06T 1/0021 |
| | | | | 713/176 |
| 7,802,213 | B2* | 9/2010 | Oktem | G06F 17/5059 |
| | | | | 716/108 |
| 2003/0172055 | A1 | 9/2003 | Prakash et al. | |
| 2005/0044344 | A1 | 2/2005 | Stevens | |
| 2007/0157166 | A1* | 7/2007 | Stevens | G06F 15/7867 |
| | | | | 717/114 |
| 2009/0228859 | A1 | 9/2009 | Aoyama | |
| 2013/0091482 | A1* | 4/2013 | Carrion | G06F 17/505 |
| | | | | 716/132 |

FOREIGN PATENT DOCUMENTS

| | | |
|---|---|---|
| JP | 2000-113026 A | 4/2000 |
| JP | 2003-076728 A | 3/2003 |
| JP | 2006-011878 A | 1/2006 |
| JP | 2009-211614 A | 9/2009 |
| JP | 2010-118081 A | 5/2010 |
| JP | 2011-134308 A | 7/2011 |
| JP | 2012-118835 A | 6/2012 |

OTHER PUBLICATIONS

Grötker et al.: "System Design with SystemC"; Kluwer Academic Publishers, 2002 with English translation (translation supervised by Kakimoto et al., Maruzen Publishing Co.Ltd, 2003, ISBN 4-621-07144-0 C3055).

Wakabayashi: "Use of High-Level Synthesis to Generate Hardware from Software"; IEICE Fundamental Review,2012, vol. 6, No. 1, p. 37-50 with English Abstract.

International Search Report and Written Opinion for International Application No. PCT/JP2014/082797 dated Mar. 10, 2015.

Ishimori et al., "Extension of High Level Synthesis System CCAP for AMP Multi-Core System Design", Technical Report of IEICE, The Institute of Electronics, Information and Communication Engineers, 108(414):81-86 (2009)—English Abstract.

Office Action for Japanese Patent Application No. 2013-256881, dated Jun. 23, 2015 (drafted Jun. 11, 2015).

Office Action for Chinese Patent Application No. 201480067351.2, dated Jul. 24, 2018.

"An intermediate structure of high-level synthesis", Master's thesis of Harbin Engineering University, the 4th phase of book, I135-18 (2003).

* cited by examiner

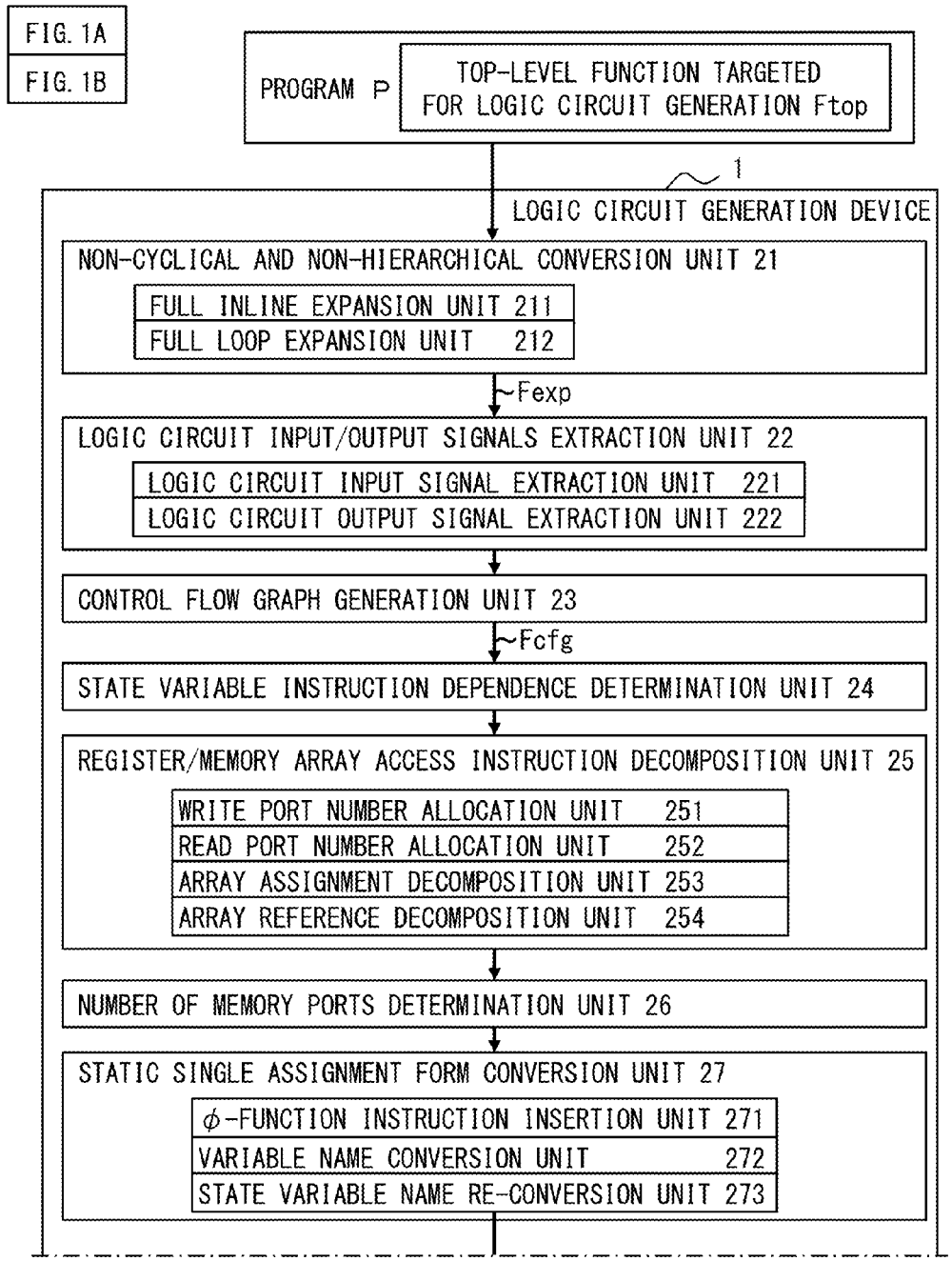

FIG.3

```
01:    typedef int INT10, INT12;
02:    typedef INT12 S_INT12, M_INT12;
03:    typedef struct
04:    {
05:      char a;
06:      INT10 b;
07:      INT12 c;
08:    } ST_A;
09:    INT10 a, b;
10:    INT12 c, d;
11:    S_INT12 st_g;
12:    M_INT12 mem[1024];
13:    ST_A st_h;
```

FIG.4

```
// ADD "10 BIT-WIDTH" ATTRIBUTE TO INT10 TYPE
#pragma bit_width 10 INT10

// ADD "12 BIT-WIDTH" ATTRIBUTE TO INT12 TYPE
#pragma bit_width 12 INT12

// ADD "MEMORY" ATTRIBUTE TO M_INT12 TYPE
#pragma memory M_INT12

// ADD "REGISTER" ATTRIBUTE TO S_INT12 TYPE AND ST_A TYPE
#pragma state S_INT12 ST_A
```

```
01:  typedef int INT10, INT12;
02:  typedef INT12 S_INT12;
03:  #pragma bit_width 10 INT10   // INT10 TYPE: 10 BIT-WIDTH ATTRIBUTE
04:  #pragma bit_width 12 INT12   // INT12 TYPE: 12 BIT-WIDTH ATTRIBUTE
05:  #pragma state S_INT12        // S_INT12 TYPE: REGISTER ATTRIBUTE
06:
07:  int func0(int a, int b) { ... }
08:
09:  INT12 top0(INT10 a, INT10 b, INT12 c) {
10:    S_INT12 d, e;   // 12 BIT-WIDTH ATTRIBUTE, REGISTER ATTRIBUTE
11:    d = func0(a, b);
12:    e = func0(d, c);
13:    return e;
14:  }
```

```
01:  typedef int INT10, S_INT2;
02:  #pragma bit_width 10 INT10    // INT10 TYPE: 10 BIT-WIDTH ATTRIBUTE
03:  #pragma bit_width 2 S_INT2    // S_INT2 TYPE: 2 BIT-WIDTH ATTRIBUTE
04:  #pragma state S_INT2          // S_INT2 TYPE: REGISTER ATTRIBUTE
05:
06:  INT12 top1(INT10 a) {
07:    static S_INT2 stt = 0;   // stt: S_INT2 TYPE STATIC VARIABLE
08:    int prev_stt = stt;
09:    switch(stt) {
10:    case 0: if(a != 0) { stt = 1;} break;
11:    default: stt = (stt + 1) & 0x3; break;
12:    }
13:    return prev_stt;
14:  }
```

FIG.7

```
01:  typedef int INT8, INT10;
02:  typedef INT8 S_INT8, M_INT8;
03:  typedef INT10 S_INT10;
04:  #pragma bit_width 8 INT8      // INT8 TYPE: 8 BIT-WIDTH ATTRIBUTE
05:  #pragma bit_width 10 INT10    // INT10 TYPE: 10 BIT-WIDTH ATTRIBUTE
06:  #pragma memory M_INT8         // M_INT8 TYPE: MEMORY ATTRIBUTE
07:  #pragma state S_INT8 S_INT10  // S_INT8 TYPE, S_INT10 TYPE: REGISTER ATTRIBUTE
08:
09:  void top2(INT8 pin, S_INT8 pw[3][3]) {
10:    static S_INT10 pos = 0;      // 10 BIT-WIDTH ATTRIBUTE, REGISTER ATTRIBUTE (STATIC VARIABLE)
11:    static M_INT8 lbuf1[1024], lbuf2[1024];  // 8 BIT-WIDTH, 1024 WORD MEMORY
12:    INT8 lb1, lb2;
13:    lb1 = lbuf1[pos];
14:    lb2 = lbuf2[pos];
15:    lbuf1[pos] = pin;
16:    lbuf2[pos] = lb1;
17:    pw[0][2] = pw[0][1]; pw[0][1] = pw[0][0]; pw[0][0] = pin;
18:    pw[1][2] = pw[1][1]; pw[1][1] = pw[1][0]; pw[1][0] = lb1;
19:    pw[2][2] = pw[2][1]; pw[2][1] = pw[2][0]; pw[2][0] = lb2;
20:    pos = (pos + 1) & 0x3ff;   // pos : 0, 1, 2, ···, 1022, 1023, 0, 1, ···
21:  }
```

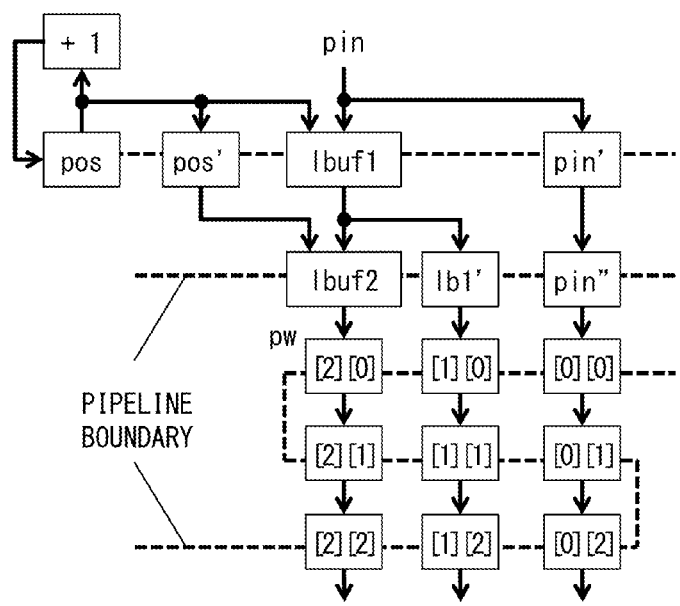

FIG.8

```
01:  // SOFTWARE DESCRIPTION OF LINE BUFFER UPDATING :
02:     lb1 = lbuf1[pos];
03:     lb2 = lbuf2[pos];
04:     lbuf1[pos] = pin;
05:     lbuf2[pos] = lb1;
```

```
01: // RTL DESCRIPTION IN Verilog LANGUAGE OF LINE BUFFER UPDATING :
02:    always@(posedge clk) begin
03:       lb1 <= lbuf1[pos];       // lb1 CAN BE REFERRED AFTER ONE CLOCK
04:       lbuf1[pos] <= pin;       // READ AND WRITE ARE PERFORMED IN SAME CLOCK
05:       pos_nxt <= pos;          // DELAY pos BY ONE CLOCK AND ASSIGN TO pos_nxt
06:       lb2 <= lbuf2[pos_nxt];   // ACCESS TO lbuf2 IS DELAYED BY ONE CLOCK FROM lbuf1
07:       lbuf2[pos_nxt] <= lb1;   // WRITE AT TIMING AT lbuf1 CAN BE REFFERED
08:    end
```

FIG.9

```
01:   int funcA() { return funcB(4);}
02:   int funcB(int a) { return (a == 1) ? 1 : funcB(a - 1) + 1;}
```

FIG.10

```
01:   int funcA() {
02:     int funcB_0; // STORE RETURN VALUE OF funcB(4)
03:     // INLINE EXPANSION OF funcB(4)
04:     { int a = 4; funcF_0 = (a == 1) ? 1 : funcB(a - 1) + 1;}
05:     return funcB_0;
06:   }
```

FIG.11

```
01:   int funcA() {
02:     int funcB_0; // STORE RETURN VALUE OF funcB(4)
03:     { funcB_0 = funcB(3) + 1;} // INLINE EXPANSION OF funcB(4)
04:     return funcB_0;
05:   }
```

FIG.12

```
01:  int funcA() { // RESULT OF FULL INLINE FUNCTION EXPANSION
02:    int funcB_0;              // STORE RETURN VALUE OF funcB(4)
03:    { int funcB_1;            // STORE RETURN VALUE OF funcB(3)
04:      { int funcB_2;          // STORE RETURN VALUE OF funcB(2)
05:        { int funcB_3;        // STORE RETURN VALUE OF funcB(1)
06:          funcB_3 = 1;}       // INLINE EXPANSION OF funcB(1)
07:          funcB_2 = funcB_3 + 1;}  // INLINE EXPANSION OF funcB(2)
08:        funcB_1 = funcB_2 + 1;}    // INLINE EXPANSION OF funcB(3)
09:      funcB_0 = funcB_1 + 1;}      // INLINE EXPANSION OF funcB(4)
10:    return funcB_0;
11:  }
```

FIG.13A

```
01:  int funcD(int a) {
02:    int i;
03:    for(i = 0; i < 3; i ++) {
04:      a += a * i + 1;
05:    }
06:    return a;
07:  }
```

FIG.13B

```
01:  int funcD(int a) {
02:    a += a * 0 + 1;
03:    a += a * 1 + 1;
04:    a += a * 2 + 1;
05:    return a;
06:  }
```

FIG.14A

```
01:  typedef char INT8;
02:  typedef INT8 M_INT8;
03:  #pragma memory M_INT8 // MEMORY ATTRIBUTE
04:  M_UINT8 A[256];  // MEMORY ATTRIBUTE ARRAY VARIABLE
05:  INT8 top3(INT8 a, INT8 b) {
06:      INT8 v = 0, u = 0;
07:      if(a > 0) {
08:          v = A[a];      // READ PORT 0
09:          A[a] = v + 1;  // WRITE PORT 0
10:      }
11:      if(b > 0) {
12:          u = A[b];      // READ PORT 1
13:          A[b] = u + 1;  // WRITE PORT 1
14:      }
15:      else{
16:          A[0] = v + u;  // WRITE PORT 1
17:      }
18:      v = v + u;
19:      return v;
20:  }
```

FIG.14B

```
01:  INT8 top3(INT8 a, INT8 b) {
02:      INT8 v = 0, u = 0;
03:      if(a > 0) {
04:          A0r = a;       // READ ADDRESS 0
05:          v = A[A0r];
06:          A0w = a;       // WRITE ADDRESS 0
07:          A0d = v + 1;   // WRITE DATA 0
08:          A[A0w] = A0d;
09:      }
10:      if(b > 0) {
11:          A1r = b;       // READ ADDRESS 1
12:          u = A[A1r];
13:          A1w = b;       // WRITE ADDRESS 1
14:          A1d = u + 1;   // WRITE DATA 1
15:          A[A1w] = A1d;
16:      }
17:      else{
18:          A1w = 0;       // WRITE ADDRESS 1
19:          A1d = v + u;   // WRITE DATA 1
20:          A[A1w] = A1d;
21:      }
22:      v = v + u;
23:      return v;
24:  }
```

FIG.14C

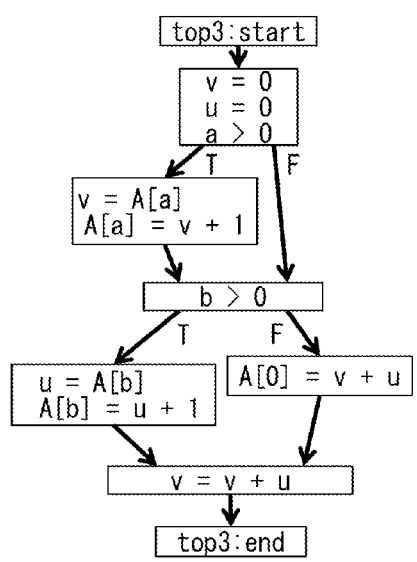

FIG.15A
```
01:   int b = 0;
02:   int top4(int a) {
03:     int c = b - 1, q, r;
04:     if(a == 0) {
05:       a = b + 1;
06:       b = b + 1;
07:       c = c + 1;
08:     }
09:     else if(a < 0) {
10:       b = a;
11:       c = 0;
12:     }
13:     q = b * c;
14:     r = a + q;
15:     return r;
16:   }
```
FIG.15B
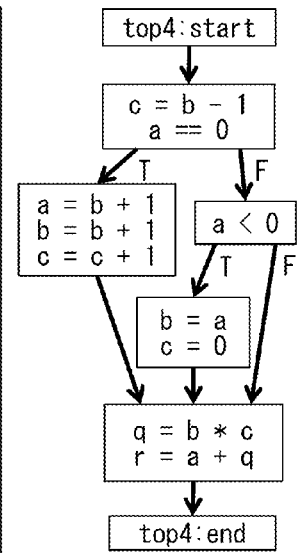
FIG.15C
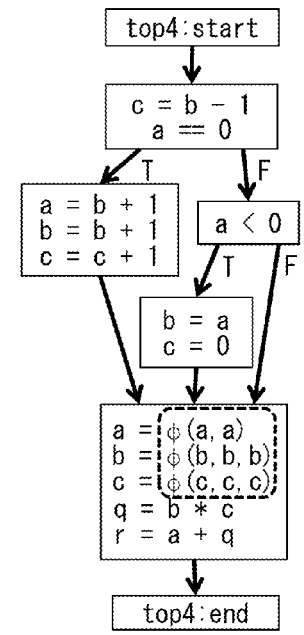
FIG.15D
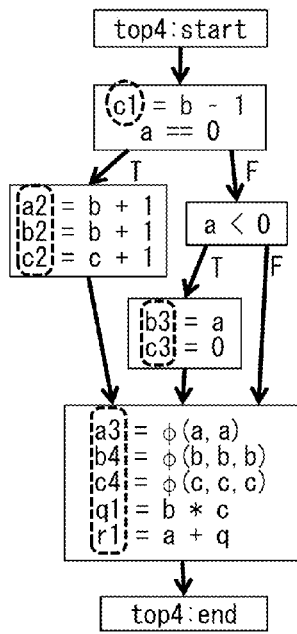
FIG.15E
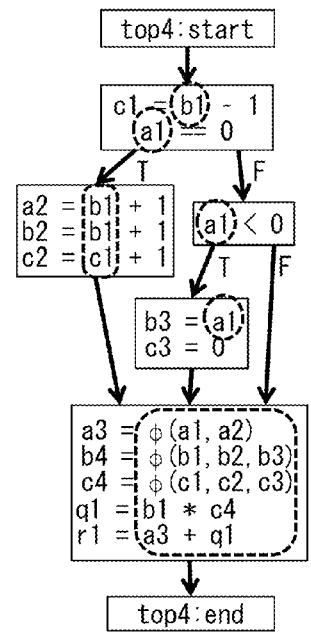
FIG.15F
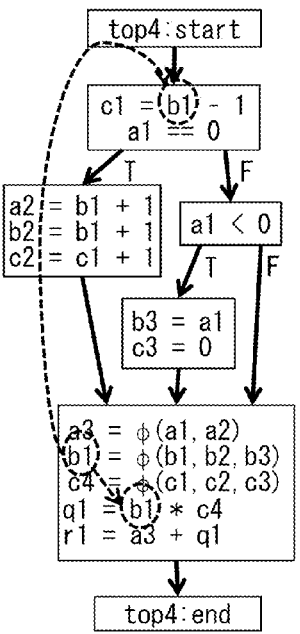

FIG.17

```
01:  c1 = b1 - 1;
02:
03:  P1 = (a1 == 0);       // CONDITIONAL EXPRESSION OF if (a1 == 0)
04:  a2 = b1 + 1;          // P1
05:  b2 = b1 + 1;          // P1
06:  c2 = c1 + 1;          // P1
07:
08:  P2 = (a1 < 0);        // CONDITIONAL EXPRESSION OF else if (a1 < 0)
09:  b3 = a1;              // !P1 & P2
10:  c3 = 0;               // !P1 & P2
11:
12:  a3 = (P1) ? a1 : a2;       // φ (a1, a2)
13:  S_b3_b1 = (P2) ? b3 : b1;  // S_b3_b1 = φ (b1, b3)
14:  b1 = (P1) ? b2 : S_b3_b1;  // φ (b1, b2, b3)
15:  S_c3_c1 = (P2) ? c3 : c1;  // S_c3_c1 = φ (c1, c3)
16:  c4 = (P1) ? c2 : S_c3_c1;  // φ (c1, c2, c3)
17:
18:  q1 = b1 * c4;
19:  r1 = a3 + q1;
```

FIG.18A

```
01:  v1 = 0; u1 = 0;
02:
03:  P1 = (a1 > 0);      // if(a1 > 0)
04:  A0r1 = a1;          // P1
05:  v2 = A[A0r1];       // P1
06:  A0w1 = a1;          // P1
07:  A0d1 = v2 + 1;      // P1
08:  A[A0w1] = A0d1;     // P1
09:
10:  v3 = (P1) ? v2 : v1; //φ(v1,v2)
11:
12:  P2 = (b1 > 0);      // if(b1 > 0)
13:  A1r1 = b1;          // P2
14:  u2 = A[A1r1];       // P2
15:  A1w1 = b1;          // P2
16:  A1d1 = u2 + 1;      // P2
17:  A[A1w1] = A1d1;     // P2 → FUSION
18:  A1w2 = 0;           // !P2
19:  A1d2 = v3 + u2;     // !P2
20:  A[A1w2] = A1d2;     // !P2 → FUSION
21:
22:  A1w3 = (P2) ? A1w1 : A1w2;
23:                      //φ(A1w1,A1w2)
24:  A1d3 = (P2) ? A1d1 : A1d2;
25:                      //φ(A1d1,A1d2)
26:
27:  u3 = (P2) ? u2 : u1; //φ(u1,u2)
28:
29:  v4 = v3 + u3;
```

FIG.18B

```
01:  v1 = 0; u1 = 0;
02:
03:  P1 = (a1 > 0);           // if(a1 > 0)
04:  A0r1 = a1;               // P1
05:  if(P1) v2 = A[A0r1];     // P1
06:  A0w1 = a1;               // P1
07:  A0d1 = v2 + 1;           // P1
08:  if(P1) A[A0w1] = A0d1;   // P1
09:
10:  v3 = (P1) ? v2 : v1;     //φ(v1,v2)
11:
12:  P2 = (b1 > 0);           // if(b1 > 0)
13:  A1r1 = b1;               // P2
14:  if(P2) u2 = A[A1r1];     // P2
15:  A1w1 = b1;               // P2
16:  A1d1 = u2 + 1;           // P2
17:  // A[A1w1] = A1d1;       // P2 → FUSION
18:  A1w2 = 0;                // !P2
19:  A1d2 = v3 + u1;          // !P2
20:  // A[A1w2] = A1d2;       // !P2 → FUSION
21:
22:  A1w3 = (P2) ? A1w1 : A1w2;
23:                           //φ(A1w1,A1w2)
24:  A1d3 = (P2) ? A1d1 : A1d2;
25:                           //φ(A1d1,A1d2)
26:  A[A1w3] = A1d3;  // P2|!P2 FUSION INSTRUCTION
27:  u3 = (P2) ? u2 : u1;     //φ(u1,u2)
28:
29:  v4 = v3 + u3;
```

FIG.21

```
01:  typedef unsigned int UINT8;
02:  #pragma bit_width 8 UINT8      // UINT8 TYPE: 8 BIT-WIDTH ATTRIBUTE
03:
04:  UINT8 funcF(UINT8 x[3], int c[3], int d[3]) {
05:      int cc = x[0] * c[0] + x[1] * c[1] + x[2] * c[2];
06:      int dd = x[0] * d[0] + x[1] * d[1] + x[2] * d[2];
07:      int cc_clip = (cc < 0) ? 0 : cc;
08:      int dd_clip = (dd < 0) ? 0 : dd;  // SIMPLIFIED
09:                                         // TO dd_clip = dd;
10:      int r = (cc_clip + dd_clip) >> 2;
11:      int r_clip = (r > 255) ? 255 : r;
12:      return r_clip;
13:  }
14:
15:  UINT8 top6(UINT8 x[3]) {
16:      const int c[3] = {-1, 2, -1};
17:      const int d[3] = {1, 2, 1};
18:      return funcF(x, c, d);
19:  }
```

$(c \gg i)$ & $1$ : i-TH BIT OF c
$n_i$ : COUPLE OF REMAINDER ($r_{i-1}$) AND i-TH BIT OF c
$g_i$ : $n_i \geq d$ (d-SUBTRACTION DETERMINATION)
$r_i$ : i-TH REMAINDER a = c / d; (QUOTIENT)  b = c % d; (REMAINDER)  (a, b, c, d : SET 8-BIT UNSIGNED DATA)
$n_0 = ((c \gg 7)$ & $1);$              $g_0 = (n_0 \geq d);$   $r_0 = (g_0)$ ? $n_0 - d : n_0;$   $q_0 = g_0;$
$n_1 = (r_0 \ll 1) | ((c \gg 6)$ & $1);$  $g_1 = (n_1 \geq d);$   $r_1 = (g_1)$ ? $n_1 - d : n_1;$   $q_1 = (q_0 \ll 1) | g_1;$
$n_2 = (r_1 \ll 1) | ((c \gg 5)$ & $1);$  $g_2 = (n_2 \geq d);$   $r_2 = (g_2)$ ? $n_2 - d : n_2;$   $q_2 = (q_1 \ll 1) | g_2;$
$n_3 = (r_2 \ll 1) | ((c \gg 4)$ & $1);$  $g_3 = (n_3 \geq d);$   $r_3 = (g_3)$ ? $n_3 - d : n_3;$   $q_3 = (q_2 \ll 1) | g_3;$
$n_4 = (r_3 \ll 1) | ((c \gg 3)$ & $1);$  $g_4 = (n_4 \geq d);$   $r_4 = (g_4)$ ? $n_4 - d : n_4;$   $q_4 = (q_3 \ll 1) | g_4;$
$n_5 = (r_4 \ll 1) | ((c \gg 2)$ & $1);$  $g_5 = (n_5 \geq d);$   $r_5 = (g_5)$ ? $n_5 - d : n_5;$   $q_5 = (q_4 \ll 1) | g_5;$
$n_6 = (r_5 \ll 1) | ((c \gg 1)$ & $1);$  $g_6 = (n_6 \geq d);$   $r_6 = (g_6)$ ? $n_6 - d : n_6;$   $q_6 = (q_5 \ll 1) | g_6;$
$n_7 = (r_6 \ll 1) | ((c \gg 0)$ & $1);$  $g_7 = (n_7 \geq d);$   $r_7 = (g_7)$ ? $n_7 - d : n_7;$   $q_7 = (q_6 \ll 1) | g_7;$ a = $q_7$; b = $r_7$;

FIG.23A

```
01:  int funcE(int a, int b) {
02:      return a * b;
03:  }
04:
05:  int top5(int c) {
06:      int r = funcE(c, 3) + funcE(c, 7);
07:      return r;
08:  }
```

FIG.23B

```
01:  int top5(int c) {
02:      int funcE_0, funcE_1, r;
03:      { int a0 = c, b0 = 3;
04:          funcE_0 = a0 * b0;}
05:      { int a1 = c, b1 = 7;
06:          funcE_1 = a1 * b1;}
07:      r = funcE_0 + funcE_1;
08:      return r;
09:  }
```

GENERATION SOURCE OF
SIGNAL PROPAGATION

RELATION BETWEEN (yi+1, yi, yi-1)
in (i+1, i, i-1)-TH BITS
OF INPUT PORT 1 AND
OUTPUT VALUE FOR VALUE
IN INPUT PORT 0

| | |
|---|---|
| 1 TIME | : neg = 0, sel = 1, nz = 1 |
| 2 TIMES | : neg = 0, sel = 0, nz = 1 |
| -1 TIMES | : neg = 1, sel = 1, nz = 1 |
| -2 TIMES | : neg = 1, sel = 0, nz = 1 |
| 0 TIMES | : neg = *, sel = *, nz = 0 |

000 → 0 TIMES
001 → 1 TIME
010 → 1 TIME
011 → 2 TIMES
100 → -2 TIMES
101 → -1 TIMES
110 → -1 TIMES
111 → 0 TIMES $d0 = x0 \wedge neg$
$d1 = x1 \wedge neg$
$e = \overline{sel}\ \&\ d0\ |\ sel\ \&\ d1$
$br\_out = e\ \&\ nz$

```
01:  typedef int S_INT32;
02:  #pragma state S_INT32 // S_INT2 TYPE: REGISTER ATTRIBUTE
03:  S_INT32 stt = 0;
04:  int top6(int a) {
05:      int b, c, ret_val;
06:      b = (stt != 0);           // P : stt BEFORE-ASSIGNMENT REFERENCE INSTRUCTION
07:      c = (b == 1) ? a + 1 : a - 1; // Q :
08:      stt = c + 1;              // R : ASSIGNMENT INSTRUCTION TO stt
09:      ret_val = stt + a;        // S : stt AFTER-ASSIGNMENT REFERENCE INSTRUCTION
10:      return ret_val;
11:  }
```

PIPELINE BOUNDARY EDGES

LOGIC CIRCUIT GENERATION DEVICE AND METHOD

This application is a National Stage Application of PCT/JP2014/082797, filed on 11 Dec. 2014, which claims benefit of Serial No. 2013-256881, filed on 12 Dec. 2013, and which applications are incorporated herein by reference. To the extent appropriate, a claim of priority is made to the above disclosed applications.

TECHNICAL FIELD

The present invention relates to a method of synthesizing a semiconductor integrated circuit, and more specifically, relates to a method of synthesizing a logic circuit from a logic circuit description that is described using a programming language.

BACKGROUND ART

Conventionally, logic circuit designs of large-scale integrated (LSI) circuits have been made by using the designs of a register transfer level (RTL) description, and by performing data flow controls using state transition diagrams. The RTL expresses the level of abstraction of the logic circuit design, and the RTL description is a kind of a description method by a hardware description language (HDL) with the low level of abstraction that describes the structure and the operation of hardware. In the RTL, a flow of data is described at the register level. A source code of the HDL that is described in the RTL is converted into a logic-gate level circuit description using software, which is called a logic synthesis tool.

When a logic circuit design is made using a state transition diagram, the state transition diagram is firstly created, and thereafter a flow of the state transition needs to be manually verified. Accordingly, in the case of designing a logic circuit that needs a complicated data flow control, for example, a high-performance LSI for image processing applications, there are problems, such as a failure of full verification to verify the flow of the state transition, and the easy degradation in the design quality due to inclusion of a bug or the like.

Therefore, a high-level synthesis technique illustrated below has been introduced in recent years.

As a technique of designing a logic circuit in a short period, a high-level synthesis technique as indicated in Non-patent Literature 1 is known. The high-level synthesis technique is a design automation technique in which an operation description (hereinafter, called "software description") of a logic circuit that is represented using a procedural software programming language such as the C language is automatically converted into an RTL description by the HDL. Steps of automatically synthesizing the RTL description from the software description using such a high-level synthesis technique are as follows:
(1) An allocation step: the type and the number of pieces of computing elements, memories, and the like that are mounted on a logic circuit to be synthesized are decided;
(2) A scheduling step: the execution time for each operation in the software description is decided. This step is based on a "parallelism analysis" function used in a parallelization compiler technique for a very long instruction word (VLIW) processor in which parallel operations by multiple operation devices are possible;
(3) A binding step: allocation of operation to each computing element, allocation of intermediate processing data to a register, and the like are decided; and
(4) An FSMD generation step: a control unit for executing a processing operation equivalent to the software description in the logic circuit is implemented with a finite state machine (FSM), and this control unit generates a finite state machine with datapath (FSMD) that drives an operation processing circuit (Datapath) configured to include a computing element, a register, a memory, and a bus. The FSMD that is eventually generated serves as an RTL description to be outputted.

Among these steps, the "operation scheduling and binding step" that includes a step of multiplexing each operation process inside the software in the time direction by the "scheduling", and a step of multiplexing each operation process in the space direction (allocation to the computing element) by the "binding", is an important step as a core for the high-level synthesis technique.

The details of the high-level synthesis technique and the steps thereof are described in, for example, Patent Literature 1, Patent Literature 2, and Non-patent Literature 1.

As another technique of designing a logic circuit in a short period, a method that uses a SystemC as indicated in Non-patent Literature 2 is also known. The SystemC is a kind of the HDL provided as a class definition and a macro definition of a C++ language that provides an interface for event driven simulation of a hardware system. In the SystemC, the description of a "tier description", a "parallel operation process description and process startup condition (sensitivity list)", and a "signal connection" that are necessary for the hardware description is possible, and thus, it is possible to describe a logic circuit in the RTL using the SystemC. Moreover, it is possible to abstractly represent a function of a system in a software description by the C++ language, by a description method called transaction level modeling (TLM) on the SystemC in which a communication description and an operation processing description are separated, and execute a large-scale system-level simulation.

The details of the SystemC are described in, for example, Non-patent Literature 2.

CITATION LIST

Patent Literature

Patent Literature 1: JP 2003-076728 A
Patent Literature 2: JP 2006-011878 A

Non-Patent Literature

Non-patent Literature 1: Kazutoshi WAKABAYASHI, "Use of High-Level Synthesis to Generate Hardware from Software", IEICE Fundamental Review, 2012, Vol. 6, No. 1, p. 37-50
Non-patent Literature 2: Written by Thorsten GRÖTKER, Translation supervised by: Masaru KAKIMOTO; Masamichi KAWARABAYASHI; Takashi HASEGAWA, "System Design with SystemC", Maruzen Publishing Co. Ltd, 2003, ISBN 4-621-07144-0 C3055

SUMMARY OF INVENTION

Technical Problem

The high-level synthesis technique has the following problems.

Firstly, the high-level synthesis technique has a problem of significantly complicated and large-scale technique construction and tool mounting for synthesizing high-performance and high-efficiency circuits. A program code serving as an input target in the high-level synthesis technique has fundamentally the same structure as software program codes executed by a CPU in the program code represents a serial processing procedure, and has a significantly high flexibility on the description. The processing performance of a circuit to be synthesized is decided depending on how much operation parallelism can be extracted from a software description with such high flexibility, so that significantly complicated parallelism analysis techniques (data dependence analysis, control dependence analysis, loop analysis, array reference dependence analysis, and the like) need to be fully used. As a result, the afore-mentioned "operation scheduling and binding step" becomes significantly complicated.

Moreover, the high-level synthesis technique has a problem of an extreme difficult prediction of change in the content of the RTL description, in other words, the state of the logic circuit, with change in the content of a software description as an input target. As described above, the "operation scheduling and binding step" is complicated, so that it is extremely difficult to predict circuit characteristics (circuit scale, processing time) to be outputted from a software description to be inputted. Accordingly, for example, when none of the characteristics of a synthesized circuit to be generated satisfies performance requirements, strategies (processing time contraction, circuit scale reduction) that fulfill performance requirements due to effects by increase in the parallelism of the operation or suppression of a memory transfer amount, by changing the software description, are necessary. However, it is difficult to predict how the change applied to the software description affects the characteristics of a circuit to be synthesized, so that there is a possibility that an alteration work itself of the software description is extremely difficult.

Further, the high-level synthesis technique has a problem that the structure (architecture) of the logic circuit largely depends on the "operation scheduling and binding step", so that a software description on which an intention and a know-how of a designer on the architecture is reflected is difficult. Therefore, in a design of a processing function block that requires high-parallelism, a manual design (a design method in which a logic structure is directly described in a hardware description language) that does not rely on the high-level synthesis technique is still mainly used.

Meanwhile, a method in the SystemC has the following problems. One of the problems is significantly limited improvement in design productivity in the RTL description because, for describing a logic circuit in the RTL using the SystemC, a class for the RTL description defined by the SystemC needs to be used, and the description amount is similar to or more than that in the hardware description language. Moreover, a tool that automatically converts the TLM description into the RTL description using the afore-mentioned high-level synthesis technique is present. However, the problem in the high-level synthesis technique without any change is applied to a case where this tool is used.

The present invention has been made to solve such the problems of the related art, and an objective of the present invention is to provide a device and a method that describe a specific information processing function, which assumes circuit implementation, in a programming language, and from this description, automatically generate an RTL description that can be logic synthesized.

Solution to Problem

A first aspect of the present invention is a logic circuit generation device that receives an input of a program in which an operation description, as a flow of a series of processes of hardware for a circuit design, is written, the program including a top-level function of a logic circuit generation target, and generates a logic circuit description. The logic circuit generation device is provided with a control flow graph generation unit, a control flow degenerate conversion unit, a data flow graph generation unit, and a logic circuit description output unit.

The control flow graph generation unit generates a control flow graph from the top-level function including no loop processing part and no function call instruction. The control flow degenerate conversion unit removes all condition branch instructions from the control flow graph that includes, for each variable, a single assignment instruction to the variable, and thereby generates a control flow degenerate program as a program in which a control flow is degenerated. The data flow graph generation unit generates a data flow graph from the control flow degenerate program, by using each instruction in the control flow degenerate program as a node, and adding a directed edge from an assignment instruction to each variable to an instruction that refers to the variable. The logic circuit description output unit generates a logic circuit description expressing a sequential circuit in which the directed edge of the data flow graph corresponds to wiring of a logic circuit, and the node of the data flow graph corresponds to a computing element of the logic circuit.

A state variable expressing a state of the sequential circuit is represented in the program as a local variable or a static variable of a high-order hierarchy function calling the top-level function, and a value of the state variable before an assignment instruction to the state variable is executed expresses a current state of the sequential circuit, and a value of the state variable after the assignment instruction to the state variable is executed expresses a next state of the sequential circuit.

In one embodiment, preferably, the logic circuit generation device is further provided with a static single assignment form conversion unit. The static single assignment form conversion unit coverts, when the top-level function is not of a static single assignment form which includes, for each variable, only a single assignment instruction to the variable, the control flow graph into the static single assignment form, before the control flow graph is inputted into the control flow degenerate conversion unit. The static single assignment form conversion unit includes a φ-function instruction insertion unit, a variable name conversion unit, and a state variable name re-conversion unit. The φ-function instruction insertion unit inserts, into a position in the control flow graph where a plurality of value definitions of the same variable join, a φ-function instruction that selects a variable definition on an actually executed path out of all the variable definitions that join at the position. The variable name conversion unit coverts, by converting names of the variables included in the control flow graph to other names different among the assignment instructions to the variables, the control flow graph into a static single assignment form in which only a single assignment instruction is included for each variable after the name conversion. The state variable name re-conversion unit re-converts, for the state variable after the name conversion, the variable names so as to match a variable name in a start point block and a variable name reaching an end point block of the control flow graph. The control flow degenerate conversion unit includes a φ-function instruction instantiation unit that converts the φ-function instruction into a specific operation instruction.

In one embodiment, preferably, the program to be inputted includes an attribute description for giving an attribute to each variable. The attribute includes a bit width attribute that designates a bit width of data of a variable; a register attribute that designates a value of a variable to be held in a register; and a memory attribute that designates a value of an array element of an array variable to be held in a memory. The logic circuit generation device generates a logic circuit description including a sequential circuit in which a state is represented using the variable to which the register attribute or the memory attribute is given as the state variable.

In one embodiment, further preferably, the logic circuit generation device is further provided with a bit width determination unit, a computing element circuit delay evaluation, and a pipeline boundary arrangement unit. The bit width determination unit calculates, for variables included in the data flow graph, a bit width of each of the variables, from a bit width of a variable and/or a constant to be referred in an assignment instruction to the variable and a type of operation to be executed in the assignment instruction. The computing element circuit delay evaluation unit calculates a signal propagation delay time of a computing element, based on the bit width calculated for the variable included in the data flow graph. The pipeline boundary arrangement unit that includes a pipeline constraint extraction unit and a number of pipeline stages decision unit. The pipeline constraint extraction unit adds a pipeline boundary attribute to a directed edge between a computing element that executes an assignment instruction to the state variable in the data flow graph and a computing element that executes a reference instruction to the state variable, and the number of pipeline stages decision unit decides the number of pipeline stages that is used for generating a circuit description of a clock synchronous type pipeline circuit, in accordance with a pipeline stage-number lower limit value that is a minimum necessary number of pipeline stages determined by a constraint based on the pipeline boundary attribute, and the number of pipeline stages that is calculated from a designated clock cycle or the number of pipeline stages that is designated in advance.

In one embodiment, preferably, the logic circuit generation device is further provided with a logic circuit input signal extraction unit and a logic circuit output signal extraction unit. The logic circuit input signal extraction unit extracts an input signal of a circuit to be described by the circuit description, from an argument and a global variable of the top-level function. The logic circuit output signal extraction unit extracts an output signal of the circuit to be described by the circuit description, from the argument, a return value, and the global variable of the top-level function.

In one embodiment, preferably, the logic circuit generation device is further provided with a non-cyclical and non-hierarchical conversion unit. The non-cyclical and non-hierarchical conversion unit includes a full inline expansion unit, and a full loop expansion unit. The full inline expansion unit subjects, when the top-level function includes a function call instruction, each function call instruction to inline expansion to convert the top-level function into a lowermost function including no function call instruction. The full loop expansion unit subjects, when the lowermost function converted by the full inline expansion unit includes a loop processing part of a fixed repeat count, each loop processing part of the fixed repeat count to loop expansion to convert the lowermost function into a non-cyclical type lowermost function including no loop processing part. Preferably, a program inputted into the logic circuit generation device is converted into a non-cyclical type lowermost function by the non-cyclical and non-hierarchical conversion unit, and then is inputted into the control flow graph generation unit.

In one embodiment, further preferably, in a case where the function call instruction is not fully expanded even with a predetermined number of repetitions of the inline expansion of the inputted function, the full inline expansion unit is configured to determine that the function is inconvertible into a lowermost function, and terminates the processing, and when the inputted function includes a loop processing part in which a repeat count is not a constant, the full loop expansion unit is configured to determine that the function is inconvertible into a non-cyclical type lowermost function, and terminates the processing. Preferably, the logic circuit generation device stops processing of generating a logic circuit description when the full inline expansion unit terminates the processing or the full loop expansion unit terminates the processing.

In one embodiment, preferably, the logic circuit generation device is further provided with a state variable instruction dependence determination unit. The state variable instruction dependence determination unit determines whether there is an "ill-formed dependence" case, in the control flow graph, where an assignment instruction, a reference instruction, and an assignment instruction are continuously executed in this order for the same state variable. Preferably, the logic circuit generation device stops processing of generating a logic circuit description when the state variable instruction dependence determination unit makes "ill-formed dependence" determination.

In one embodiment, preferably, the logic circuit generation device is further provided with a register/memory array access instruction decomposition unit. The register/memory array access instruction decomposition unit includes an array assignment instruction decomposition unit, and an array reference instruction decomposition unit. When the top-level function includes an array assignment instruction that is a write processing instruction to an array variable, adds a write data variable and a write address variable to the control flow graph, for each array variable, and decomposes each array assignment instruction into an instruction to assign an assignment value to an array element to the write data variable, an instruction to assign an array index value to the write address variable, and an instruction to assign a value of the write data variable to an array element decided by using the write address variable as an array index. When the top-level function includes an array reference instruction that is a read processing instruction from an array variable, adds a read address variable to the control flow graph for each array variable, and decomposes each array reference instruction into an instruction to assign an array index value to the read address variable, and an instruction to refer to an array element decided by using the read address variable as an array index. Preferably, a memory for holding data of array elements in the logic circuit is configured such that the write data variable corresponds to a write data port of the memory, the write address variable corresponds to a write address port of the memory, and the read address variable corresponds to a read address port of the memory. The control flow graph generated by the control flow graph generation unit is processed by the register/memory array access instruction decomposition unit, and then is processed by the control flow degenerate conversion unit.

In one embodiment, further preferably, the register/memory array access instruction decomposition unit further includes a write port number allocation unit, and a read port number allocation unit. The write port number allocation unit allocates, as for the array assignment instructions to each array variable in the control flow graph, a maximum value of the count of executions of array assignment instructions to the array variable from a start point block over the array assignment instructions, as a write port number, to the array assignment instruction. The read port number allocation unit allocates, as for the array reference instructions to the array variable in the control flow graph, a maximum value of the count of executions of array reference instructions to the array variable from the start point block over the array reference instructions, as a read port number, to the array reference instruction. Preferably, the array assignment instruction decomposition unit adds the write data variable and the write address variable for each array variable, for every write port number to the control flow graph, and adds the read address variable for every read port number to the control flow graph. Preferably, the memory for holding each array element data has write ports the number of which is equal to the number of the write port numbers allocated to the assignment instruction of the array variable, and read ports the number of which is equal to the number of the read port numbers allocated to the reference instruction of the array variable.

In one embodiment, further preferably, the logic circuit generation device is further provided with a number of memory ports determination unit. The number of memory ports determination unit determines whether the number of the write port numbers allocated by the write port number allocation unit is equal to or less than a threshold value of the number of write memory ports set in advance, and determines whether the number of the read port numbers allocated by the read port number allocation unit is equal to or less than a threshold value of the number of read memory ports set in advance. Preferably, the logic circuit generation device stops the processing of generating a logic circuit description when the number of the write port numbers is more than the threshold value of the number of the write memory ports set in advance, or the number of the read port numbers is more than the threshold value of the number of the read memory ports set in advance.

A second aspect of the present invention is a logic circuit generation method performed by a logic circuit generation device that receives an input of a program in which an operation description, as a flow of a series of processes of hardware for a circuit design, is written, the program including a top-level function of a logic circuit generation target, and generates a logic circuit description.

A third aspect of the present invention is a computer-readable storage medium that stores therein a logic circuit generation computer program for causing a computer to execute each step in a logic circuit generation method, performed by a logic circuit generation device that receives an input of a program in which an operation description, as a flow of a series of processes of hardware for a circuit design, is written, the program including a top-level function of a logic circuit generation target, and generates a logic circuit description.

Advantageous Effects of Invention

The device and the method of the present invention can automatically generate an RTL description that can be logic synthesized from a software description with high description flexibility, and thus can design, develop, and verify a large-scale integrated circuit with high quality and high efficiency in a short period, with low cost.

BRIEF DESCRIPTION OF DRAWINGS

FIG. 3 is a diagram illustrating a description example of an alias definition of a data type in a software description of the present invention.

FIG. 4 is a diagram illustrating a description example in which a variable attribute is added to the data type in the software description of the present invention.

FIG. 7 is a diagram illustrating a description example of a line buffer and shift register circuit for image processing that uses a memory attribute variable, and a corresponding pipeline circuit diagram, in the software description of the present invention.

FIG. 8 is a diagram illustrating a software description in which an operation of updating the line buffer in FIG. 7 is described in the software description of the present invention and an RTL description in the related art.

FIG. 9 is a diagram illustrating a description example of a recursive function call.

FIG. 10 is a diagram illustrating a result in which the function illustrated in FIG. 9 is inline expanded, in the logic circuit generation device and the method of the present invention.

FIG. 11 is a diagram illustrating a result in which optimization by constant propagation is applied to the function illustrated in FIG. 10, in the logic circuit generation device and the method of the present invention.

FIG. 12 is a diagram illustrating a result in which the function illustrated in FIG. 9 is full inline function expanded, in a step in the circuit generation method of the present invention.

FIGS. 13A and 13B are diagrams illustrating a concrete example of full loop expansion, in the logic circuit generation device and the method of the present invention. FIG. 13A illustrates an example of a function including a loop processing part of a constant count repeat. FIG. 13B illustrates a result in which the function of FIG. 13A is fully loop expanded.

FIGS. 14A to 14C are diagrams illustrating a concrete example of decomposition of a memory array access instruction, in the logic circuit generation device and the method of the present invention. FIG. 14A illustrates an example of a function including a memory array access instruction. FIG. 14B illustrates a software description as a result in which the memory array access instruction included in FIG. 14A is decomposed using a port variable. FIG. 14C illustrates a control flow graph corresponding to the function of FIG. 14A.

FIGS. 15A to 15F are diagrams illustrating a concrete example of an SSA conversion procedure, in the logic circuit generation device and the method of the present invention. FIG. 15A illustrates an example of a software description, FIG. 15B illustrates a control flow graph corresponding to the software description of FIG. 15A, FIG. 15C illustrates a control flow graph as a result in which a φ-function instruction is inserted, FIG. 15D illustrates a control flow graph as a result in which a variable name of a variable to be assigned is converted, FIG. 15E illustrates a control flow graph as a result in which a variable name of a variable to be referred is converted, and FIG. 15F illustrates a control flow graph as a result in which a variable name of a state variable is re-converted.

FIG. 16A illustrates a control flow graph corresponding to the software description of FIG. 14B. FIG. 16B illustrates a control flow graph after the control flow graph of FIG. 16A is SSA converted.

FIG. 17 is a diagram illustrating a result in which control flow degeneration conversion processing by instantiation of the φ-function instruction is performed on the control flow graph of FIG. 15F, in the logic circuit generation device and the method of the present invention.

FIGS. 18A and 18B are diagrams illustrating a concrete example of the control flow degeneration conversion processing including a register/memory array access instruction, in the logic circuit generation device and the method of the present invention. FIG. 18A illustrates a software description corresponding to the control flow graph of FIG. 16B that is a control flow graph after the SSA conversion. FIG. 18B illustrates a software description as a result in which processing after the control flow degeneration is performed on the software description of FIG. 18A.

FIG. 21 is a diagram illustrating a concrete example of a software description of a program with constant multiplication.

FIG. 22 is a diagram illustrating a concrete example and a result of decomposition of division, in the logic circuit generation device and the method of the present invention.

FIGS. 23A and 23B are diagrams illustrating a software description corresponding to the data flow graph of FIGS. 24A to 24F. FIG. 23A illustrates the software description. FIG. 23B illustrates a result in which a function illustrated in FIG. 23A is inline expanded.

FIGS. 24A to 24F illustrate transition of the data flow graph.

DETAILED DESCRIPTION OF THE INVENTION

Figure 1B:
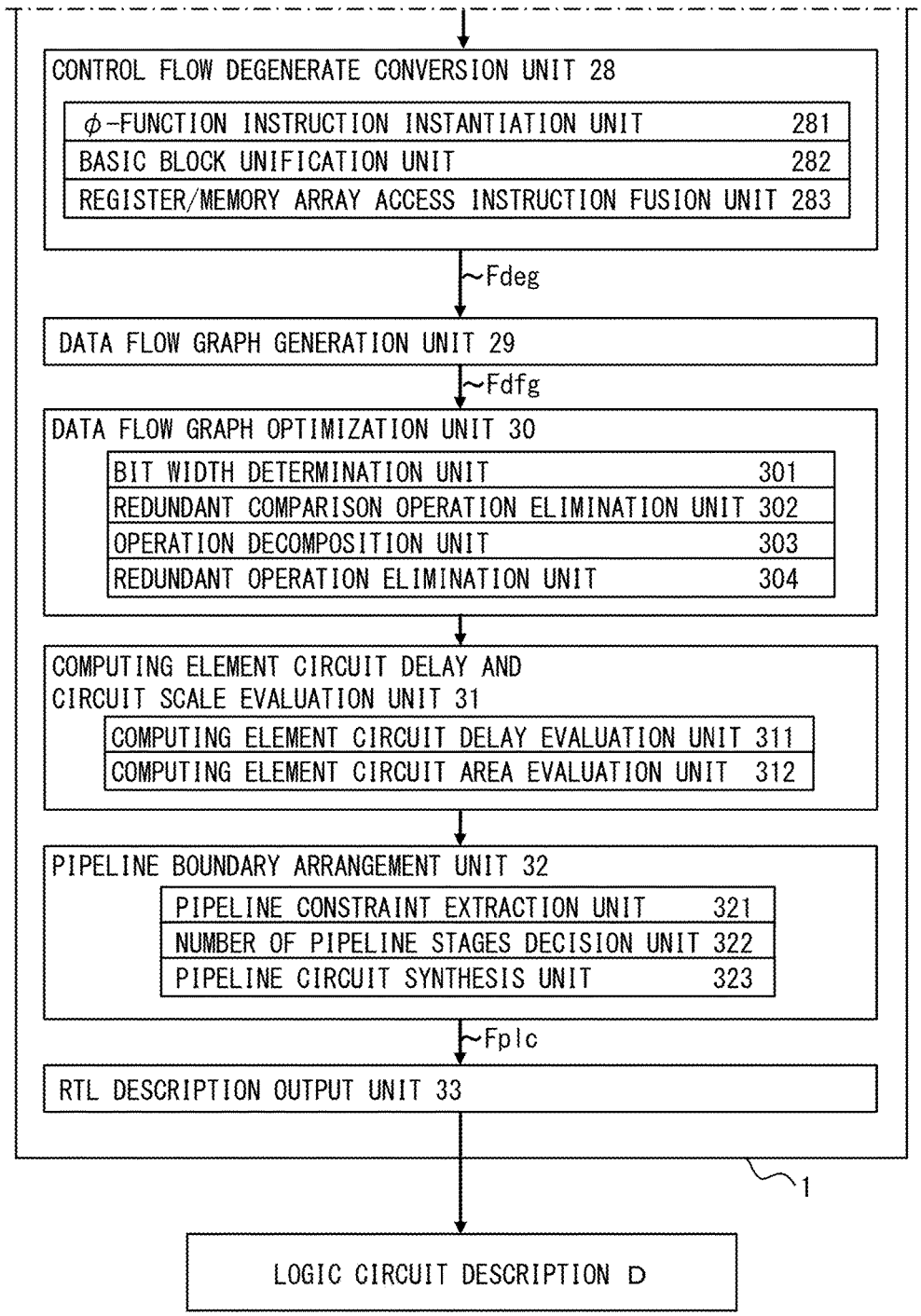
FIG. 1 is an example function block diagram illustrating a function of a logic circuit generation device according to one embodiment of the present invention.

Hereinafter, an embodiment of the present invention will be explained with reference to the accompanying drawings (FIG. 1 to FIG. 37) below. FIG. 1 illustrates an example block diagram illustrating a function of a logic circuit generation device according to the embodiment of the present invention. As illustrated in FIG. 1, a logic circuit generation device 1 can use a program P including a top-level function Ftop targeted for a logic circuit generation as an input, and output a logic circuit description D representing a logic circuit. The logic circuit generation device 1 can include:

a non-cyclical and non-hierarchical conversion unit 21;
a logic circuit input/output signals extraction unit 22;
a control flow graph generation unit 23;
a state variable instruction dependence determination unit 24;
a register/memory array access instruction decomposition unit 25;
a number of memory ports determination unit 26;
a static single assignment form conversion unit 27;
a control flow degenerate conversion unit 28;
a data flow graph generation unit 29;
a data flow graph optimization unit 30;
a computing element circuit delay and circuit scale evaluation unit 31;
a pipeline boundary arrangement unit 32; and
an RTL description output unit 33. Overviews of these units will be explained below. However, the detailed content of processing performed in each unit will be explained later with reference to FIG. 8 to FIG. 37.

The non-cyclical and non-hierarchical conversion unit 21 converts the top-level function Ftop targeted for a logic circuit generation and included in the program P inputted into the logic circuit generation device 1 into a non-cyclical type lowermost function Fexp in the form of a function including no loop processing part and no function call instruction.

The logic circuit input/output signals extraction unit 22 extracts an input signal and an output signal of a logic circuit that the logic circuit generation device 1 generates, from an argument of the non-cyclical type lowermost function Fexp and a global variable of the program P.

The control flow graph generation unit 23 generates a control flow graph Fcfg from the non-cyclical type lowermost function Fexp.

The state variable instruction dependence determination unit 24 determines whether there is an "ill-formed dependence" case where an assignment instruction, a reference instruction, and an assignment instruction are continuously executed in this order for the same state variable, in the control flow graph Fcfg. If the state variable instruction dependence determination unit 24 determines "ill-formed dependence", the logic circuit generation device 1 can stop the processing of generating a logic circuit description.

The register/memory array access instruction decomposition unit 25 allocates a write port number to an array assignment instructions included in the control flow graph Fcfg, and adds variables corresponding to a data input port and an address input port to the control flow graph Fcfg, thereby subdividing the array assignment instruction. Moreover, the register/memory array access instruction decomposition unit 25 allocates a read port number to an array reference instruction, and adds a variable corresponding to the address input port to the Fcfg, thereby subdividing the array reference instruction.

The number of memory ports determination unit 26 determines whether the number of write port numbers allocated to the array assignment instruction and the number of read port numbers allocated to the array reference instruction, in the register/memory array access instruction decomposition unit 25, are each equal to or less than a threshold value set in advance. If the number of memory ports determination unit 26 determines "ill-formed memory access", the logic circuit generation device 1 can stop the processing of generating a logic circuit description.

The static single assignment form conversion unit 27 converts the control flow graph Fcfg into a static single assignment form that is a form including a single assignment instruction for each of the variables included therein.

The control flow degenerate conversion unit 28 removes all condition branch instructions from the control flow graph Fcfg of the static single assignment form, thereby generating a control flow degenerate program Fdeg that is a program in which the control flow is degenerated.

The data flow graph generation unit 29 generates a data flow graph Fdfg from the control flow degenerate program Fdeg.

The data flow graph optimization unit 30 optimizes the data flow graph Fdfg.

The computing element circuit delay and circuit scale evaluation unit 31 estimates, based on the data flow graph Fdfg, a circuit delay and a circuit evaluation of the logic circuit that the logic circuit generation device 1 generates.

The pipeline boundary arrangement unit 32 arranges a pipeline boundary in the data flow graph Fdfg, thereby synthesizing pipeline circuit data Fplc.

The RTL description output unit 33 generates a logic circuit description D based on the pipeline circuit data Fplc, and outputs it. This logic circuit description D serves as an output from the logic circuit generation device 1.

Figure 2:
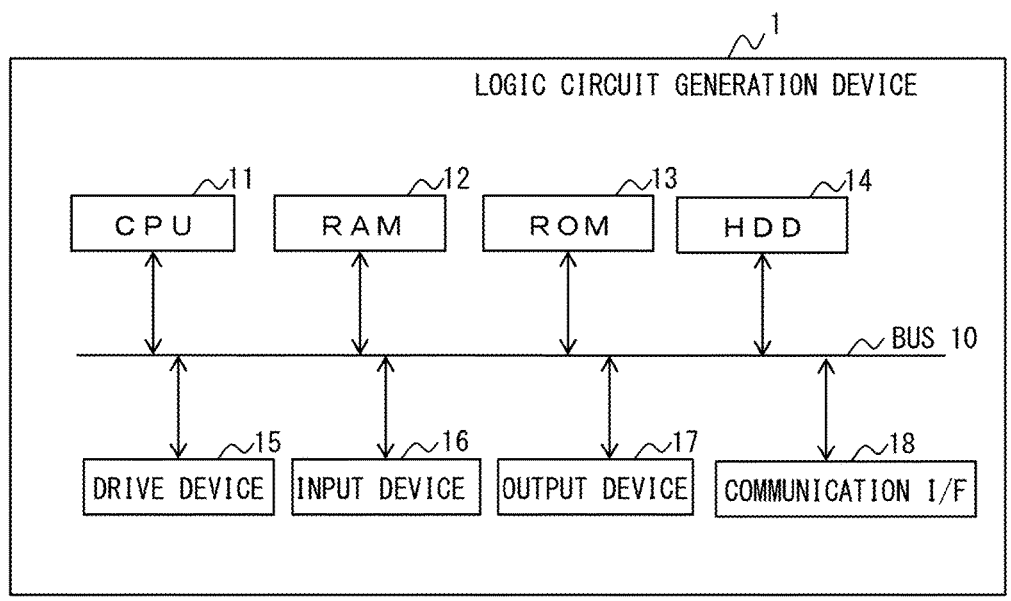
FIG. 2 is a diagram illustrating an example hardware configuration of the logic circuit generation device according to the embodiment of the present invention.

FIG. 2 illustrates an example hardware configuration of the logic circuit generation device 1 according to the embodiment of the present invention. The logic circuit generation device 1 can be implemented using a general-purpose computer including a central processing unit (CPU) 11, storage memory devices such as an RAM 12, an ROM 13, and a hard disk drive (HDD) 14 that store therein various kinds of programs or data that the central processing unit executes, and a bus 10 that connects these devices to one another. In addition, the logic circuit generation device 1 may be connected to a drive device 15 that inputs or outputs data to or from an external recording medium such as a CD-ROM or a DVD-ROM, an input device 16 such as a key board and a mouse, an output device 17 such as a CRT or liquid crystal display, and a printer, a communication interface 18 for communicating with another computer or network, if necessary.

In the embodiment of the present invention, the logic circuit generation device 1 can input the program P at the drive device 15, the input device 16, or the communication interface 18. The RAM 12 can store therein the program P inputted into the logic circuit generation device 1. The RAM 12 further can store therein a different program (not illustrated) for causing the CPU 11 to execute the function of each of the units in the logic circuit generation device 1 illustrated in FIG. 1. The CPU 11 processes the program P stored in the RAM 12 in accordance with this different program, and can generate the logic circuit description D, as a result. The RAM 12 can also store therein various kinds of intermediate data, such as the control flow graph Fcfg, the control flow degenerate program Fdeg, the data flow graph Fdfg, and the pipeline circuit data Fplc, which are generated in the course of processing the program P by the CPU, and the logic circuit description D that is eventually generated. The logic circuit description D stored in the RAM 12 can be outputted from the drive device 15, the output device 17, or the communication interface 18.

Herein, with reference to FIG. 3 to FIG. 7, as for the program P that is used as an input of the logic circuit generation device or the logic circuit generation method according to the present invention, one embodiment will be explained using a program that is described in the C language as an example. In the present description, it is assumed that the description in the program P, which describes an operation description, a flow of a series of processes of hardware for a circuit design, and which is used as an input of the logic circuit generation device or the logic circuit generation method according to the present invention, is referred to as a software description in the present invention.

[Alias Definition of Data Type]

In the C language, it is possible to define an alias data type for an already defined data type using the typedef specifier. FIG. 3 is a diagram illustrating a description example of alias definitions of data types in the software description of the present invention. In this description example, an INT10 type and an INT12 type are alias data types for the int type, and an S_INT12 type and an M_INT12 type are alias data types for the INT12 type. Moreover, an ST_A type is an alias data type for a structure having a (char type), b (INT10 type), and c (INT12 type) as member variables.

[Addition of Variable Attribute to Data Type]

FIG. 4 is a diagram illustrating a description example in which variable attributes are added to data types in the software description of the present invention. Although the variable attributes are described on a source code in the C language using a #pragma statement in this description example, a different method including, for example, a method of loading a file in which a correspondence relation between a type name and a variable attribute is described or a method of inputting these sets of information with a user interface, may be used in another embodiment.

When FIG. 4 is viewed in more details, illustrated is a description in which a bit width attribute, a memory attribute, and a register attribute, which are variable attributes, are added to data types. Specifically, respectively added are a 10 bit-width bit width attribute to the INT10 type, a 12 bit-width bit width attribute to the INT12 type, a memory attribute to the M_INT12 type, and a register attribute to the S_INT12 type and the ST_A type.

Further, since the S_INT12 type and the M_INT12 type are aliases of the INT12 type, the 12 bit-width bit width attribute is implicitly added also to the S_INT12 type and the M_INT12 type. Moreover, since the ST_A type is a structure including three member variables of a of the char type, b of the INT12 type, and c of the INT12 type, the register attribute that is explicitly added to the ST_A type is implicitly added also to these three member variables a, b, and c. In this manner, by a description method of variable attributes characterized by the combination of an alias definition means of data types and a description means of attribute information for each set of data type, it is possible to efficiently associate various addition information necessary for the logic circuit generation with the software description, with a small description amount.

[Improvement in Design Reusability by Addition of Bit Width Attribute to Data Type]

Figure 5:
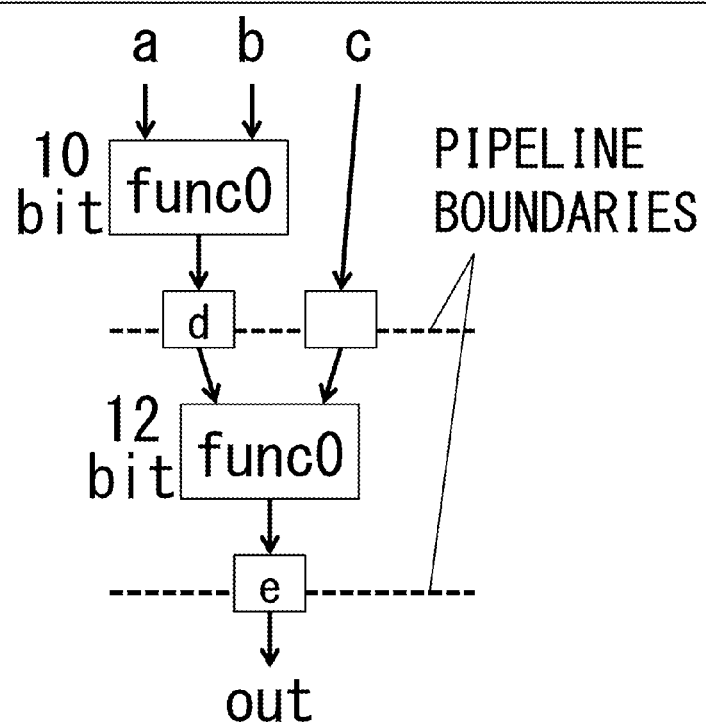
FIG. 5 is a diagram illustrating a description example of a program that calls the same function by means of arguments having different variable attributes, and a pipeline circuit diagram that corresponds to the program, in the software description of the present invention.

FIG. 5 is a diagram illustrating a description example of a code that calls the same function by means of arguments having different variable attributes, and a pipeline circuit diagram that corresponds to a program thereof, in the software description of the present invention. In this description example, a function top0 is a logic circuit generation target function, 10 bit-width arguments a and b and a 12 bit-width argument c are supplied as inputs, and a return value of the INT12 type serves as an output. Note that, a discrimination method between an input and an output is described later. Moreover, the 12 bit-width attribute and the register attribute are added to a local variable d of the S_INT12 type. Arguments given to a function func0 that is called twice inside the function top0 are of a 10 bit-width in a first call and of a 12 bit-width in a second call, and can represent circuits of different bit-widths with the same function description. Although an explicit bit-width designation description is necessary in a case where such bit-width adjustment is performed in the hardware description language or in the SystemC, the use of the variable attribute addition description method to the types according to the present invention allows the bit width to be implicitly designated, thereby significantly improving the reusability of the design.

[Implicit Designation of Timing Information by Register Attribute Addition]

In the description example in FIG. 5, the variable d has the register attribute. Generally, the register attribute makes no change to an operation of the software description but designates that a variable having this attribute is mounted as a register in a logic circuit. A characteristic of an operation of a register in the logic circuit is in that a register input signal is propagated to a register output signal only at the moment at rise of a clock signal (in other words, transition from 0 to 1), and this characteristic allows the register to hold the internal state of a sequential circuit as a state variable. Accordingly, a variable having the register attribute needs a lapse of one clock or more after a value is assigned and before the value can be read. Therefore, in the illustration of FIG. 5, after a return value of the func0 that is called the first time is assigned into d, d can be referred after one clock, and a result of the func0 that is called the second time using the value is outputted with a delay of one clock. In this manner, the register attribute is added to a software description with no time concept to make it possible to implicitly add timing information that is important in the logic circuit operation. Note that, the variable c is inputted at the simultaneous time with the variables a and b, so that an argument c needs to be synchronized with an argument d of a second func0, and insertion of a register for the synchronization is automatically performed in the logic circuit generation processing, as is described later. In this manner, the addition of the register attribute makes it possible to flexibly adjust the timing of the logic circuit operation, without changing the software description.

[Description of Sequential Circuit Using Static Variable]

Figure 6:
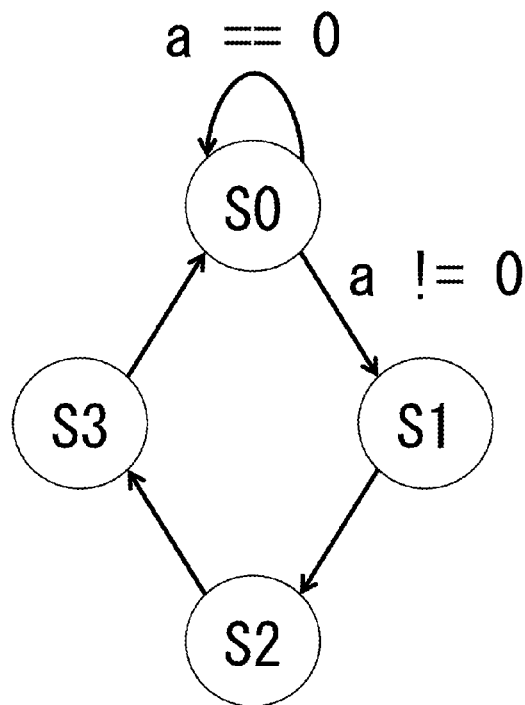
FIG. 6 is a diagram illustrating a description example of state transition of a sequential circuit using a static variable, and a state transition diagram of the sequential circuit, in the software description of the present invention.

FIG. 6 is a diagram illustrating a description example of state transition of a sequential circuit using a static variable, and a state transition diagram of the sequential circuit, in the software description of the present invention. In this description example, a 2-bit width attribute and the register attribute are added to a static variable stt, which is used as a state variable of the sequential circuit. In order to represent an operation of a state variable in a sequential circuit in a software description, a value of this state variable needs to be continuously held after the execution of a function top1 once, so that the state variable needs to be declared as a static variable. Moreover, the register attribute is added to this state variable, thereby designating that this state variable of the sequential circuit be implemented as a register. Initialization to 0 in a declare statement of the stt is performed only once before a start-up of the program (at a reset operation in the logic circuit), and a value of the variable stt is updated by a value of an input a every time the function top1 is executed. Moreover, a value of stt to be assigned to a variable prev_stt and a value of the stt in a switch statement are values before the stt is updated. In this manner, the state transition of the sequential circuit that is one of the most important components of the logic circuit can be significantly simply described with the static variable in the software description.

[Description Including Memory Circuit that Uses Memory Attribute Variable]

FIG. 7 is a diagram illustrating a description example of a line buffer and shift register circuit for image processing that uses memory attribute variables, and a corresponding pipeline circuit diagram, in the software description of the present invention. In this description example, a function top2 is a function that inputs data pin of a 8 bit-width, and outputs array data pw[3][3] of 3×3. This function generates surrounding pixel data that is necessary for space filter processing of image data by a raster-scanning method or the like, with a line buffer (a buffer that stores pixel data for one line in the horizontal direction, as a "delay circuit" in the vertical direction), and a shift register ("delay circuit" in the horizontal direction).

More specifically, the line buffer is implemented by two memory attribute array variables lbuf1[1024] and lbuf2[1024], and a 10 bit-width state variable pos is used as a common index to these arrays. Reference to a memory attribute array, such as lb1=lbuf1[pos], represents a memory read, and assignment to a memory attribute array, such as lbuf1[pos]=pin, represents a memory write. Moreover, a shift register is implemented by a series of instructions, such as pw[0][2]=pw[0][1], which shift a state variable array pw[3][3]. Meanwhile, variables lb1, lb2, and the like having no state attribute are used for representing a signal that instantaneously transfers data.

Two types of a synchronous type and an asynchronous type are present for a memory depending on the presence or absence of clock synchronization. The memories of the synchronous type are mostly used nowadays since high priority is put on high-speed data property, and thus, a synchronous type memory is assumed herein. FIG. 8 is a diagram illustrating a software description (upper portion) of the present invention and an RTL description (lower portion) of the related art, in both of which updating of the line buffer in FIG. 7 is described. More specifically, FIG. 8 illustrates a software description of an update processing portion (simultaneous read and write to the same address) to the two line buffers in FIG. 7, and an RTL description for the same operation in a Verilog hardware description language. Read data becomes effective delayed by one clock in a circuit operation of the synchronous type memory, so that write to lbuf2 (lbuf2[pos]=lb1) needs to be performed after one clock from read of lbuf1 (lb1=lbuf1 [pos]). Moreover, read and write from and to the same address need to be simultaneously performed in the line buffer, so that read of lbuf2 also needs to be delayed by one clock to adjust to a timing of the write. Read data of lbuf2 (lb2=lbuf2[pos]) becomes effective delayed by another one clock from the lbuf1. Such a shift of timing also affects an operation timing of a post-stage circuit that refers to these sets of data. The above-mentioned timing needs to be accurately represented in the RTL description. Meanwhile, in the software description of the present invention, only a flow of data has to be represented without considering such a detailed timing. In other words, the logic circuit description method in a programming language that is the technique of the present invention is a description method that allows only a flow of data to be represented while hiding the detailed circuit operation timing. This allows the logic circuit description method according to the present invention not only to significantly improve the readability of the description, but also to significantly reduce the design failure factors, thereby resulting in dramatical improvement in the design productivity also in this respect, compared with the RTL description.

[Designation of Top-Level Function]

A portion serving as a target of logic circuit generation in the software description of the present invention can be decided as the entire software description, or can be also decided by designating a top-level function serving as a target of logic circuit generation. In the present embodiment, a #pragma statement, which is not illustrated, for designating a top-level function is described in the software description, thereby deciding a target of logic circuit generation. In another embodiment, a different method including, for example, a method of loading a file in which a function name of a top-level function is described or a method in which a range of the target of logic circuit generation is designated with a user interface, may be used.

In the foregoing, the characteristics of the software description that is the description in the program P used as an input in the logic circuit generation device or the logic circuit generation method according to the present invention have been explained using the example described in the C language. Further, it would be easily understood by a person skilled in the art that the program P used as an input in the logic circuit generation device or the logic circuit generation method according to the present invention can be similarly described also with various software description languages such as procedural languages other than the C language, or functional languages or object-oriented languages, as long as these characteristics can be represented.

Next, with reference to FIG. 9 to FIG. 37, each of the units of the logic circuit generation device 1 in the present embodiment illustrated in FIG. 1 will be described in detail.

[Non-Cyclical and Non-Hierarchical Conversion Unit 21]

The program P inputted into the logic circuit generation device 1 is firstly inputted into the non-cyclical and non-hierarchical conversion unit 21. The non-cyclical and non-hierarchical conversion unit 21 performs non-cyclical and non-hierarchical conversion on the top-level function Ftop targeted for a logic circuit generation and included in the program P to output the non-cyclical type lowermost function Fexp in the form of a function including no loop processing part and no function call instruction.

More specifically, the non-cyclical and non-hierarchical conversion unit 21 includes a full inline expansion unit 211 and a full loop expansion unit 212, which are explained next. The top-level function Ftop inputted into the non-cyclical and non-hierarchical conversion unit 21 is firstly inputted into the full inline expansion unit 211, and is converted into a lowermost function in the form of a function including no function call instruction. The lowermost function is further inputted into the full loop expansion unit 212, and is converted into a non-cyclical type lowermost function.

The full inline expansion unit 211 converts the inputted function into a lowermost function in the form of a function including no function call instruction. The processing of converting a function into a lowermost function is called full inline expansion. The full inline expansion unit 211 repeats the inline expansion of a function call instruction for the inputted function. This fully expands an instruction calling a non-recursive function. In addition, the full inline expansion unit 211 executes optimization by the constant propagation in the course of repeating the inline expansion of the function call, if necessary. This fully expands an instruction calling even a recursive function as long as an upper limit of the count of recursive calls can be identified.

When the function call instruction is not fully expanded even if the repeat of the inline expansion is performed the predetermined number of times, the full inline expansion unit 211 determines that the function is impossible to be converted into a lowermost function, and can terminate the processing. In this case, the logic circuit generation device 1 can stop the logic circuit generation processing by outputting a warning message to the output device 17, for example.

With reference to FIG. 9 to FIG. 12, processing of full inline expansion of a function will be explained using a concrete example. FIG. 9 illustrates a description example of a recursive function call. In this description example, a function funcB includes an instruction calling the function funcB itself, and thus is a recursive function. A function funcA is a function including an instruction calling the function funcB that is a recursive function. Processing of full inline expansion of the function funcA in this example is considered. FIG. 10 illustrates the function funcA that is a result of the inline expansion of a function call funcB(4) included in the funcA. Herein, a variable funcB_0 is a variable that is introduced for storing a return value of the function call funcB(4). FIG. 11 illustrates a result in which optimization by the constant propagation is applied to the function funcA in FIG. 10. Specifically, in FIG. 10, a variable a is referred at two positions after a constant 4 is assigned thereto without any change, these references of the variable a are replaced with the constant 4. With this, the portion {int $a=4$;func$B$_0=($a$==1)?1:func$B$($a$−1)+1;} is converted into

{func$B$_0=(4==1)?1:func$B$(4−1)+1;}.

In the conditional operation expression at the right-hand side of this assignment statement (4==1)?1:func$B$(4−1)+1, the conditional expression (4==1) is evaluated as false, so that the conditional operation expression is simplified to the third term, that is func$B$(4−1)+1, and further, the expression (4−1) is simplified to a constant expression (3). As a result, the function funcA in FIG. 11 is obtained. For the obtained function funcA, the inline expansion of an instruction calling the function funcB and the optimization by the constant propagation are further repeatedly applied before a condition (a==1) in which no recursive call occurs holds. As a result, as illustrated in FIG. 12, a function in the form of including no function call instruction, that is, the lowermost function is obtained.

As was explained in the foregoing, the full inline expansion unit 211 converts the inputted function into the lowermost function in the form of a function including no function call instruction. When an inputted function is a function including no function call instruction, the full inline expansion unit 211 outputs the inputted function without any change.

The full loop expansion unit 212 converts the inputted lowermost function into a non-cyclical type lowermost function including no loop processing part. This is performed by expanding all the loop processing parts included in the function, and this processing is called full loop expansion.

With reference to FIGS. 13A and 13B, processing of converting a lowermost function into a non-cyclical type lowermost function will be explained using a concrete example. A function funcD in FIG. 13A is a function including a loop processing part. The count of loop repeats in this loop processing part is three. At the first repeat, a value of a variable i is a constant value 0. In other words, the first repeat of this loop processing part is expanded as $i=0;a+=a*i+1$, and optimization of the constant propagation is applied thereto to obtain $a+=a*0+1$.

At the second and third repeats, $a+=a*1+1$;

$a+=a*2+1$;

are also similarly obtained, respectively. As a result, as illustrated in FIG. 13B, the function funcD in the form of including no loop processing part is obtained.

As was explained in the foregoing, the full loop expansion unit 212 converts the inputted lowermost function into a non-cyclical type lowermost function including no loop processing part. When an inputted lowermost function is a function including no loop processing part, the full loop expansion unit 212 outputs the inputted function without any change.

Note that, in another embodiment of the present invention, the logic circuit generation device 1 can be configured to include no non-cyclical and non-hierarchical conversion unit 21. The logic circuit generation device 1 in this case receives an input of the program P that is a non-cyclical type lowermost function by the top-level function Ftop.

[Logic Circuit Input-Output Signals Extraction Unit 22]

The program P including the top-level function Ftop that has been converted into the non-cyclical type lowermost function Fexp by the non-cyclical and non-hierarchical conversion unit 21 is then inputted into the logic circuit input/output signals extraction unit 22. The logic circuit input/output signals extraction unit 22 extracts an input signal and an output signal of a logic circuit represented by the logic circuit description D that the logic circuit generation device 1 outputs, from an argument and a return value of the inputted non-cyclical type lowermost function Fexp and a global variable included in the program P.

More specifically, the logic circuit input/output signals extraction unit 22 includes a logic circuit input signal extraction unit 221 and a logic circuit output signal extraction unit 222, which are explained next. The logic circuit input signal extraction unit 221 extracts an input signal from an argument of the non-cyclical type lowermost function Fexp and a global variable included in the program P. The logic circuit output signal extraction unit 222 extracts an output signal from an argument and a return value of the inputted non-cyclical type lowermost function Fexp and a global variable included in the program P.

The logic circuit input signal extraction unit 221 extracts an input signal from an argument of the non-cyclical type lowermost function Fexp and a global variable included in the program P. The logic circuit input signal extraction unit 221 specifically determines and extracts (1) to (3) described below as input signals. Note that, herein, the "argument" indicates an argument of the non-cyclical type lowermost function Fexp, and the "function" indicates the non-cyclical type lowermost function Fexp.

(1) A non-pointer type argument.
(2) An entity variable in which value reference through pointer reference is present inside the function, and which is referred by a pointer type argument in which no value assignment through pointer reference is present.
(3) A global variable in which value reference is present inside the function and no value assignment is present.

The logic circuit output signal extraction unit 222 extracts an output signal from an argument and a return value of the inputted non-cyclical type lowermost function Fexp and a global variable included in the program P. The logic circuit output signal extraction unit 222 specifically determines and extracts (1) to (3) described below as output signals. Note that, herein, the "argument" indicates an argument of the non-cyclical type lowermost function Fexp, and the "function" indicates the non-cyclical type lowermost function Fexp.

(1) A return value of a function.
(2) An entity variable referred by a pointer type argument in which value assignment through pointer reference is present inside the function.
(3) A global variable in which value assignment is present inside the function.

With reference to FIG. 5 to FIG. 7, processing of extracting an input signal and an output signal by the logic circuit input signal extraction unit 221 and the logic circuit output signal extraction unit 222 respectively will be explained using concrete examples.

In a function top0 in FIG. 5, non-pointer type arguments a, b, and c are determined as input signals, and a computational expression of a return value is determined as an output signal. Although the return value is a variable e in this example, a return value of a function can be generally a general expression, not a single variable.

In a function top1 in FIG. 6, a non-pointer type argument a is determined as an input signal, and prev_stt that is a computational expression of a return value is determined as an output signal. Note that, an in-function static variable stt cannot be referred from the outside, and thus is determined as a signal in the logic circuit, and does not serve as input and output signals.

In a function top2 in FIG. 7, a non-pointer type argument pin is determined as an input signal. An argument pw is of a pointer type, and value assignment (pw[0][0]=pin, etc.) through pointer reference is present inside the function, so that all the nine array elements are determined as output signals. A variable that includes an entity of the array referred by this pointer type argument pw is designated by a function (not illustrated) calling the function top2. Further, this may be a static variable (including a global variable), or may be a local variable of a high-order hierarchy function directly or indirectly calling the function top2.

[Control Flow Graph Generation Unit 23]

The control flow graph generation unit 23 generates, from the non-cyclical type lowermost function Fexp obtained by the non-cyclical and non-hierarchical conversion unit 21, a control flow graph Fcfg thereof.

Generally, a control flow graph of a function represents a path when the function is executed as a directed graph. Nodes (nodal points) of the control flow graph include a basic block, a start point block, and an end point block. The basic block is a sequential instruction sequence in which no branch target is present other than a leading instruction, and no branch instruction is present other than an end instruction. The start point block is a node that corresponds to a function entrance, and the execution of the function is started from this. The end point block is a node that corresponds to a function exit, and the execution of the function is finished when reaching this node. A directed-edge of the control flow graph expresses a direct transition between nodes for the execution of the function.

Processing of generating a control flow graph from a function is a publicly known technique, and thus an explanation of a specific method thereof is omitted herein. Although the control flow graph Fcfg that is generated from the non-cyclical type lowermost function Fexp by the control flow graph generation unit 23 includes no loop structure (in other words, no path that passes through one node more than once is present in the graph), when the top-level function Ftop includes a condition branch instruction, the control flow graph Fcfg includes a condition branch edge of the path (and a confluence therewith).

[State Variable Instruction Dependence Determination Unit 24]

The state variable instruction dependence determination unit 24 determines a possibility of logic circuit generation with respect to the control flow graph Fcfg generated in the control flow graph generation unit 23, by means of logic circuit generation possibility determination rules 1 and 2, which will be explained below. If the state variable instruction dependence determination unit 24 determines that the logic circuit generation is impossible by means of either of these rules, the logic circuit generation device 1 can stop the logic circuit generation processing by outputting a warning message to the output device 17, for example.

The logic circuit generation possibility determination rule 1 is a rule to determine that the logic circuit generation is impossible when, for an assignment instruction to each array variable, the array index is a variable that is not a constant, and the array variable has no register attribute or no memory attribute. If such a variable is included in the control flow graph Fcfg, the state variable instruction dependence determination unit 24 determines that the logic circuit generation is impossible.

The logic circuit generation possibility determination rule 2 is a rule to determine that the logic circuit generation is impossible when, for each variable X that is a register/memory array variable (which means an array variable having the register attribute or the memory attribute), instructions A, B, and C having such a relation that there are a read-after-write dependence of the variable X from the instruction A to instruction B and a write-after-read dependence of the variable X from the instruction B to the instruction C, are present. In this case, assignment into X by the instruction A, reference to X by the instruction B, and assignment into X by the instruction C are continuously executed. However, such a software description cannot be implemented as a circuit operation in one clock, so that it is decided that the logic circuit generation is impossible. If an instruction having such a relation is included in the control flow graph Fcfg, the state variable instruction dependence determination unit 24 determines that the logic circuit generation is impossible.

Note that, in another embodiment of the present invention, the logic circuit generation device 1 can be configured to include no state variable instruction dependence determination unit 24. In any of the cases, the program P that the logic circuit generation device 1 receives as an input is limited to those including the top-level function Ftop to be converted into a control flow graph that satisfies the above-mentioned logic circuit generation possibility determination rules 1 and 2.

[Register/Memory Array Access Instruction Decomposition Unit 25]

To execute multiple read instructions and multiple write instructions in one clock from and to a register/memory array variable (which means an array variable having the register attribute or the memory attribute), circuits need to be implemented respectively using a multi-port register file for a register array variable (which means an array variable having the register attribute), or using a multi-port memory for a memory array variable (which means an array variable having the memory attribute). The register/memory array access instruction decomposition unit 25 allocates port numbers to an array assignment instruction and an array reference instruction thereby to perform associations of multiple write ports with array assignment instructions on the software description, and associations of multiple read ports with array reference instructions on the software description. Further, the register/memory array access instruction decomposition unit 25 adds a variable corresponding to an input port of a register file circuit or a memory circuit that is generated corresponding to a register/memory array variable thereby to subdivide an array assignment instruction and an array reference instruction.

More specifically, the register/memory array access instruction decomposition unit 25 in the present embodiment includes a write port number allocation unit 251, a read port number allocation unit 252, an array assignment instruction decomposition unit 253, and an array reference instruction decomposition unit 254, which are explained next.

The write port number allocation unit 251 allocates write a port number to each of the array assignment instructions to a register/memory array variable included in the control flow graph Fcfg to determine the number of write ports of the register/memory array variable. More specifically, the write port number allocation unit 251 counts up, for each of the array assignment instructions A to the register/memory array variable X included in the control flow graph Fcfg, the number of array assignment instructions other than the instruction A to the array variable X that are present on the paths from a start point block to the instruction A in the control flow graph Fcfg, and allocates a maximum value of the number thereof as a write port number to the instruction A.

The number of write port numbers that are allocated to the array assignment instructions to the register/memory array variable X in this manner is called the number of write ports of the register/memory array variable X. In other words, when a given integer Nw is used to express the write port numbers with Nw numbers from 0 to Nw−1, the number of write ports is Nw. The number of write ports of a register array variable is called the number of register file write ports, and the number of write ports of a memory array variable is called the number of memory write ports.

The read port number allocation unit 252 allocates read a port number to each of the array reference instructions to a register/memory array variable included in the control flow graph Fcfg to determine the number of read ports of the register/memory array variable. More specifically, the read port number allocation unit 252 counts up, for each of the array reference instructions B to the register/memory array variable X included in the control flow graph Fcfg, the number of array reference instructions other than the instruction B to the array variable X that are present on the paths from a start point block to the instruction B in the control flow graph Fcfg, and allocates a maximum value of the number thereof as a read port number to the instruction B.

The number of read port numbers that are allocated to the array reference instructions to the register/memory array variable X in this manner is called the number of read ports of the register/memory array variable X. In other words, when a given integer Nr is used to express the read port numbers with Nr numbers from 0 to Nr−1, the number of read ports is Nr. The number of read ports of a register array variable is called the number of register file read ports, and the number of read ports of a memory array variable is called the number of memory read ports.

Each of the register file circuit and the memory circuit that implement a register/memory array variable includes a write port that is used for writing a value into the register/memory array variable, and a read port that is used for reading a value from the register/memory array variable. The write port includes a data input port and an address input port. The array assignment instruction decomposition unit 253 adds variables corresponding to these two input ports to the control flow graph Fcfg to subdivide an array assignment instructions included in the control flow graph Fcfg. The read port includes an address input port. The array reference instruction decomposition unit 254 adds a variable corresponding to this input port to the control flow graph Fcfg to subdivide the array reference instructions included in the control flow graph Fcfg. The variables that are added corresponding to these ports are called "register/memory array port variables" or simply "port variables".

With reference to FIG. 14A to 14C, processing by the above-mentioned register/memory array access instruction decomposition unit 25 will be explained using a concrete example. FIG. 14A is a software description of a program that includes a function top3 including an array assignment instruction and an array reference instruction for a memory array variable A, and FIG. 14C is a control flow graph of the function top3.

As illustrated in line 8 and line 12 of FIG. 14A, the function top3 includes two array reference instructions v=A[a] and u=A[b]. The array reference instructions are also illustrated in the control flow graph of FIG. 14C without any change. In FIG. 14C, from a start point block top3:start to an instruction of an array reference instruction v=A[a], no array reference instruction for the array variable A is present (in other words, 0 array reference instructions are present), so that the read port number allocation unit 252 allocates a read port number 0 to the array reference instruction v=A[a]. Moreover, from the start point block top3:start to an array reference instruction u=A[b], a path that passes through the array reference instruction v=A[a] and a path that does not pass therethrough are present. Therefore, on the path from the start point block top3:start to the array reference instruction u=A[b], 0 or 1 array reference instruction is present, and the maximum value of the number thereof is 1, so that the read port number allocation unit 252 allocates a read port number 1 to the array reference instruction u=A[b]. From the above, two read port numbers 0 and 1 are allocated to the array reference instruction for the array variable A, so that the read port number allocation unit 252 decides the number of read ports for the array variable A as 2.

Moreover, as illustrated in line 9, line 13, and line 16 of FIG. 14A, the function top3 includes three array assignment instructions A[a]=V+1, A[b]=u+1, and A[0]=v+u. Among these array assignment instructions, processes for the array assignment instructions A[a]=V+1 and A[b]=u+1 are similar to the above-mentioned processes for the first and second array reference instructions. In other words, the write port number allocation unit 251 allocates a write port number 0 to the array assignment instruction A[a]=V+1, and allocates a write port number 1 to the array assignment instruction A[b]=u+1. From the start point block top3:start to the array assignment instruction A[0]=v+u, a path that passes through the array assignment instruction A[a]=V+1 and a path that does not pass therethrough are present; however, neither of the paths passes through the array assignment instruction A[b]=u+1. Therefore, on the path from the start point block top3:start reaching the array assignment instruction A[0]=v+u, 0 or 1 array assignment instruction is present, and the maximum value of the number thereof is 1, so that the write port number allocation unit 251 allocates the write port number 1 to the third array assignment instruction. From the above, two write port numbers 0 and 1 are allocated to the array assignment instruction for the array variable A, so that the write port number allocation unit 251 decides the number of write ports for the array variable A as 2.

As in the foregoing, the write ports 0 and 1 are allocated to the array assignment instructions of the array variable A, and the read ports 0 and 1 are allocated to the array reference instructions thereof. Meanwhile, the array assignment instruction decomposition unit 253 and the array reference instruction decomposition unit 254 add, as will be indicated next, port variables corresponding to these respective ports to the control flow graph Fcfg.

Read address variables: A0r (port 0), A1r (port 1)
Write address variables: A0w (port 0), A1w (port 1)
Write data variables: A0d (port 0), A1d (port 1)

Herein, the read address variable is a variable corresponding to an address input port in the read port, the write address variable is a variable corresponding to an address input port in the write port, and the write data variable a variable corresponding to a data input port in the write port.

Figure 16A:
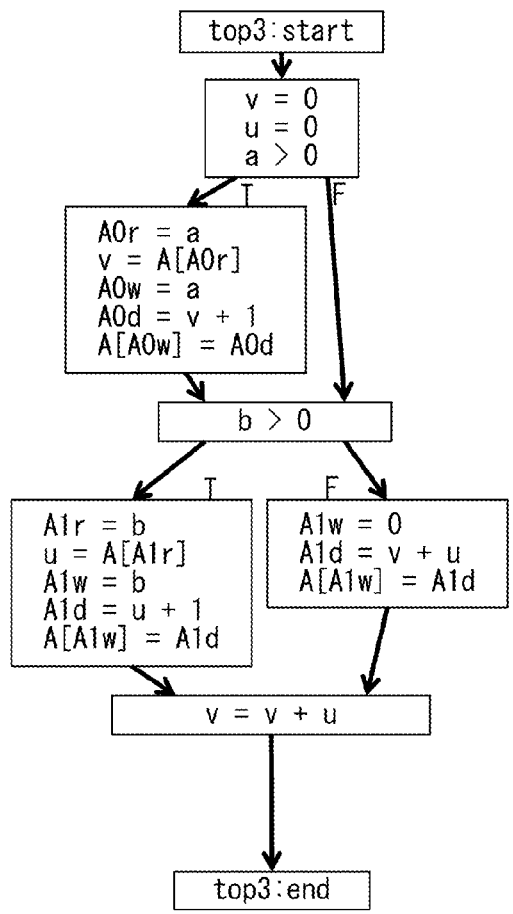
FIGS. 16A and 16B are diagrams illustrating a concrete example of a control flow graph of a program including a memory array access instruction, in the logic circuit generation device and the method of the present invention.

Further the array assignment instruction decomposition unit 253 and the array reference instruction decomposition unit 254 generate instructions to assign expressions of array indices to the write address variables and the read address variables, and generate instructions to assign expressions of calculating the assignment values to the write data variables. With this, the array assignment instruction decomposition unit 253 and the array reference instruction decomposition unit 254 convert, as illustrated in FIG. 16A, the array assignment instructions and the array reference instructions included in the control flow graph Fcfg into the subdivided instructions. FIG. 14B re-illustrates the control flow graph in FIG. 16A in a software description for facilitating understanding.

Note that, in another embodiment of the present invention, the register/memory array access instruction decomposition unit 25 can be configured to include no write port number allocation unit 251 and no read port number allocation unit 252. In this case, the array assignment instruction decomposition unit 253 and the array reference instruction decomposition unit 254 may add a pair of port variables to each array variable included in the control flow graph Fcfg.

Moreover, in still another embodiment of the present invention, the logic circuit generation device 1 can be configured to include no register/memory array access instruction decomposition unit 25. In this case, the logic circuit generation device 1 receives an input of the program P including no register/memory array variable.

[Number of Memory Ports Determination Unit 26]

The number of memory ports determination unit 26 determines whether the number of register file write ports, the number of register file read ports, the number of memory write ports, and the number of memory read ports, which were calculated in the register/memory array access instruction decomposition unit 25, each exceed threshold values set in advance. The threshold values for the numbers of ports can be individually decided in advance with respect to the four types of the ports based on circuit characteristics (for example, the circuit scale, the circuit operation speed, the electric power consumption) or technical factors such as a semiconductor manufacturing process. If any of these numbers of ports exceeds a threshold value set in advance, the number of memory ports determination unit 26 determines that a circuit synthesis is impossible. If the number of memory ports determination unit 26 determines that the logic circuit generation is impossible, the logic circuit generation device 1 can stop the logic circuit generation processing by outputting a warning message to the output device 17, for example.

Note that, in another embodiment of the present invention, the logic circuit generation device 1 can be configured to include no number of memory ports determination unit 26. In this case, the logic circuit generation device 1 performs processing of a logic circuit generation regardless of the number of ports.

[Static Single Assignment Form Conversion Unit 27]

If the number of memory ports determination unit 26 determines that the logic circuit generation of the control flow graph Fcfg is possible, the control flow graph Fcfg is then inputted into the static single assignment form conversion unit 27. The static single assignment form conversion unit 27 converts the control flow graph Fcfg into a control flow graph of a static single assignment form.

Generally, the static single assignment form is one of intermediate expression forms of software compilers, and means such a form that only one definition for a value of each variable is present (in other words, assignment of a value to each variable is performed at one position). The static single assignment form is acquired by performing a name change (renaming) of a variable, and further adding an instruction that is called a φ-function instruction to a control flow position where a multiple value definitions of the same variable join.

The static single assignment form conversion unit 27 more specifically includes a φ-function instruction insertion unit 271, a variable name conversion unit 272, a state variable name re-conversion unit 273, which are explained next.

The φ-function instruction insertion unit 271 inserts a φ-function instruction into a position in the control flow graph where multiple value definitions of the same variable join. The φ-function instruction is an instruction to select, out of all variable definitions (which means definition for the value of a variable) that join at the position, a variable definition on an actually executed path. A value based on the variable definition selected by the φ-function instruction is assigned to the same variable. Note that, instantiation of a φ-function instruction (which means that a φ-function instruction is converted into a specific operation instruction), is performed by the control flow degenerate conversion unit 28, which is described later.

The variable name conversion unit 272 replaces definition for a value of a variable by each of the variable assignment instructions and the φ-function instructions in the control flow graph with a unique subscripted variable name for that variable. The variable name conversion unit 272 further replaces, each of the instructions to refer to a variable in the control flow graph, a variable name of the referred variable with a subscripted variable name corresponding to a definition for a value of a variable by the variable assignment instruction or the φ-function instruction reaching the reference instruction. This process converts the control flow graph into a static single assignment form.

The state variable name re-conversion unit 273 replaces, as additional processing for the control flow graph converted into a static single assignment form, for each static variable (which includes a global variable), a subscripted variable name allocated to a definition for a value reaching an endpoint block corresponding to an exit of the function with a subscripted variable name at a start point block corresponding to an entrance of the function. This replacement is performed for allowing values of the static variable and the global variable at the function exit to be referred at a function entrance position in a next function execution.

With reference to FIGS. 15A to 15F, processing in a case where the static single assignment form conversion unit 27 converts the control flow graph Fcfg, involving multiple variable definitions being joined, into a static single assignment form will be explained using a concrete example. FIG. 15B is a control flow graph representing a control flow of a top-level function top4 included in a program illustrated in FIG. 15A. Firstly, the φ-function instruction insertion unit 271 inserts, as illustrated in FIG. 15C, φ-function instructions into leading positions of a basic block where the variable definitions for the respective variables a, b, and c join. Specifically, when a function argument variable a is considered, a definition for a value that is provided as a value for the function argument at a function entrance and a definition for a value by an assignment instruction of $a=b+1$ join at a position where the φ-function instructions are inserted. When a global variable b is considered, three definitions of a definition for a value that is provided as a value of a global variable at the function entrance, a definition for a value by an assignment instruction of $b=b+1$, and a definition for a value by an assignment instruction of $b=a$ join at a position where the φ-function instructions are inserted. When a local variable c is considered, three definitions of a definition for a value by an assignment instruction of $c=b-1$, a definition for a value by an assignment instruction of $c=c+1$, and a definition for a value by an assignment instruction of $c=0$ join at a position where the φ-function instructions are inserted.

Next, as illustrated in FIG. 15D, the variable name conversion unit 272 replaces a definition for a value of a variable by each of the variable assignment instructions and the φ-function instructions with a unique subscripted variable name for that variable. For example, a variable name $c_1$ is a subscripted variable name that is allocated to a definition for a value by one assignment instruction for the variable c, and a variable name $c_2$ is a subscripted variable name that is allocated to a definition for a value by another assignment instruction for the same variable c. Moreover, the variable name conversion unit 272 assumes that values of a function argument variable and a static variable (which includes a global variable), although not illustrated, are defined at a start point block top4:start of the control flow graph corresponding to an entrance of the function top4, and allocates subscripted variable names also to these variables. Specifically, a subscripted variable name $a_1$ is allocated to the definition for a value of the variable a that is given as a value of a function argument. Moreover, as for the global variable b, a value at a time point of a function entrance is assumed to be a definition without any change, and a subscripted variable name $b_1$ is allocated to the definition for the value.

As illustrated in FIG. 15E, the variable name conversion unit 272 further replaces, for each instruction to refer to a variable in the control flow graph, a variable name of the referred variable with a subscripted variable name corresponding to a definition for a value of a variable by the variable assignment instruction or the φ-function instruction reaching the reference instruction. Specifically, although a global variable b is referred in an instruction expressed by an expression $c_1=b-1$ in FIG. 15D, as described in the foregoing, a subscripted variable name $b_1$ is allocated to a definition for a value of a variable b reaching this instruction, so that a variable name of the variable b in this instruction is replaced with $b_1$, as illustrated in FIG. 15E. The same applies to other instructions that refer to variables.

With the processing in the foregoing, the control flow graph is converted into a static single assignment form. Meanwhile, the state variable name re-conversion unit 273 performs additional processing on the control flow graph of a static single assignment form that is formed in this manner. In other words, as illustrated in FIG. 15F, for each static variable (which includes a global variable), a subscripted variable name allocated to a definition for a value reaching an end point block top4:end corresponding to an exit of the function top4 with a subscripted variable name at the start point block top4:start corresponding to an entrance of the function top4.

Figure 16B:
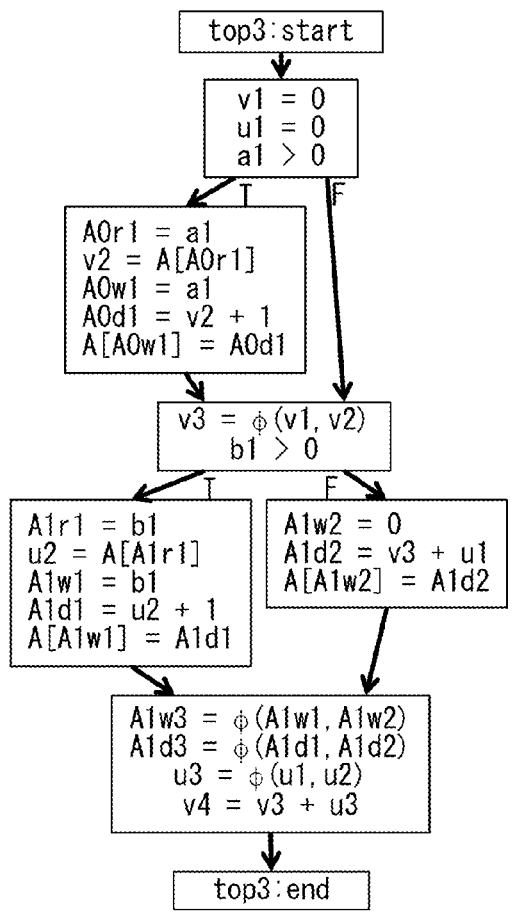

The processing of converting the control flow graph Fcfg into a static single assignment form is illustrated in FIGS. 16A to 16B using another concrete example. FIG. 16A is a control flow graph of the function top3 that is described in the software description illustrated in FIG. 14B. FIG. 16B illustrates a result that the static single assignment form conversion unit 27 converts the control flow graph of FIG. 16A into a static single assignment form. The specific method of the conversion is already described with reference to FIGS. 15A to 15F. The function top3 in this example includes a register/memory array access instruction, and the register/memory array access instruction included in the control flow graph Fcfg is subdivided by the above-mentioned register/memory array access instruction decomposition unit 25, using register/memory array port variables. The static single assignment form conversion unit 27 also replaces the variable name of the register/memory array port variable, as in the case of other variables. Note that, for the register/memory array variable itself, the variable name is not replaced.

In another embodiment of the present invention, the logic circuit generation device 1 can be configured to include no static single assignment form conversion unit 27. In this case, the logic circuit generation device 1 receives an input of the program P including the top-level function Ftop described in the software description of a static single assignment form.

[Control Flow Degenerate Conversion Unit 28]

The control flow graph Fcfg that is converted into a static single assignment form by the static single assignment form conversion unit 27 is then inputted into the control flow degenerate conversion unit 28. As described in the foregoing, the control flow graph Fcfg does not include the loop structure but includes a condition branch edge of the path (and a confluence with the condition branch edge) in some cases, and thus is not suitable for being used as data representing a logic circuit without any change. However, the control flow graph Fcfg inputted into the control flow degenerate conversion unit 28 is converted into a static single assignment form including only a single assignment to each variable, so that if a φ-function instruction added to the control flow graph Fcfg is instantiated, and instructions of all the nodes of the control flow graph are executed while ignoring a condition branch edge, a normal operation is performed. This is a significantly important fact in a method of generating a logic circuit from a software description.

Therefore, the control flow degenerate conversion unit 28 instantiates the φ-function instructions included in the inputted control flow graph Fcfg, and removes all the condition branch edges from the control flow graph Fcfg, thereby generating a control flow degenerate program Fdeg that is a program in which the control flow is degenerated. The control flow degenerate program Fdeg more directly represents the structure of a logic circuit than does the control flow graph Fcfg including a condition branch edge.

More specifically, the control flow degenerate conversion unit 28 in the present embodiment includes a φ-function instruction instantiation unit 281, a basic block unification unit 282, and a register/memory array access instruction fusion unit 283, which are explained next.

The φ-function instruction instantiation unit 281 instantiates the φ-function instructions included in the inputted control flow graph Fcfg (in other words, coverts the φ-function instructions into specific operation instructions). As was described in the explanation of the static single assignment form conversion unit 27, the φ-function instruction is inserted into a position where multiple variable definitions join in the control flow graph, and is an instruction to select a variable definition on an actually executed path, out of all the variable definitions that join at the position. The selection of a variable definition is performed based on a condition value in the condition branch edge of the path. For example, it is assumed that there are two paths that condition-branch depending on a truth/false value of a condition p, a variable definition a1 is present on the path that is executed if the condition p is true while a variable definition a2 is present on the path that is executed if the condition p is false, and a φ-function instruction φ(a1, a2) that selects one out of these variable definitions is present in a portion after the two paths join. In this process, the φ-function instruction φ(a1, a2) is instantiated to select a1 if the condition p is true, and select a2 if not (in other words, if the condition p is false). More specifically, φ(a1, a2) is instantiated to an expression of p ? a1:a2.

The basic block unification unit 282 removes all the condition branch edges from the control flow graph Fcfg in which the φ-function instructions are instantiated by the φ-function instruction instantiation unit 281, thereby generating a control flow degenerate program Fdeg that is a program in which the control flow is degenerated.

Generally, in a control flow graph including no condition branch edge, a single path is decided, and all the instructions are successively executed in a series, so that the instructions (other than the branch instruction) included in all the basic blocks is joined to one instruction sequence, thereby making it possible to join all the basic blocks to one basic block. A program expressed by a control flow graph in which basic blocks are brought together to one in this manner is called a program in which a control flow is degenerated.

Meanwhile, the control flow graph Fcfg that is inputted into the basic block unification unit 282 and in which the φ-function instructions are instantiated performs a normal operation even if the condition branch edges are ignored and instructions of all the nodes are executed, as described in the foregoing. Therefore, the basic block unification unit 282 joins the instructions (other than the branch instructions) included in all the basic blocks to one instruction sequence, so that all the basic blocks are joined to one basic block, thereby generating a program in which a control flow is degenerated. In this process, the order of instructions in the instruction sequence of the joined basic block is based on the execution order of the original basic blocks. For example, considered is a case where in the inputted control flow graph Fcfg, a path is branched from a basic block B1 into basic blocks B2 and B3, and thereafter, these paths join in a basic block B4. In this process, B1 is executed prior to B2 in the path that passes through B1 and B2, so that the instructions having been included in B1 are arranged before the instructions having been included in B2 in the joined basic block. The same applies to a relation between B1 and B3, a relation between B2 and B4, and a relation between B3 and B4. However, no path that pass through both of B2 and B3 is present, so that the instructions having been included in B2 may be arranged before or after the instructions having been included in B3. As a result, B1→B2→B3→B4 or B1→B3→B2→B4 is obtained as the order of instructions in this portion in the joined basic block. In either case, the instructions having been included in B2 and the instructions having been included in B3 are executed only exclusively in the control flow graph Fcfg. However, both are executed in the joined basic block.

The register/memory array access instruction fusion unit 283 performs, for the control flow degenerate program Fdeg in which the φ-function instruction is instantiated, processing of fusing register/memory array access instructions to be exclusively executed and processing of adding execution conditional expressions to register/memory array access instructions to be conditionally executed.

With reference to FIG. 15F and FIG. 17, processing performed by the control flow degenerate conversion unit 28 will be explained using a concrete example. Firstly, the φ-function instruction instantiation unit 281 instantiates φ-function instructions included in the control flow graph Fcfg. Operations of the respective φ-function instructions included in a control flow graph of FIG. 15F are as follows based on condition values on condition branch edges of the path. Herein, condition values are set as P1=(a1==0) and P2=(a1<0).

The φ(a1, a2) selects a2 if P1 is true, or selects a1 if P1 is false.

The φ(b1, b2, b3) selects b2 if P1 is true, selects b3 if P1 is false and P2 is true, or selects b1 if P1 is false and P2 is false.

The φ(c1, c2, c3) selects c2 if P1 is true, selects c3 if P1 is false and P2 is true, or selects c1 if P1 is false and P2 is false.

Each φ-function instruction is instantiated as follows by expressing these selections as specific expressions.

$$\varphi(a1,a2)=(P1)?a1:a2;$$

$$S\_b3\_b1=(P2)?b3:b1;$$

$$\varphi(b1,b2,b3)=(P1)?b2:S\_b3\_b1;$$

$$S\_c3\_c1=(P2)?c3:c1;$$

$$\varphi(c1,c2,c3)=(P1)?c2:S\_c3\_c1;$$

Next, the basic block unification unit 282 joins the instructions (other than the branch instructions) in all the basic blocks included in the control flow graph Fcfg in which the φ-function instruction is instantiated, to one instruction sequence. As a result, all the condition branch edges are removed, and a control flow degenerate program Fdeg illustrated in FIG. 17 is generated.

As another concrete example, with reference to FIG. 16B and FIG. 18, processing performed by the control flow degenerate conversion unit 28 will be explained. FIG. 18A illustrates a control flow degenerate program Fdeg that is converted from the control flow graph Fcfg including register/memory array access instructions in FIG. 16B. The specific processing method of this conversion is already explained with reference to FIG. 15F and FIG. 17. The register/memory array access instruction fusion unit 283 performs, for this control flow degenerate program Fdeg, processing of fusing register/memory array access instructions to be exclusively executed. Specifically, an array assignment instruction A[A1w1]=A1d1 illustrated in line 17 and an array assignment instruction A[A1w2]=A1d2 illustrated in line 20 of FIGS. 18A and 18B are fused to one array assignment instruction A[A1w3]=A1d3 illustrated in line 26 of FIG. 18B, using results of the instantiation of φ-function instructions A1w3=φ(A1w2) and A1d3=φ(A1d1, A1d2). Further, the register/memory array access instruction fusion unit 283 performs processing of adding an execution conditional expression to a register/memory array access instruction to be conditionally executed. Specifically, an assignment instruction A0r1=a1 of a read address port variable of an array reference instruction v2=A[A0r1] illustrated in line 5 of FIG. 18A is executed if P1 is true, so that this array reference instruction is converted into if(P1) v2=A[A0r1] as illustrated in line 5 of FIG. 18B. Similarly, both of an assignment instruction A0w1=a1 of a write address port variable and an assignment instruction A0d1=v2+1 of a write data port variable, of an array assignment instruction A[A0w1]=A0d1 illustrated in line 8 of FIG. 18A, are executed if P1 is true, so that this array assignment instruction is converted into if(P1) A[A0w1]=A0d1 as illustrated in line 5 of FIG. 18B. Meanwhile, the φ-function instructions output a write address port variable and a write data port variable of an array assignment instruction A[A1w3]=A1d3, and these φ-function instructions are placed on the control flow path to be certainly executed, so that no execution condition is added thereto.

As was explained in the foregoing, the control flow degenerate conversion unit 28 generates, from an inputted control flow graph Fcfg, a control flow degenerate program Fdeg that is a program in which the control flow is degenerated. Note that, in another embodiment, when the logic circuit generation device 1 includes no φ-function instruction insertion unit 271, the control flow graph Fcfg includes no φ-function instruction, so that the control flow degenerate conversion unit 28 can be configured to include no φ-function instruction instantiation unit 281. Moreover, in still another embodiment, when the logic circuit generation device 1 includes no register/memory array access instruction decomposition unit 25, the control flow degenerate conversion unit 28 can be configured to include no register/memory array access instruction fusion unit 283.

[Data Flow Graph Generation Unit 29]

The control flow degenerate program Fdeg that is generated by the control flow degenerate conversion unit 28 is then inputted into the data flow graph generation unit 29.

Figure 19:
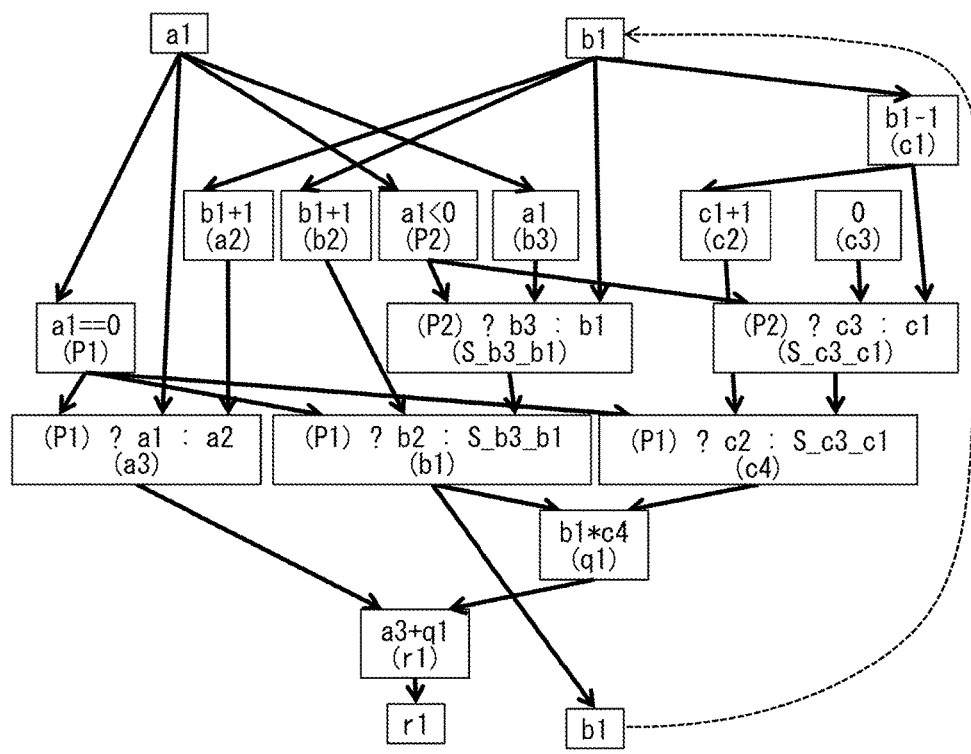
FIG. 19 illustrates a data flow graph that is generated from the control flow degenerate program in FIG. 17.
Figure 20:
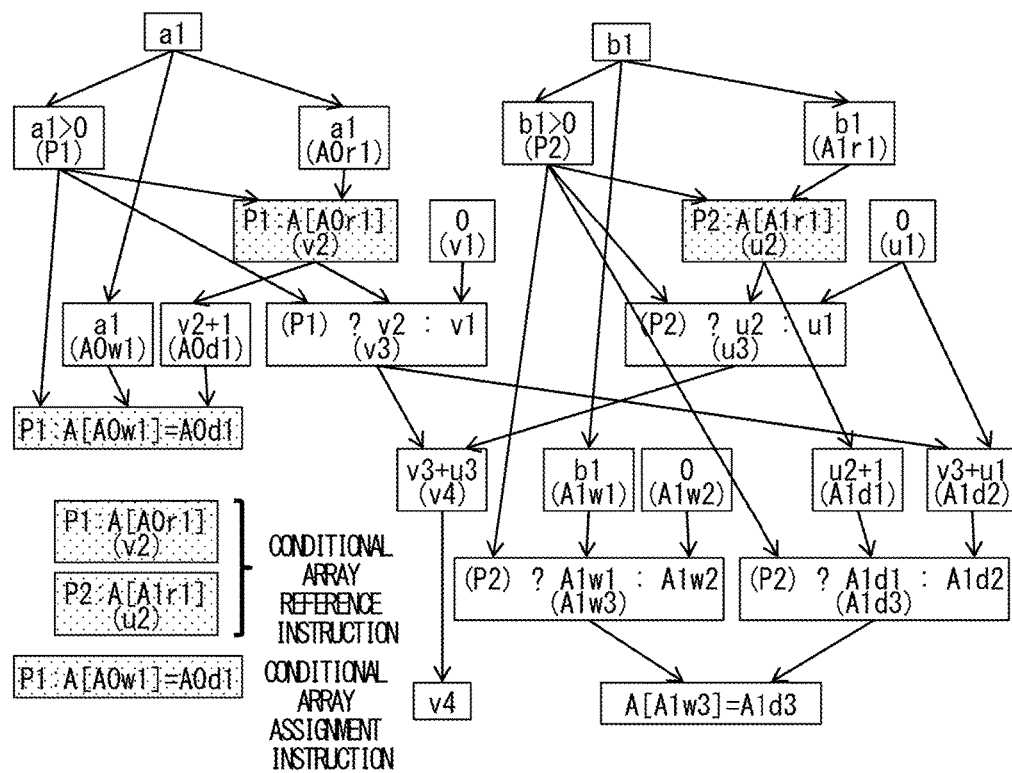
FIG. 20 illustrates a data flow graph that is generated from the control flow degenerate program in FIG. 18B.

The data flow graph generation unit 29 generates, from the sequential instruction sequence included in the inputted control flow degenerate program Fdeg and including no branch and no joining of control flows, the data flow graph Fdfg thereof. Generally, the data flow graph is a directed graph in which each instruction serves as a node, and a directed edge is joined between an instruction to define a value of a variable and an instruction to refer to the definition, in the sequential instruction sequence. The processing of generating, from a sequential instruction sequence including no branch and no joining of control flows, a data flow graph thereof can be easily implemented using a publicly known technique, and thus, an explanation on a specific method is omitted herein. As a concrete example, FIG. 19 illustrates a data flow graph that is generated from the control flow degenerate program in FIG. 17. As another concrete example, FIG. 20 illustrates a data flow graph that is generated from the control flow degenerate program in FIG. 18B.

[Data Flow Graph Optimization Unit 30]

The data flow graph Fdfg generated by the data flow graph generation unit 29 is then inputted into the data flow graph optimization unit 30. The data flow graph optimization unit 30 optimizes the inputted data flow graph Fdfg. More specifically, the data flow graph optimization unit 30 includes a bit width determination unit 301, a redundant comparison operation elimination unit 302, an operation decomposition unit 303, and a redundant operation elimination unit 304, which are explained next.

In the RTL description, the bit width of each set of data in an operation circuit needs to be explicitly indicated. However, it is extremely cumbersome to explicitly designate the bit width of each set of data. Therefore, the bit width determination unit 301 automatically determines, from information on the bit width designation of input data and a register variable of the logic circuit, the bit widths of intermediate data and output data of the operation circuit. In the present embodiment, an interval of a value that these data can take is obtained, a minimum bit width possible to represent any value within the interval is decided as a bit width of the data. Hereinafter, processing performed by the bit width determination unit 301 will be explained in detail. In the following explanation, although only an integer value is considered as data, a value of another type (for example, floating-point number) can be apparently considered in a similar manner. Moreover, in the present embodiment, a negative value is represented by two's complement expression.

In the following explanation, the minimum value and the maximum value that data x can take are respectively expressed as x.L and x.H. Moreover, an interval [x.L, x.H] that is decided using these values as both-end points is called data interval of the data x. A data interval of data the possible value of which is a constant value c is [c, c].

In the bit expression of the constant c, the minimum bit width that is possible to represent a portion excluding a sign bit is called the minimum bit width of c, and expressed as min_bit(c). If c is a non-negative value, that is, if c>=0, a value of min_bits (c) is a minimum integer n that satisfies $2^n-1>=c$, and if c is a negative value, that is, if c<0, a value of min_bits (c) is a minimum integer n that satisfies $2^n>=-c$.

A minimum bit width bit_width ([x.L, x.H]) for representing data x having a data interval [x.L, x.H] is expressed as follows using this min_bits (c).

If data x can take only a non-negative value, that is, if x.L>=0, the data x is treated as unsigned data, and is represented in bit by unsigned binary number expression. In this case, it is possible to represent any value that that x can take by the bit width possible to represent the maximum value that x can take, so that a minimum bit width for representing the data x is expressed as bit_width($[x.L,x.H]$)=min_bits($x.H$).

On the other hand, if data x can take a negative value, that is, if $x.L<0$, the data x is treated as signed data, and is represented in bit by signed binary number (two's complement for a negative value). In this case, the minimum bit width for representing data x is expressed as bit_width($[x.L,x.H]$)=max(min_bits($x.L$),min_bits($x.H$))+1.

Firstly, the bit width determination unit 301 calculates, for input data and a state variable of the logic circuit, from information on the bit width and a data type, a range of a value that each set of data can take, and sets the range as an initial data interval.

An initial data interval of n-bit unsigned data x is set as $[x.L,x.H]$=[0,$2n$−1].

An initial data interval of n-bit signed data x is set as $[x.L,x.H]$=[−$2n$−1,$2n$−1−1].

Next, the bit width determination unit 301 decides, based on a type of each operation and a data interval of an operation target, a data interval of an operation result. Hereinafter, for each type of operation, processing of deciding a data interval of an operation result will be explained.

(1) Data Interval in Binary Operation

A data interval of an operation result for a binary operation in the format of z=x op y is expressed as $[z.L,z.H]$=Range(op,$[x.L,x.H]$,$[y.L,y.H]$).

Although processing of a binary operation in which an operator op is any one of {+, −, *, /, %, <<, >>, &, |, ^, !=, <, >, <=, >=}, out of binary operators of the C language, will be explained herein, for example, similar processing is apparently possible for other binary operations such as an exponentiation. The data interval of the operation result in the binary operation is decided from an operator op, and data intervals [x.L, x.H] and [y.L, y.H] of operation target data x and y. Hereinafter, for each type of the binary operation, processing of deciding a data interval of an operation result will be explained.

(1.1) Data Interval in Monotonic Binary Operation

When an operator op in a binary operation x op y is any one of {+, −, *, <<, >>}, the binary operation is herein called a monotonic binary operation. A data interval of the operation result of x op y in this case is obtained using minimum values x.L, y.L and maximum values x.H, y.H. More specifically, $M$Range(op,$[x.L,x.H]$,$[y.L,y.H]$)=[min($z0,z1,z2,z3$),max($z0,z1,z2,z3$)];

(in the expression above,
$z0$=x.L op y.L;
$z1$=x.L op y.H;
$z2$=x.H op y.L;
$z3$=x.H op y.H;)
is defined, which is a data interval of the operation result in the monotonic binary operation, and thus, Range(op,$[x.L,x.H]$,$[y.L,y.H]$)=$M$Range(op,$[x.L,x.H]$,$[y.L,y.H]$);

is decided.

(1.2) Data Interval of Division

In a case where the binary operation x op y is a division, that is, when the op is /, as will be explained next, the case is further classified depending on data interval [y.L, y.H] of a divisor y. Note that, a case of y==0 is not considered herein.

If y is a non-negative value only or y is a non-positive value only, that is, if y.L>=0||y.H<=0, when an effective data interval of a divisor, that is, y==0 is eliminated from a data interval of a data interval y, is set as [y'.L, y'.H], the both-end points are expressed as $y'.L$=(y.L==0)?1:y.L;

$y'.H$=(y.H==0)?−1:y.H.

With the use of this, an operation data interval in this case is decided as

Range(/,$[x.L,x.H]$,$[y.L,y.H]$)=$M$Range(/,$[x.L,x.H]$,$[y'.L,y'.H]$);

is decided.

In other cases, that is, y is a positive or negative value, that is, if y.L<0 && y.H>0, the interval of the divisor y is separated into a negative range and a positive range, obtains data intervals of operation results when the divisor is limited in the ranges, and those data intervals are integrated, thereby deciding a final data interval of the operation results. Specifically, when a data interval of the operation result is set to [L0, H0] if the divisor is limited in the negative range, and a data interval of the operation result is set to [L1, H1] if the divisor is limited in the positive range, $[L0,H0]$=$M$Range(/,$[x.L,x.H]$,$[y.L,-1]$);

$[L1,H1]$=$M$Range(/,$[x.L,x.H]$,$[1,y.H]$);

are expressed. Accordingly, by integrating these intervals, a final data interval of the operation results in this case is decided as Range(/,$[x.L,x.H]$,$[y.L,y.H]$)=[min($L0,L1$),max($H0,H1$)].

(1.3) Data Interval in Modulo Operation

A case where the binary operation x op y is a modulo operation, that is, when the op is %, is as follows.

Generally, when y !=0, if x is a negative value, the minimum value and the maximum value of x % y are respectively −(abs(y)−1) and 0. If x is a non-negative value, the minimum value and the maximum value of x % y are respectively 0 and abs (y)−1. Therefore, $y\_abs\_max$=max(abs($y.L$),abs($y.H$));

$z4$=($x.L<0$)?−($y\_abs\_max$−1):0;

$z5$=($x.H>=0$)?$y\_abs\_max$−1:0;

are decided, so that a data interval of the operation results in the modulo operation is decided as Range(%,$[x.L,x.H]$,$[y.L,y.H]$)=[min($z4,0$),max($z5,0$)].

(1.4) Data Interval in Logic Operation

Processing of deciding a data interval of the operation result in a case where the binary operation x op y is a logic operation for each bit, that is, when the operator op is any one of {&, |, ^ } will be explained below. Note that, in the explanation, the "logic operation" that is simply described means a logic operation for each bit.

In the case where a data interval of a logic operation is calculated, which is different from the case of the arithmetical operation, the concept of two's complement is not applied. In other words, −1 and 0 are respectively in binary notation 111 . . . 1 and 000 . . . 0, so that an interval including both of −1 and 0 is discontinuous in binary notation. An interval that includes both negative and non-negative values and is discontinuous in binary notation as the above is called a binary discontinuous interval. In contrast, an interval that includes only negative values or an interval that includes only non-negative values is called a binary continuous interval.

In a case where two integers x and y are each expressed by the two's complement, and are re-interpreted and compared as unsigned integers, the maximum value and the minimum value are expressed as unsigned_max(x, y) and unsigned_min(x, y).

When these values are specifically defined by expressions, unsigned_max($x,y$)=((unsigned)$x$>(unsigned)$y$)?$x$:$y$;

unsigned_min($x,y$)=((unsigned)$x$<(unsigned)$y$)?$x$:$y$;

are obtained.

In another representation, the following is obtained. If signs of x and y are equal, that is, if (($x<0$)==($y<0$)), by a normal large-small comparison unsigned_max($x,y$)=($x>y$)?$x$:$y$;

unsigned_min($x,y$)=($x<y$)?$x$:$y$;

are expressed. On the other hand, if signs of x and y are different, that is, if (($x<0$) !=($y<0$)), and if x and y are re-interpreted and compared as unsigned integers, since a re-interpreted negative value is larger than a re-interpreted non-negative value, unsigned_max($x,y$)=($x<0$)?$x$:$y$;

unsigned_min($x,y$)=($x>=0$)?$x$:$y$;

are expressed.

Firstly herein, a case where any of data intervals of operation targets are binary continuous intervals in the logic operation will be explained. In other words, in the logic operation in the format of z=x op y, the case is that both of [x.L, x.H] and [y.L, y.H] are binary continuous intervals. A data interval [z.L, z.H] of an operation result in this case is expressed as

[$z.L,z.H$]=C_Range(op,[$x.L,x.H$],[$y.L,y.H$]).

This is specifically obtained by the following computational expression.

$b$=max(min_bits($x.L$),min_bits($x.H$),min_bits($y.L$), min_bits($y.H$));

$x$_sign=($x.L<0$);(because of the binary continuous interval,($x.L<0$)==($x.H<0$))

$y$_sign=($y.L<0$);(because of the binary continuous interval,($y.L<0$)==($y.H<0$))

min_range=($x$_sign op $y$_sign)?−$2^b$:0;

max_range=($x$_sign op $y$_sign)?−1:$2^b$−1;

C_Range(&,[$x.L,x.H$],[$y.L,y.H$])=[min_range,unsigned_min($x.H,y.H$)];

C_Range(|,[$x.L,x.H$],[$y.L,y.H$])=[unsigned_max($x.L,y.L$),max_range];

C_Range(^,[$x.L,x.H$],[$y.L,y.H$])=[min_range, max_range];

Note that, in the expressions above, min_range and max_range are used for deciding end points of the interval, a range of an actual operation result does not necessarily include a value of min_range or max_range depending on a given data interval of the operation target, in some cases. In another embodiment of the present invention, by analyzing a possible value of each bit from a data interval of an operation target, a data interval of the operation result may be obtained more precisely. Alternatively, in contrast of this, in still another embodiment, the present embodiment may be further simplified, for example, considering only the bit-width.

Next, a general case in the logic operation will be explained. for each of the data intervals [x.L, x.H] and [y.L, y.H] of an operation target when an operator op is any one of {&, |, ^} in an operation x op y, if an interval thereof is a binary discontinuous interval, the interval is divided into two binary continuous intervals, data intervals of operation results in the respective binary continuous intervals are thereafter calculated, and those results are integrated, thereby deciding a final data interval of the operation result. The following is expressed by using a specific expression. Firstly, a determination is made as to whether data intervals [x.L, x.H] and [y.L, y.H] are each a binary discontinuous interval. In cases of $x$_neg_pos=($x.L<0$&&$x.H>=0$);([$x.L,x.H$] is a binary discontinuous interval)

$y$_neg_pos=($y.L<0$&&$y.H>=0$);([$y.L,y.H$] is a binary discontinuous interval)

$x$_neg_pos==0&&$y$_neg_pos==0, that is, both intervals are binary continuous intervals, as described above Range(op,[$x.L,x.H$],[$y.L,y.H$])=C_Range(op,[$x.L,x.H$], [$y.L,y.H$]);

is obtained.

In a case of x_neg_pos==0 && y_neg_pos==1, by dividing a data interval [y.L, y.H] that is a binary discontinuous interval

[$L0,H0$]=C_Range(op,[$x.L,x.H$],[$y.L,$−1]);

[$L1,H1$]=C_Range(op,[$x.L,x.H$],[$0,y.H$]);

Range(op,[$x.L,x.H$],[$y.L,y.H$])=[min($L0,L1$),max($H0, H1$)];

is obtained.

In a case of x_neg_pos==1 && y_neg_pos==0, by dividing a data interval [x.L, x.H] that is a binary discontinuous interval

[$L2,H2$]=C_Range(op,[$x.L,$−1],[$y.L,y.H$]);

[$L3,H3$]=C_Range(op,[$0,x.H$],[$y.L,y.H$]);

Range(op,[$x.L,x.H$],[$y.L,y.H$])=[min($L2,L3$),max($H2, H3$)];

is obtained.

In a case of x_neg_pos==1 && y_neg_pos==1, by dividing both data intervals [x.L, x.H] and [y.L, y.H]

[$L4,H4$]=C_Range(op,[$x.L,$−1],[$y.L,$−1]);

[$L5,H5$]=C_Range(op,[$x.L,$−1],[$0,y.H$]);

[$L6,H6$]=C_Range(op,[$0,x.H$],[$y.L,$−1]);

[$L7,H7$]=C_Range(op,[$0,x.H$],[$0,y.H$]);

Range(op,[x.L,x.H],[y.L,y.H])=[min(L4,L5,L6,L7),max(H4,H5,H6,H7)];

is obtained.

As in the foregoing, for all the cases, a data interval of the operation result in the logic operation is decided.

(1.5) Data Interval in Comparison Operation

In a case where a binary operation x op y is a comparison operation, that is, if an operator op is any one of {==, !=, <, >, <=, >=}, a data interval of the operation result is any one of [0, 0], [1, 1], and [0, 1]. A result of the comparison operation is a constant 0 or 1 by general constant propagation in some cases. Moreover, as is described later, the result of the comparison operation is evaluated as a constant by data interval determination.

If the result of the comparison operation is not a constant, a data interval of the operation result is [0, 1]. In other words, Range(op,[x.L,x.H],[y.L,y.H])=[0,1];

is decided.

In the foregoing, by (1.1) to (1.5), the data interval of the operation result in the binary operation is decided.

(2) Data Interval in Monotonic Operation

Next, processing of deciding a data interval of an operation result in a monotonic operation will be explained.

A data interval of the operation result in the monotonic operation in the format of u=op x is expressed as

[u.L, u.H]=Range(op, [x.L, x.H]). Herein, processing of a monotonic operation in which an operator op is any one of {!, ~, −, +}, out of monotonic operators of the C language will be explained.

The data interval of the operation result in the monotonic operation is decided from an operator op, and a data interval [x.L, x.H] of operation target data x, as follows.

Range(!,[x.L,x.H])=[0,1]; (logical negation)

Range(~,[x.L,x.H])=[~x.H,~x.L]; (bit inversion)

Range(−,[x.L,x.H])=[−x.H,−x.L]; (minus operation)

Range(+,[x.L,x.H])=[x.L,x.H]; (plus operation)

(3) Data Interval in Selection Operation

Finally, processing of deciding a data interval of an operation result in a selection operation (ternary operation) in the format of s=t ? x:y will be explained. A data interval of the operation result in the selection operation is decided based on a relation between a conditional expression t and selected terms x and y. Note that, when the conditional expression t is a constant value, as is described later, the selection operation is simplified to a simple assignment expression by the redundant comparison operation elimination unit 302, and thus, the data interval of the operation result does not need to be considered herein. Therefore, a case where the conditional expression t is not apparently a constant value will be explained below.

(3.1) In Case where Conditional Expression t is Large-Small Comparison Operation (<, >, <=, >=) Between Variable w and Constant In this case, a data interval [w.L, w.H] of w is divided into an interval in which a conditional expression t is false and an interval in which a conditional expression t is true, for each of the divided intervals, by assuming that data interval of w included in selected terms x and y is the divided interval, the data intervals of the selected terms x and y are evaluated, and then both of the data intervals integrated, thereby deciding a final data interval of the operation result.

In this process, in accordance with the form of the conditional expression t, anyone of the following processes (K), (L), (M), and (N) is selected, and the data intervals of the selected terms x and y are evaluated. Note that, c expresses a constant value in these processes.

(K) In a case where the conditional expression t is a form of w<c, a data interval of the second term x is evaluated by assuming that a data interval of w is [w.L, c−1], and a data interval of the third term y is evaluated by assuming that a data interval of w is [c, w.H].

(L) In a case when the conditional expression t is a form of w>=c, the conditional expression t is expressed as !(w<c), so that, in contrast to the above-mentioned case (K), a data interval of the second term x is evaluated by assuming that a data interval of w is [c, w.H], and a data interval of the third term y is re-evaluated by assuming that a data interval of w is [w.L, c−1].

(M) In a case where the conditional expression t is a form of w<=c, when c'=c+1, the conditional expression t is expressed as w<c', so that based on this form of w<c' and in accordance with the above-mentioned (K), the data intervals of x and y are evaluated.

(N) In a case where the conditional expression t is a form of w>c, when c'=c+1, the conditional expression t is expressed as w>=c', so that based on this form of w>=c' and in accordance with the above-mentioned (L), the data intervals of x and y are evaluated.

A data interval of the operation result in the selection operation is decided by integrating the data intervals of x and y that are evaluated by the above-mentioned (K), (L), (M), and (N). In other words, when the data interval of x and the data interval of y that are evaluated by the above-mentioned (K), (L), (M), and (N) are respectively [x'.L, x'.H] and [y'.L, y'.H], a final data interval of the operation result is decided as

[s.L,s H]=[min(x'.L,y'.L),max(x'.H,y'.H)].

Determination of a selection operation data interval when the conditional expression t is a large-small comparison operation between a variable w and a constant will be explained below using a concrete example. As a first example, s1=(w>127)?127:w;

a data interval [s1.L, s1.H] of the operation result in the expression above is considered. In this expression, a second term 127 is selected if w>127, and a third term w is selected if w<=127. Moreover, it is assumed that a conditional expression w>127 is not a constant value, so that w.L<=127 && w.H>127 is established. The conditional expression w>127 is expressed in a form of w>c using a constant value c, which corresponds to the above-mentioned (N). Accordingly, the data interval of w [w.L, w.H] is divided into [w.L, 127] and [128, w.H], the former and the latter are respectively applied to the third term w and the second term 127. As a result, a data interval of the second term 127 is [127, 127], and a data interval of the third term w is [w.L, 127]. Accordingly, a data interval of the operation result is decided by integrating these intervals, as

[s1.L,s1.H]=[min(w.L,127),127]=[w.L,127].

As a second example, s2=(w<0)?−w:w a data interval [s2.L, s2.H] of the operation result in the expression above is considered. In this expression, a second term −w is selected if w<0, and a third term w is selected if w>=0. Moreover, it is assumed that a conditional expression w<0 is not a constant value, so that w.L<0 && w.H>=0 is established. The conditional expression w<0 is expressed in a form of w<c using a constant value c, which corresponds to the above-mentioned (K). Accordingly, the data interval [w.L, w.H] of w is divided into [w.L, −1] and [0, w.H], the former and the latter are respectively applied to the second term −w and the third term w. As a result, a data interval of the second term −w is Range(−, [w.L, −1])=[1, −w.L], and a data interval of the third term w is [0, w.H]. Accordingly, a data interval of the operation result is decided by integrating these intervals, as $$[s2.L, s2.H] = [0, \max(-w.L, w.H)].$$

(3.2) In Case where Conditional Expression t is not Large-Small Comparison Operation Between Variable w and Constant In this case, data intervals of the respective selected terms x and y are simply integrated, thereby deciding a selection operation data interval. In other words, $$[s.L, s.H] = [\min(x.L, y.L), \max(x.H, y.H)];$$

is obtained.

In the foregoing, by (3.1) and (3.2), the data interval of the operation result in the selection operation is decided. Note that, although, in the present embodiment, when the conditional expression t is not a large-small comparison operation between a variable w and a constant, the data intervals of the selected terms are uniformly and simply integrated, in another embodiment of the present invention, a data interval of the operation result may be obtained more precisely by further analyzing a relation between a conditional expression and selected terms. Alternatively, in contrast to this, in still another embodiment, the present embodiment may be further simplified than the present embodiment by, for example, always and simply integrating data intervals of selected terms without considering the conditional expression.

As in the foregoing, with the processes explained in (1) to (3), the bit width determination unit 301 decides data intervals of intermediate data and output data of the operation circuit. The bit width of data is decided as the minimum bit width possible to represent any value within the data interval.

Note that, in another embodiment of the present invention, the data flow graph optimization unit 30 can be configured to include no bit width determination unit 301. In this case, the logic circuit generation device 1 decides the bit widths of intermediate data and output data of the operation circuit in accordance with the type of the data, or can use, when a bit width of data is designated in the software description of the program P inputted into the logic circuit generation device 1, the designated bit width without any change.

With the decision of a data interval of each set of data, the result of the comparison operation is apparently evaluated to a constant value in some cases. A comparison operation in which a result is a constant value is called a redundant comparison operation. The redundant comparison operation elimination unit 302 determines a redundant comparison operation based on the data interval of each set of data determined by the bit width determination unit 301, and replaces it with a constant value, to further perform optimization by the constant propagation.

For example, in a case where an interval of data x is [x.L, x.H]=[0, 63] and an interval of data y is [y.L, y.H]=[64, 200], an expression x<y is certainly evaluated to 1, so that the expression x<y is replaced with a constant value 1, in this case.

As another example, in a case where an interval of data x is [x.L, x.H]=[0, 63], an expression x<0 is certainly evaluated to 0, so that the expression x<0 is replaced with a constant value 0, in this case.

With reference to FIG. 21, processing of data interval determination by the bit width determination unit 301, and processing by the redundant comparison operation elimination unit 302 will be explained using a concrete example. Note that, for convenience of illustration and explanation, although a program in this example is expressed as a software description in the C language, a target to be processed by the bit width determination unit 301 and the redundant comparison operation elimination unit 302 is a data flow graph. In the explanation, it would be understood that the data flow graph corresponding to the software description is a target in the actual processing.

In this example, a function funcF includes clip processing for variables cc and dd (specifically, processing of clipping a value to 0 if being the value is negative), and processing for a variable r (specifically, processing of clipping a value to 255 if the value exceeds 255). A function top6 defines specific values of arrays c[3] and d[3].

Firstly, the bit width determination unit 301 sets, as an initial data interval, a data interval of each element (herein, expressed as xi for convenience) in an array x[3] at an entrance of the function top6, based on the type, as $$[xi.L, xi.H] = [0, 255].$$

A first expression of the function funcF, that is, $$c = x[0]*c[0] + x[1]*c[1] + x[2]*c[2];$$

includes multiple operations and is represented by subdivision, as $$tmp0 = x[0]*c[0];$$

$$tmp1 = x[1]*c[1];$$

$$tmp2 = x[2]*c[2];$$

$$tmp3 = tmp0 + tmp1;$$

$$cc = tmp3 + tmp2.$$

The bit width determination unit 301 determines, for these expressions, data interval of each set of data when the elements in the array c[3]={−1, 2, −1} are subjected to constant propagation, in accordance with the above-mentioned processing, as $$[tmp0.L, tmp0.H] = [-255, 0]$$

$$[tmp1.L, tmp1.H] = [0, 510]$$

$$[tmp2.L, tmp2.H] = [-255, 0]$$

$$[tmp3.L, tmp3.H] = [-255, 510]$$

$$[cc.L, cc.H] = [-510, 510].$$

Similarly, a second expression of the function funcF, that is, $$dd = x[0]*d[0] + x[1]*d[1] + x[2]*d[2];$$

is also represented by subdivision, as $$tmp4 = x[0]*d[0];$$

$$tmp5 = x[1]*d[1];$$

tmp6=*x*[2]**d*[2];

tmp7=tmp4+tmp5;

*dd*=tmp7+tmp6.

The bit width determination unit 301 determines a data interval of each set of data when the elements in the array d[3]={1, 2, 1} are subjected to constant propagation, as

[tmp4.*L*,tmp4.*H*]=[0,255]

[tmp5.*L*,tmp5.*H*]=[0,510]

[tmp6.*L*,tmp6.*H*]=[0,255]

[tmp7.*L*,tmp7.*H*]=[0,765]

[*dd.L,dd.H*]=[0,1020].

The data interval of the variable cc is [cc.L, cc.H]=[−510, 510] as described above, so that a conditional expression cc<0 in the selection operation of a third expression of the function funcF, that is,

*cc*_clip=(*cc*<0)?0:*cc;* is not a redundant comparison operation. Therefore, the bit width determination unit 301 determines the data interval of the operation result in the selection operation, in accordance with the above-mentioned processing (3.1) (K) by the bit width determination unit 301, as

[*cc*_clip.*L,cc*_clip.*H*]=[0,510].

Meanwhile, the data interval of the variable dd is [dd.L, dd.H]=[0, 1020] as described above, so that a conditional expression dd<0 in the selection operation of a fourth expression of the function funcF, that is,

*dd*_clip=(*dd*<0)?0:*dd;* is a redundant comparison operation that is certainly evaluated to 0. Accordingly, the redundant comparison operation elimination unit 302 simplifies this expression to

*dd*_clip=*dd.*

As a result, the bit width determination unit 301 determines the data interval of the operation result as

[*dd*_clip.*L,dd*_clip.*H*]=[*dd.L,dd.H*]=[0,1020].

Hereinafter, similarly, the bit width determination unit 301 determines the data interval of

*r*=(*cc*_clip+*dd*_clip)>>2;

as

[*r.L,r.H*]=[0,382], and determines the data interval of

*r*_clip=(*r*>255)?255:*r;* as

[*r*_clip.*L,r*_clip.*H*]=[0,255].

As in the foregoing, the data intervals of all the intermediate data and the output data in the function funcF are determined, and thus, the bit width is decided.

As was explained in the foregoing, the redundant comparison operation elimination unit 302 removes the redundant comparison operations to optimize the data flow graph. Note that, in another embodiment of the present invention, the data flow graph optimization unit 30 can be configured to include no redundant comparison operation elimination unit 302. In that case, the comparison operations in the data flow graph Fdfg is not optimized, so that the logic circuit generation device 1 eventually outputs a logic circuit more redundant than that in the present embodiment in some cases. However, the fact remains that the objective of the present invention is attained.

The operation decomposition unit 303 performs, as additional processing for optimizing the data flow graph Fdfg, processing of converting a complicated arithmetical operation into a simple arithmetical operation that is easy to logic-synthesize. Specifically, as will be explained next, (1) addition and shift decomposition of a constant multiplication, and (2) shift and trial subtract decomposition of division are performed.

(1) Constant Multiplication Decomposition

Out of operations included in the data flow graph Fdfg, as for a multiplication operation in which one of operation targets (in other words, a multiplicand or a multiplier) is a constant, the operation decomposition unit 303 replaces the multiplication with a series of operations in each of which the other operation target is shifted to a bit position of 1, and the series is added up. This processing is called constant multiplication decomposition. For example, an expression x*5 can be replaced with the sum of a value in which x is left-shifted by 2 bits because a multiplier 5 that is a constant can be represented in bit as 101, and x. This can be represented as an expression (x<<2)+x.

(2) Division Decomposition

The operation decomposition unit 303 decomposes the division by a so-called hand calculation method, into a shift and a trial subtraction. This processing is called division decomposition. The hand calculation in the binary number is similar to the general hand calculation in the decimal number. However, a bit value of a quotient obtained by the subtraction in each time is 0 or 1, and corresponding to the value, a value of the subtrahend is 0 or a value of the divisor. Therefore, in each time of the subtraction, if a minuend is a divisor or more, a bit value of the quotient is 1 and a value of the subtrahend is a value of the divisor, and if not, a bit of the quotient is 0 and a value of the subtrahend is 0. This processing including the comparison and the subtraction is known as a trial subtraction. Whether a minuend is a divisor or more may be determined based on a sign of a result from the subtraction by the divisor, which is actually performed.

Figures 22, 23A, 23B:
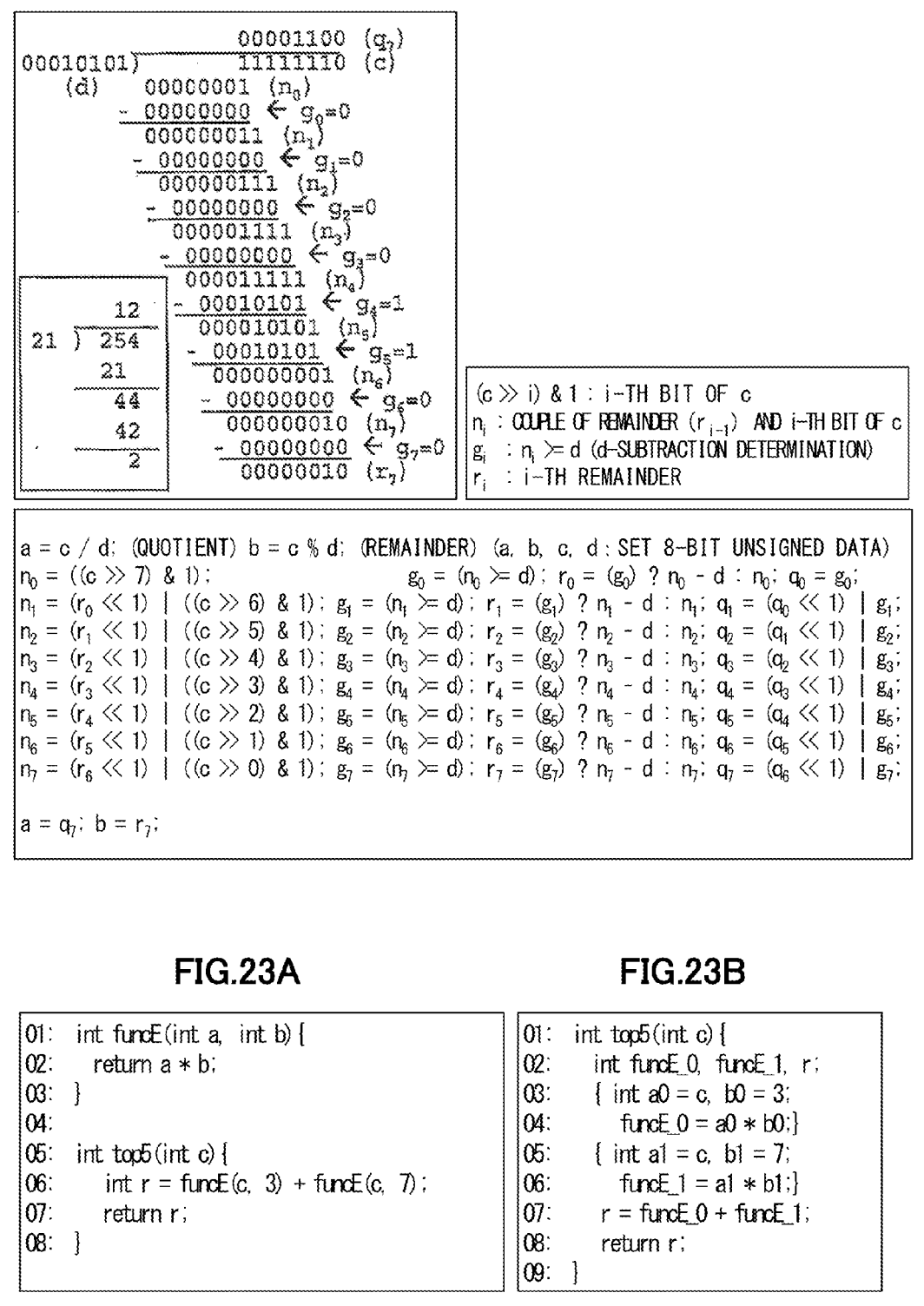

With reference to FIG. 22, decomposition of the operations of a=c/d and b=c % d in 8-bit unsigned data a, b, c, d will be explained. A hand calculation of obtaining a quotient 12 and a remainder 2 when 254 is divided by 21 is represented by a binary number and a decimal number, in an upper portion in the drawing, as a concrete example. In the hand calculation by binary number, for example, a value 000001111 of n3 is not a divisor 00010101 or more, so that a value of a corresponding quotient bit g3 is 0, and a subtrahend is also 0. Meanwhile, a value 000011111 of n4 is a divisor or more, a value of a corresponding quotient bit g4 is 1, and a subtrahend is 00010101. The steps of the hand calculation are represented as a series of expressions in the C language, in a lower portion in the drawing. In other words, generally, decomposition of the operations of a=c/d and b=c % d in 8-bit unsigned data a, b, c, d is decomposed into this series of expressions. More generally, the count of trial subtractions depends on the bit width of data c. However, the bit width of data c that is determined by the above-mentioned bit width determination unit 301 is used herein.

Note that, in another embodiment of the present invention, the operation decomposition unit 303 can be configured to perform, other than the above-mentioned (1) and (2), another optimization processing on operations, which is generally known in the field of software or processing devices. Moreover, in still another embodiment of the present invention, the data flow graph optimization unit 30 can be configured to include no operation decomposition unit 303. In that case, the above-mentioned optimization is not performed on the operations included in the data flow graph Fdfg, so that the logic circuit generation device 1 eventually outputs a logic circuit more redundant than that in the present embodiment in some cases. However, the fact remains that the objective of the present invention is attained.

The redundant operation elimination unit 304 performs, as additional processing for optimizing the data flow graph Fdfg, processing of constant propagation, common subexpression elimination, and dead code elimination. The constant propagation is processing of replacing an expression the operation result of which is a constant value with the constant value (in other words, the constant is propagated). Moreover, processing of replacing an expression that is simply expressed by a single variable with the variable is also performed. The common subexpression elimination is processing of bringing together multiple expressions that are apparently evaluated to the same value to one expression. The dead code elimination is processing of eliminating a variable that is not referred.

Figure 24A:
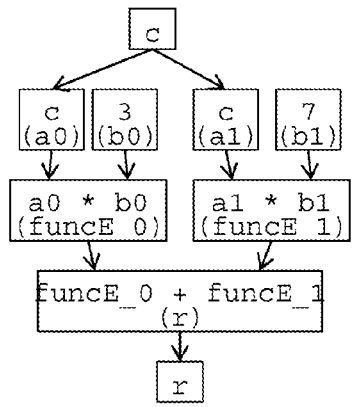
FIGS. 24A to 24F are diagrams illustrating a concrete example of processing of constant multiplication decomposition, constant propagation, and common subexpression elimination, in the logic circuit generation device and the method of the present invention.

With reference to FIGS. 23A and 23B and FIGS. 24A to 24F, the constant multiplication decomposition by the operation decomposition unit 303, and the constant propagation and the common subexpression elimination by the redundant operation elimination unit 304, will be explained using concrete examples. FIG. 23A illustrates a software description of the program P that includes a function top5 as a top-level function, and FIG. 23B illustrates the function top5 that is changed to a non-cyclical type lowermost function by being subjected to the inline expansion by the non-cyclical and non-hierarchical conversion unit 21. FIG. 24A is a data flow graph of the function top5 that is subjected to the inline expansion.

Figure 24B:
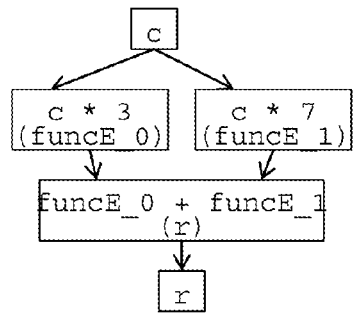
Figure 24C:
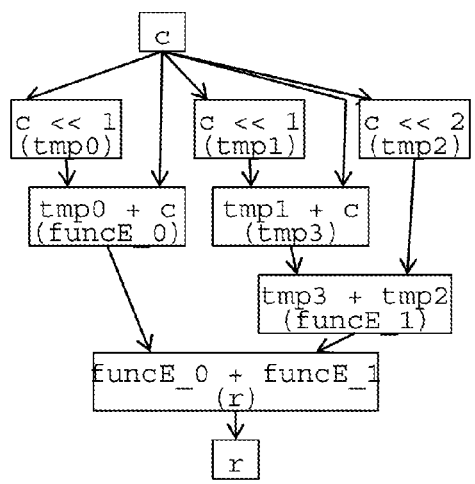
Figure 24D:
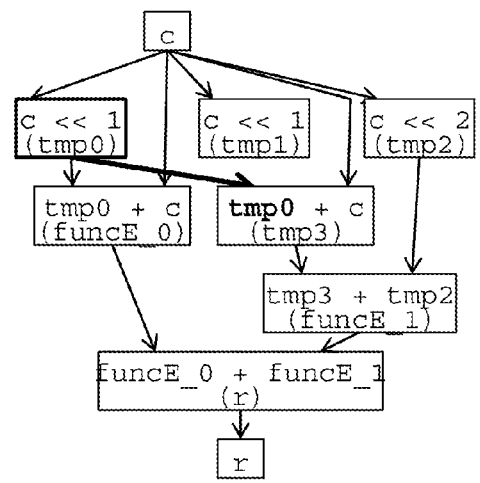
Figure 24E:
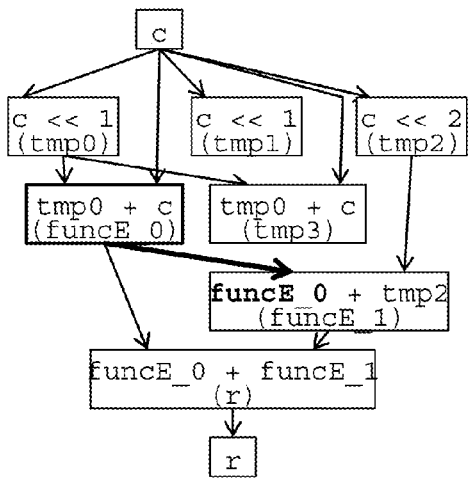
Figure 24F:
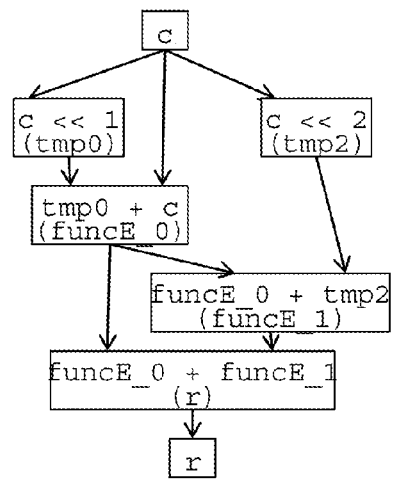

FIG. 24B is a data flow graph of a result in which the constant propagation is applied to that of FIG. 24A. Specifically, a variable b0 and a variable b1 are respectively replaced with a constant value 3 and a constant value 7. Moreover, variables a0 and a1 that are simply expressed as variables c are each replaced with the variable c. FIG. 24C is a data flow graph of a result in which the constant multiplication decomposition is applied to that of FIG. 24B. Specifically, an expression c*3 and an expression c*7 are respectively decomposed into an expression (c<<1)+c and an expression (c<<2)+(c<<1)+c. As for these expressions of the decomposition results, an intermediate variable (for example, tmp0) corresponding to the subexpression (for example, c<<1) is introduced, and the subexpression is represented as a node, thereby obtaining a data flow graph of FIG. 24C. FIG. 24D is a data flow graph of a result in which the common subexpression elimination is applied to that of FIG. 24C. Specifically, since both variables tmp0 and tmp1 are operation results of the expressions c<<1, a reference to the tmp1 is replaced with a reference to the tmp0, thereby bringing together the common expressions c<<1 to one. FIG. 24E is a data flow graph of a result in which the common subexpression elimination is further applied to that of FIG. 24D. FIG. 24F is a data flow graph of a result in which the dead code elimination is applied to that of FIG. 24E. Specifically, nodes of tmp1 and tmp3 that are not referred from other nodes are eliminated from the data flow graph.

As was explained in the foregoing, the redundant operation elimination unit 304 performs, as additional processing for optimizing the data flow graph Fdfg, the processing of constant propagation, common subexpression elimination, and dead code elimination. Note that, in another embodiment of the present invention, the data flow graph optimization unit 30 can be configured to include no redundant operation elimination unit 304.

[Calculator Circuit Delay and Circuit Scale Evaluation Unit 31]

The data flow graph Fdfg that is optimized by the data flow graph optimization unit 30 is then inputted into the computing element circuit delay and circuit scale evaluation unit 31. The computing element circuit delay and circuit scale evaluation unit 31 includes a computing element circuit delay evaluation unit 311 and a computing element circuit area evaluation unit 312. The computing element circuit delay and circuit scale evaluation unit 31 estimates, from input-output bit widths of each operation instruction decided by the above-mentioned the bit width determination unit 301 and the type of each operation, a circuit delay (in other words, signal propagation delay time) and a circuit area of a corresponding computing element. Estimating the circuit delay of the computing element makes it possible to estimate the operation speed (in other words, the maximum operation clock frequency) of a logic circuit that is eventually generated by the logic circuit generation device 1. Moreover, predicting a circuit area of the computing element with certain accuracy makes it possible to bring high-efficiency to tuning work of a software description of the program P that is inputted into the logic circuit generation device 1, in order to obtain a logic circuit of a reduced area or obtain a logic circuit of a higher-speed data operation. In the present embodiment, as is described later, the circuit delay of the computing element evaluated herein is also used in processing for maximizing the operation clock frequency of a logic circuit as a pipeline circuit.

Various approaches are possible for a calculation method of the circuit delay of the computing element. Examples of a method for calculating a circuit delay with high accuracy include a method of directly applying, to each computing element, a logic synthesis tool that is a tool of performing a circuit synthesis from the RTL description using a circuit library for a specific semiconductor process, a method of storing results from logic syntheses with some bit widths in advance, and predicting a circuit delay with the actual bit width from some logic synthesis results, and other methods. In the present embodiment, the computing element circuit delay and circuit scale evaluation unit 31 estimates the circuit delay and the circuit area of the computing element, based on a simple delay model and area model of the computing element, which will be explained below. These models make it possible to estimate the circuit delay and the circuit area with certain accuracy, without a support by an external tool such as a logic synthesis tool.

Figure 25:
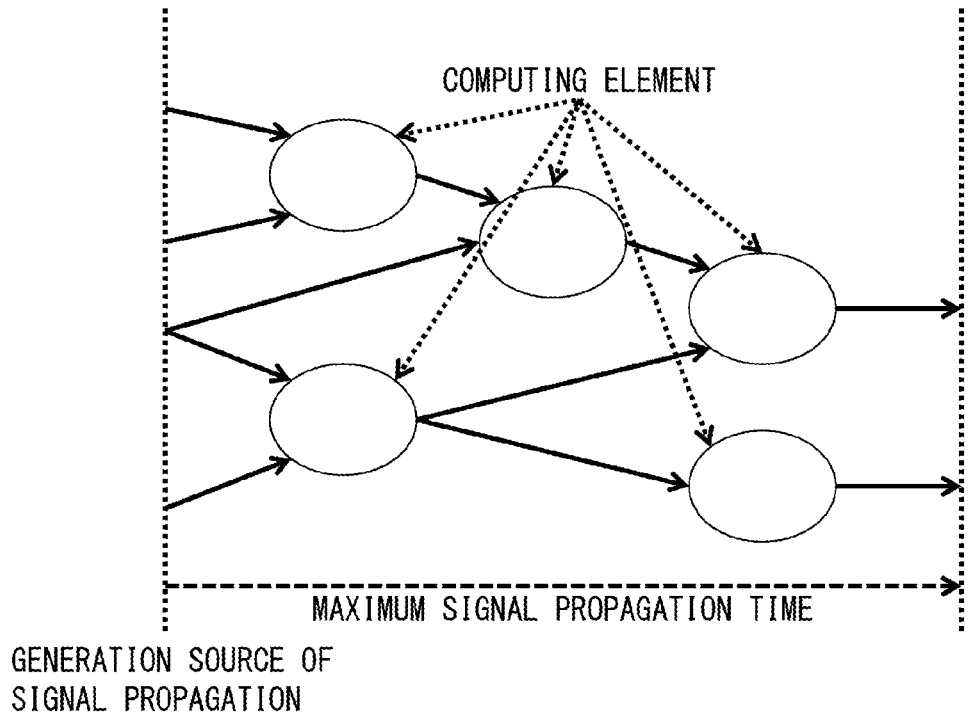
FIG. 25 is a diagram schematically illustrating a relation between a maximum signal propagation time of a logic circuit, and input and output signals of a computing element included in the logic circuit.

As illustrated in FIG. 25, in a logic circuit of a synchronous type, the maximum operation clock frequency of the logic circuit is decided based on the maximum signal propagation time for an output signal of the logic circuit. When each register output signal that changes at the moment of rising (in other words, transition from 0 to 1) of an input signal and clock of the overall logic circuit is set as a generation source of the signal propagation, the maximum signal propagation time is the maximum time in the time required for the signal propagation from signals of these generation source to other signals.

A delay factor for the signal propagation results from a circuit delay after an input signal is changed and before an output signal is changed, in respective logic gates that constitute a logic circuit. In the present embodiment, these circuit delays are modeled in units of computing elements. Similarly, the circuit area is also modeled in units of computing elements. A complicated computing element is hierarchically represented using a simpler computing element, and in correspondence with this, a delay model and an area model of the computing element is also hierarchically represented. This allows a delay model and an area model to correspond to all the computing elements that can be represented on the software description, thereby eliminating the necessity of depending on an external logic synthesis tool.

In a circuit delay model of the computing element, a propagation time of each signal is represented by only two of a most significant level bit (MSB) and a least significant level bit (LSB) of the signal. With this, the propagation time is calculated at a speed much faster than that when the propagation time is individually calculated with each bit of the signal. Moreover, a signal propagation time difference between the MSB and the LSB is represented, which corresponds to a carry propagation structure included in an arithmetical operation computing element (addition, subtraction, multiplication, or the like), and thus a circuit delay is calculated with high accuracy.

Figure 26:
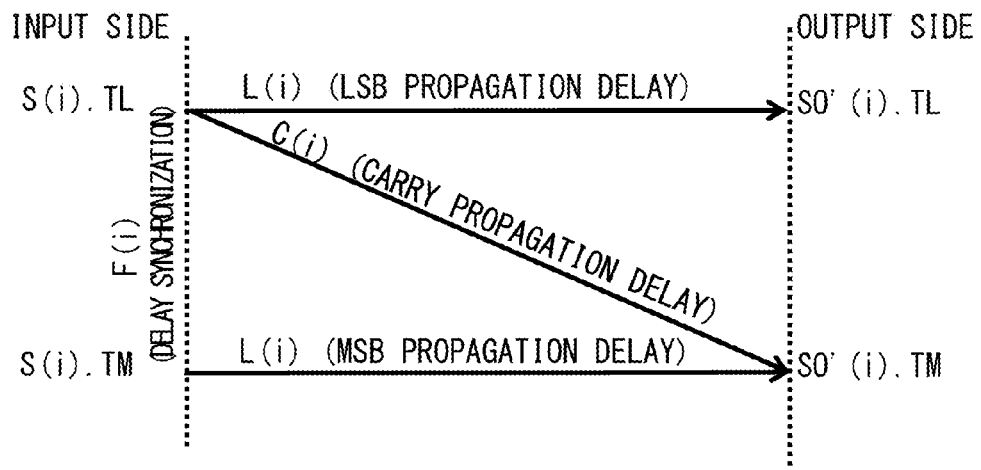
FIG. 26 is a diagram schematically illustrating a computing element circuit delay model in the logic circuit generation device and the method of the present invention.

In the following explanation, an LSB propagation time and an MSB propagation time, of a signal S are respectively expressed as S.TL, and S.TM. A propagation time of a signal (in other words, an input signal and a register output signal of the overall logic circuit) SI that is a generation source of the signal propagation is SI.TL=SI.TM=0. Moreover, as illustrated in FIG. 26, an input signal at a port i of a computing element is expressed as S (i), and an output signal having passed through the input port i is expressed as SO' (i). Accordingly, for example, an LSB propagation time at the input port i is expressed as S(i).TL. Herein, as further illustrated in FIG. 26, the following four expressions are introduced for representing a signal propagation delay between each input port and each output port of the computing element.

L(i) (simple propagation delay) indicates a propagation delay from the LSB at the input port i to the LSB at the output port (LSB propagation delay), or a propagation delay (MSB propagation delay) from the MSB at the input port i to the MSB at the output port. Herein, a simple model in which the LSB propagation delay and the MSB propagation delay are the same is assumed.

C(i) (carry propagation delay) indicates a signal propagation delay time from the LSB at the input port i to the MSB at the output port. This is mainly used for representing a carry delay of an adder. Examples of a computing element in which a carry propagation delay is considered (that is, C(i) is not 0) include an adder, a subtractor (including monotonic minus operation), a multiplier, and a large-small comparator.

F(i) (input delay synchronization flag) indicates whether respective signal propagation times of the LSB and the MSB of an input are synchronized (in other words, the propagation times are adjusted to the delayer propagation time), and a case where the signal is not synchronized is expressed as F(i)=0, and a case where the signal is synchronized is expressed as F(i)=1. Specifically, an output is fixed after all the bits of an input reach in an equivalence comparator and a logic negation unit, and thus F(i)=1 is set for all the input ports i. Moreover, an output is fixed after all the bits of an input at a second input port that designate the shift amount reach in a shift computing element, and thus F(2)=1 is set. Note that, in this model, as is described later, the LSB propagation time of one signal is not delayed from the MSB propagation time, so that when signals are synchronized, the LSB propagation time is adjusted to the MSB propagation time.

TL(i), although not illustrated, expresses an LSB propagation time of an input signal as a result of considering the synchronization of the signals that is selectively performed by F(i). In other words, if F(i)==0, synchronization of signals is not performed, and thus TL(i) is S(i).TL. In contrast, if F(i)==1, synchronization of signals is performed and the LSB propagation time is adjusted to the MSB propagation time, and thus TL(i) is S(i).TM. When this is represented by an expression, $$TL(i)=(F(i)==1)?S(i).TM:S(i).TL$$

is obtained.

As further illustrated in FIG. 26, an LSB propagation time SO'(i).TL of an output signal is obtained by adding a simple propagation delay L(i) of a computing element to the LSB propagation time TL(i) of an input signal in which the synchronization of signals is considered. When this is represented by an expression, $$SO'(i).TL=TL(i)+L(i)$$

is obtained.

Moreover, an MSB propagation time SO'(i).TM of an output signal is the larger one between an LSB propagation time TL(i) of an input signal to which the carry propagation delay C(i) of the computing element is added and an MSB propagation time TM(i) of an input signal to which the simple propagation delay L(i) of the computing element is added. When this is represented by an expression, $$SO'(i).TM=\max(S(i).TM+L(i),TL(i)+C(i))$$

is obtained.

From these expressions, it is understood that if the LSB propagation time of an input signal at the port of each of the computing elements is not delayed from the MSB propagation time, the LSB propagation time of an output signal is not delayed from the MSB propagation time. Therefore, in the entire logic circuit, the LSB propagation time of one signal is not delayed from the MSB propagation time.

Figure 27:
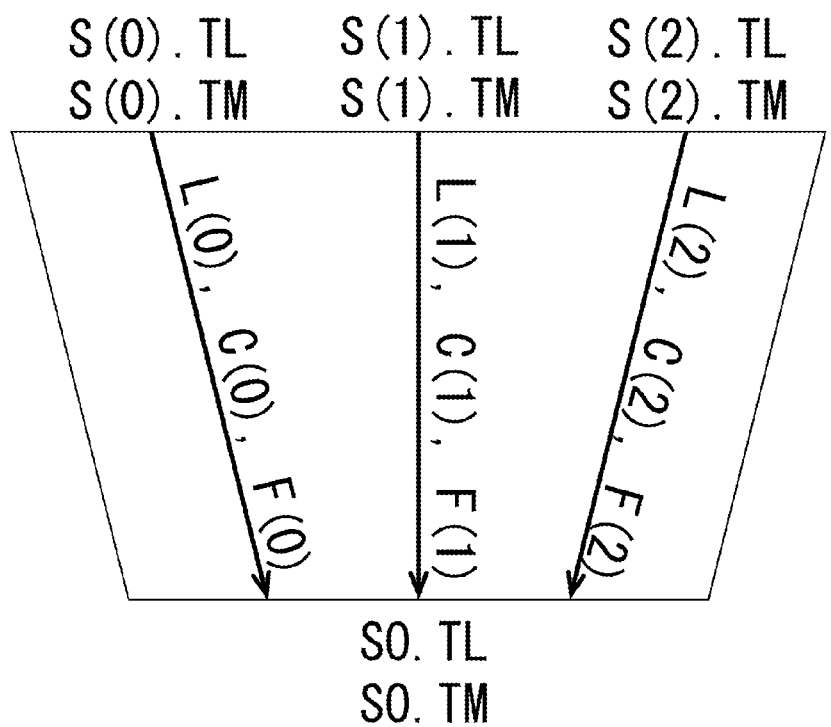
FIG. 27 is a diagram schematically illustrating a relation between a propagation time of each input signal of the computing element, a propagation delay of the computing element, and a propagation time of an output signal, in the computing element circuit delay model in the logic circuit generation device and the method of the present invention.

As illustrated in FIG. 27, an MSB propagation time SO.TM for an output signal SO of a final computing element is obtained as the fastest one, for all the input ports i of the computing element, out of the MSB propagation times SO' (i).TM for output signals having passed through the input ports i. An LSB propagation time SO.TL is similarly obtained as the latest one, for all the input ports i of the computing element, out of the LSB propagation times SO' (i).TL for output signals having passed through the input ports i. Note that, when the width of an output signal of the computing element is 1 bit, the LSB and the MSB are the same bit, so that the value obtained as the MSB propagation time SO.TM is employed also as the LSB propagation time SO.TL.

Herein, B (output delay synchronization flag) of the computing element expresses whether the width of an output signal is 1 bit, and B=1 in the case of a 1-bit output and B=0 are obtained in the cases. With the use of this, the MSB propagation time SO.TM and the LSB propagation time SO.TL for the output signal SO of the final computing element are represented as expressions $SO.TM=\max\{SO'(i).TM|i \in I\}$ $SO.TL=(B==1)?SO.TM:\max\{SO'(i).TL|i \in I\}$ are obtained. In these expressions, I expresses a set of all the input ports i of the computing element.

Figure 28:
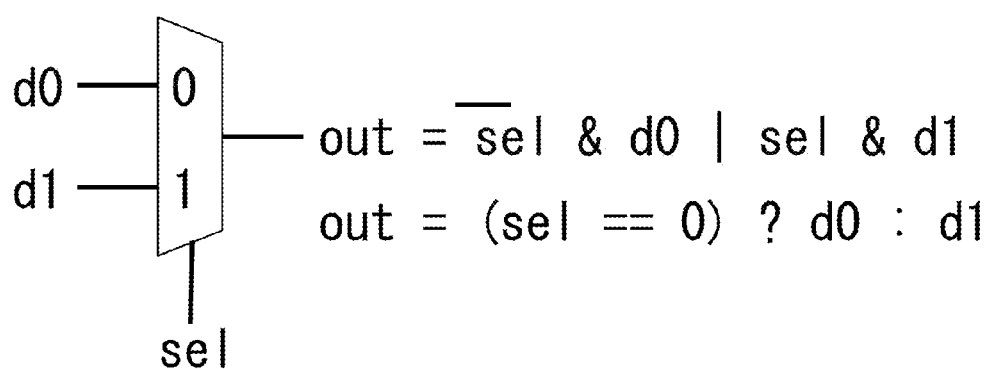
FIG. 28 is a diagram illustrating a relation between an input signal and an output signal of a 2-input 1-output multiplexer.

A circuit delay model and an area model of the computing element explained in the foregoing will be explained more specifically below for each type of the computing element. For the explanation, firstly, the circuit delay and the circuit area of a basic logic gate are appropriately modeled by being corresponding to the assumed implementation technique (semiconductor process, FPGA: Field Programmable Gate Array). The basic gate as a modeling target herein is a logical product (AND), a logical addition (OR), a logical negation (NOT), an exclusive logical addition (XOR), and a 2-input 1-output multiplexer (MUX). FIG. 28 illustrates a circuit diagram and an operation of the 2-input 1-output multiplexer. Other than these basic gates, another basic gate, for example, NAND or NOR, may be added. A circuit delay model and a circuit area model of each of these basic logic gates G are respectively expressed as G.delay and G.area (for example, a circuit delay of the logical product gate is expressed as AND.delay).

Next, a model of a complex gate in which basic logic gates are combined will be explained. As representative complex gates, a 1-bit full adder (FA), a 1-bit half-adder (HA), and a Booth recoder (BR) are considered. Note that, in the explanation, the circuit delay and the circuit area are calculated by assuming the circuit structures, but may be precisely calculated from the circuit library to be used.

The 1-bit full adder (FA) inputs 3 bits of a, b, and c, and outputs each bit of sum and carry. A relation between the input and the output is represented as, sum=a^b^c;

carry=(a&b)|(b&c)|(a&c).

Assuming a circuit structure in which operations of these expressions are directly implemented, an output delay FA.s_delay of the sum, an output delay FA.c_delay of the carry, and a circuit area FA.area are represented as follows.

FA.s_delay=2*XOR.delay;

FA.c_delay=AND.delay+OR.delay; (carry propagation delay)

FA.c_area=3*AND.area+2*OR.area; (carry output circuit area)

FA.area=2*XOR.area+FA.c_area;

The 1-bit half-adder (HA) inputs 2 bits of a and b, and outputs each bit of sum and carry. A relation between the input and the output is represented as, sum=a^b;

carry=a&b.

Assuming a circuit structure in which operations of these expressions are directly implemented, an output delay HA.s_delay of the sum, an output delay HA.c_delay of the carry, and a circuit area HA.area are represented as follows.

HA.s_delay=XOR.delay;

HA.c_delay=AND.delay; (carry propagation delay)

HA.c_area=AND.area; (carry output circuit area)

Figure 29:
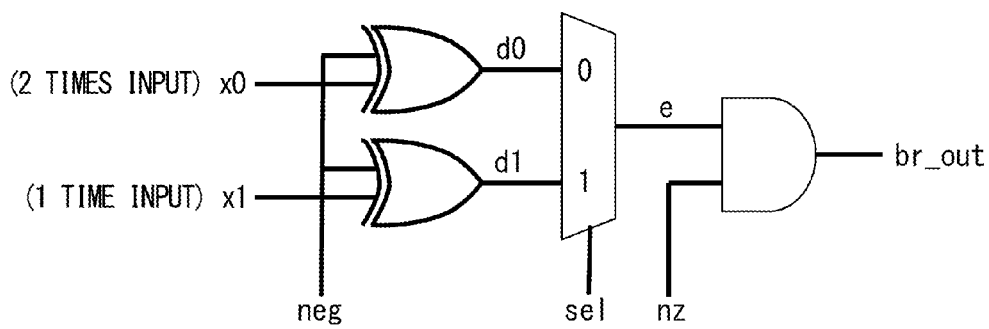
FIG. 29 is a diagram illustrating a circuit diagram of a Booth recoder, a decision method of an input signal, and a relation between the input signal and an output signal, which are assumed in one embodiment in the logic circuit generation device and the method of the present invention.

HA.area=XOR.area+HA.c_area;

The Booth recoder (BR) is used in the multiplier, and is a circuit that decodes continuous 3 bits at an input port 1, and outputs data by 2 times, 1 time, 0 times, −1 times, and −2 times of data at an input port 0. As illustrated in FIG. 29, assumed is a circuit structure in which −1 times and −2 times values are made in two XOR gates for 2-bit input (x0, x1) consisting of 1 time and 2 times of the input port 0, these are selected with a 2-input 1-output multiplexer, and implemented in an AND gate that makes 0 times, thereby obtaining output each bit. Signals sel, neg and nz in the drawing are respectively represented as $sel=y_i \char`\^ y_{i-1}$;

$neg=y_{i+1}$;

$nz=(y_{i+1} \& y_i \& y_{i-1}) \& (y_{i+1}|y_i|y_{i-1})$.

In direct accordance with these expressions, the circuit structure of a decoder circuit that outputs these signals is assumed. An output delay BR.delay and a circuit area BR.area are represented as follows. Herein, bw_0 expresses the bit width of the input port 0.

BR.delay=XOR.delay+MUX.delay+AND.delay;

BR.dec_area=XOR.area+AND.area*3+OR.area*2+NOT.area; (area of decoder circuit)

BR.area(bw_0)=(XOR.area*2+MUX.area+AND.area)*bw_0+BR.dec_area;

Processing of estimating a circuit delay model and a circuit area model of each computing element will be explained below utilizing the models of the basic logic gate and the complex gate explained in the foregoing. Note that, in the explanation, the circuit delay and the circuit area are estimated by assuming the circuit structures, but different results may be obtained if another circuit structures are assumed in some cases.

In the explanation, a circuit area of a computing element X is expressed as X.AREA.

Moreover, parameters related to input and output signals are expressed as follows.

bw_in(i) expresses the bit width of an input signal at an input port i.

bw expresses the bit width of an output signal.

bw_max expresses a maximum value of the bit width of input signals for all the input ports.

bw_min expresses a minimum value of the bit width of input signals for all the input ports.

bw_dif expresses a difference between the maximum value and the minimum value of the bit width of the input signals.

When these relations are represented by expressions, $bw\_max=\max\{bw\_in(i)|i \in I\}$ $bw\_min=\min\{bw\_in(i)|i \in I\}$ $bw\_dif=bw\_max-bw\_min$ are obtained. In these expressions, I expresses a set of all the input ports i of the computing element.

The adder (ADD) is assumed to be a circuit structure in which, out of the outputs, bw_min bit is implemented by the full adder (FA), and the remaining bw_dif bit is implemented by the half-adder (HA). The circuit delay and the circuit area of the adder in this circuit structure are as follows. In the expression, i expressing an input port is 0 or 1.

ADD.$L(i)$=FA.$s$_delay(for one piece sum output delay of FA)

ADD.$C(i)$=FA.$c$_delay*$bw$_min+HA.$c$_delay*$bw$_dif (for $bw$_min pieces of carry output delay of FA and $bw$_dif pieces of carry output delay of HA)

ADD.$F(i)$=0

ADD.AREA=FA.area*$bw$_min+HA.area*$bw$_dif

The subtractor (SUB) is assumed to be a circuit structure in which a NOT gate is added before the adder input port 1. The circuit delay and the circuit area of the subtractor in this circuit structure are as follows. In the expression, i expressing an input port is 0 or 1.

SUB.$L(i)$=FA.$s$_delay+NOT.delay

SUB.$C(i)$=FA.$c$_delay*$bw$_min+HA.$c$_delay*$bw$_dif+NOT.delay

SUB.$F(i)$=0

SUB.AREA=FA.area*$bw$_min+HA.area*$bw$_dif+NOT.area*$bw$_in(1)

As for a multiplier (MUL), assumed herein is a circuit structure in which ceil($bw$_1/2) pieces of outputs of a Booth recoder are added. The circuit delay and the circuit area of the multiplier in this circuit structure are as follows. In the expression, i expressing an input port is 0 or 1.

booth_count=ceil($bw$_in(1)/2)(the number of Booth recoders)

MUL.$L(i)$=BR.delay+booth_count*FA.$s$_delay(for 1 piece output delay of Booth recoder and for booth_count pieces of sum output delay of FA)

MUL.$C(i)$=MUL.$L(i)$+$bw$_in(0)*FA.$c$_delay(output delay of multiplier and for $bw$_in(0)bits of FA carry propagation delays)

MUL.$F(i)$=0

MUL.AREA=booth_count*BR.area($bw$_in(0))+booth_count*($bw$_in(0)+1)*FA.area(total of circuit areas of Booth recoder of bit width $bw$_in(0) and full adder for output addition)

A selection computing element (SEL) outputs, based on a 1-bit selection input, one out of two selected inputs. Herein, assumed is a circuit structure in which a multiplexer of a bit-width number of an output signal. The circuit delay and the circuit area of the selection computing element in this circuit structure are as follows. In the expression, i expressing an input port is 0 or 1.

SEL.$L(i)$=MUX.delay

SEL.$C(i)$=0

SEL.$F(i)$=0

SEL.AREA=MUX.area*$bw$

Note that, when the bit widths of two input ports are different, the circuit delay and the circuit area can be more precisely calculated using $bw$_min and $bw$_dif.

For a large-small comparator (CMP), assumed is a circuit in which subtractions of two input ports are performed, and a result calculated from a sign bit of an operation result is outputted. Output of a subtraction result is not necessary, which results in a smaller circuit area than that of the subtractor. Moreover, an output bit width is 1, so that an output delay synchronization flag (B) becomes 1. The circuit delay and the circuit area of the large-small comparator in this circuit structure are as follows. In the expression, i expressing an input port is 0 or 1.

CMP.$L(i)$=FA.$c$_delay

CMP.$C(i)$=FA.$c$_delay*$bw$_min+HA.$c$_delay*$bw$_dif+NOT.delay

CMP.$F(i)$=0

CMP.AREA=FA.$c$_area*$bw$_min+HA.$c$_area*$bw$_dif+NOT.area*$bw$_in(1)

Figure 30:
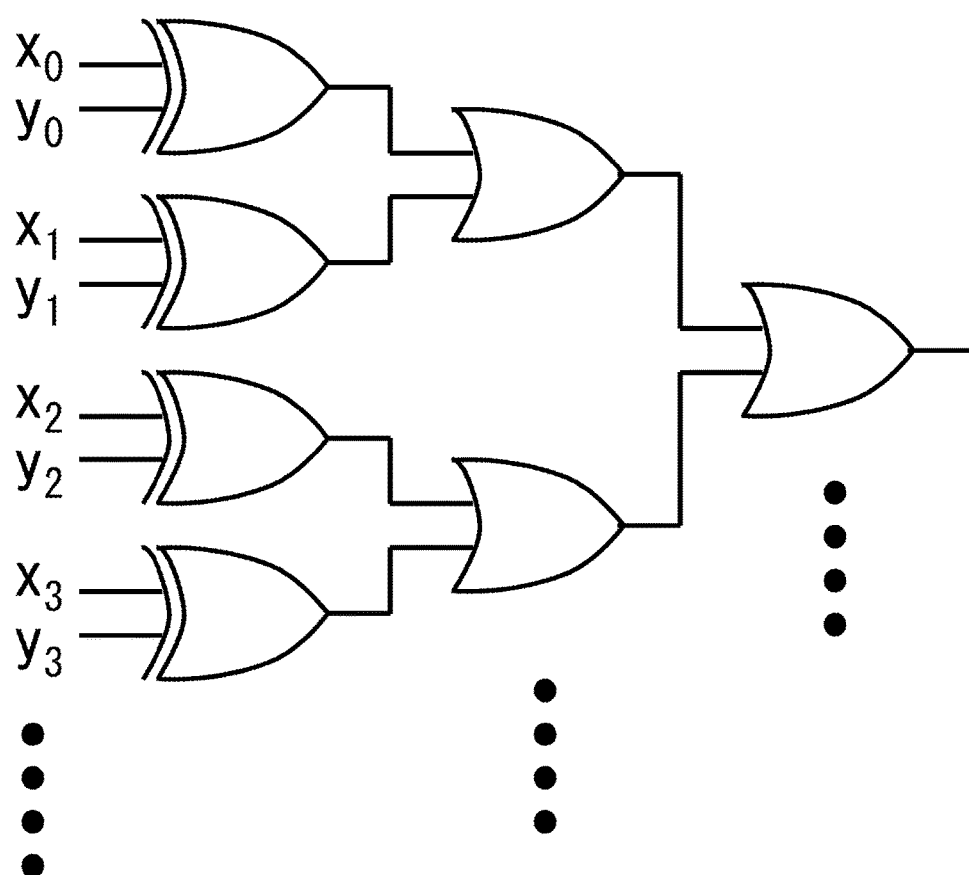
FIG. 30 is a circuit diagram illustrating an equivalence comparison negator, which is assumed in one embodiment in the logic circuit generation device and the method of the present invention.

An equivalence comparison negator (NEQ) outputs 0 if all the bits of two input ports are equal, and outputs 1 if not. Assumed is a circuit structure, as illustrated in FIG. 30, in which XOR operation outputs for every 2-input bit are joined with OR using a binary-tree structure. Moreover, an output bit width is 1, so that an output delay synchronization flag (B) becomes 1. However, due to the delayed synchronization on the input port side, the LSB propagation time and the MSB propagation time of an output port signal becomes automatically the same. The circuit delay and the circuit area of the equivalence comparison negator in this circuit structure are as follows. In the expression, i expressing an input port is 0 or 1.

NEQ.$L(i)$=XOR.delay+ceil($\log_2(bw)$)*OR.delay

NEQ.$C(i)$=0

NEQ.$F(i)$=1 (input delay synchronization)

NEQ.AREA=$bw$*XOR.area+($bw$-1)*OR.area

Figures 31, 32:
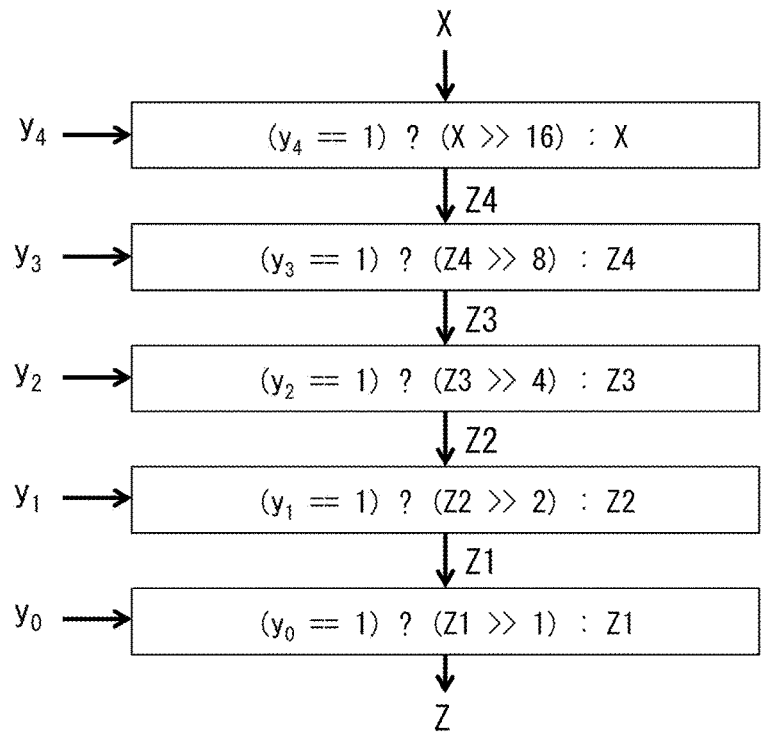
FIG. 31 is a diagram illustrating a circuit diagram of a shift computing element, and a relation between an input signal and an output signal, which are assumed in one embodiment in the logic circuit generation device and the method of the present invention.
FIG. 32 is a diagram illustrating a concrete example of a software description of a program including a before-assignment reference instruction and an after-assignment reference instruction, of a register variable.

A shift computing element (SHF) outputs, with a value designated at the port 1 as the shift amount, a right shift or a left shift of data at the port 0. A barrel shifter is assumed as a circuit structure. The barrel shifter is configured to serially connect circuits that shift by power of 2 bits in the binary expression of the shift amount at the port 1. For example, Z=X>>Y (X, Y, Z: unsigned 32 bits) has a circuit structure as illustrated in FIG. 31. Herein, only lower 5 bits of Y indicate the shift amount. The circuit delay and the circuit area of the shift computing element in this circuit structure are as follows. In the expression, i expressing an input port is 0 or 1.

$bw$_1'=min($bw$_in(1),ceil($\log_2(bw$_in(0))))(calculated by assuming that the maximum bit width of the port 1 is $\log_2(bw$_in(0))bits)

SHF.$L(i)$=$bw$_1'*MUX.delay

SHF.$C(i)$=0

SHF.$F(0)$=0,SHF.$F(1)$=1 (delay synchronization of input port 1)

SHF.AREA=$bw$_in(0)*$bw$_1'*MUX.area

The logic circuit generation device 1 can output estimations of the circuit delay and the circuit scale calculated by the computing element circuit delay and circuit scale evaluation unit 31, for example, to the output device 17. Moreover, in another embodiment, the logic circuit generation device 1 can be configured to include no computing element circuit delay and circuit scale evaluation unit 31. In this case, the logic circuit generation device 1 does not calculate estimations of the circuit delay and the circuit scale. However, the estimations are not information that directly constitutes a logic circuit to be generated, so that the fact remains that the objective of the present invention is attained.

[Pipeline Boundary Arrangement Unit 32]

The data flow graph Fdfg in which the circuit delay and the circuit scale of the computing element are evaluated by the computing element circuit delay and circuit scale evaluation unit 31 is then inputted into the pipeline boundary arrangement unit 32. The pipeline boundary arrangement unit 32 synthesizes a pipeline circuit from the data flow graph Fdfg, and outputs the pipeline circuit data Fplc. The pipeline circuit has such a structure that the operation processing that is repeatedly executed is divided into pipeline stages serving as processing units, and circuit blocks that execute these processing units are serially connected. In the present description, the pipeline stage is also called "pipe stage".

The program that is converted into the data flow graph corresponds to the circuit structure of the logic circuit without any change. In other words, the operation instruction on the data flow graph corresponds to the computing element on the circuit, and the directed edge on the data flow graph corresponds to the wiring (or signal) on the circuit. Accordingly, synthesizing the pipeline circuit is equivalent to dividing the data flow graph into pipe stages, in other words, performing pipe stage allocation to each instruction node of the data flow graph. A register inserted into a data flow directed edge that intersects a pipeline boundary between adjacent two pipe stages allows a value inputted into the register to be referred after a delay time of one clock in a register output.

Therefore, the pipeline boundary arrangement unit 32 firstly performs processing of extracting a constraint when the data flow graph Fdfg is divided into pipeline structures, and then performs processing of allocating pipe stages to respective instruction nodes of the data flow graph Fdfg. More specifically, the pipeline boundary arrangement unit 32 includes a pipeline constraint extraction unit 321, a number of pipeline stages decision unit 322, a pipeline circuit synthesis unit 323.

The pipeline constraint extraction unit 321 performs processing of extracting a constraint when the data flow graph Fdfg is divided into pipe stages, as a preparation for processing in the pipeline circuit synthesis unit 323, which is described later.

The register attribute designates a register in which a delay time of one clock is generated between an assignment (write) to a variable and a reference (read) to the variable to store a value of the variable. A delay time of one clock is similarly generated also for a read timing an array variable having the memory attribute, in the case of a memory of a normally used synchronous type. When pipeline circuit structures are synthesized, a reference possible timing of each variable needs to be accurately evaluated. A variable representing a state variable of a sequential circuit needs to hold a value before and after the clock, and thus needs to have the register attribute. In the present embodiment, in the program P inputted into the logic circuit generation device 1, it is essential for the register attribute to be explicitly indicated for a variable representing a state variable of a sequential circuit, and if the register attribute description is omitted, the circuit synthesis is disabled. In another embodiment, even if the register attribute description of a variable representing a state variable of a sequential circuit is omitted, the register attribute can be automatically added. In both of the embodiments, the register attribute is added to the state variable of the sequential circuit in the stage subsequent to this processing.

A reference instruction to a register variable with one clock delay is classified into the following two instructions. One instruction is an after-assignment reference instruction. This is a reference instruction to the variable after the assignment instruction is executed. The other instruction is a before-assignment reference instruction. This is a reference instruction to the variable before the assignment instruction is executed.

The pipeline constraint extraction unit 321 allocates firstly these reference instructions to pipe stages. In this process, the after-assignment reference instruction is allocated in a pipe stage rearward by one from a pipe stage in which an assignment instruction is included. In other words, a pipeline boundary is sandwiched between the assignment instruction and the after-assignment reference instruction. This delays a reference timing of a register variable in the after-assignment reference instruction by one clock from an assignment timing, and data that is assigned to a variable by the assignment instruction is read. Meanwhile, the before-assignment reference instruction is allocated to the same pipe stage as the assignment instruction. With this, the before-assignment reference instruction reads data before the assignment instruction execution.

Figure 33:
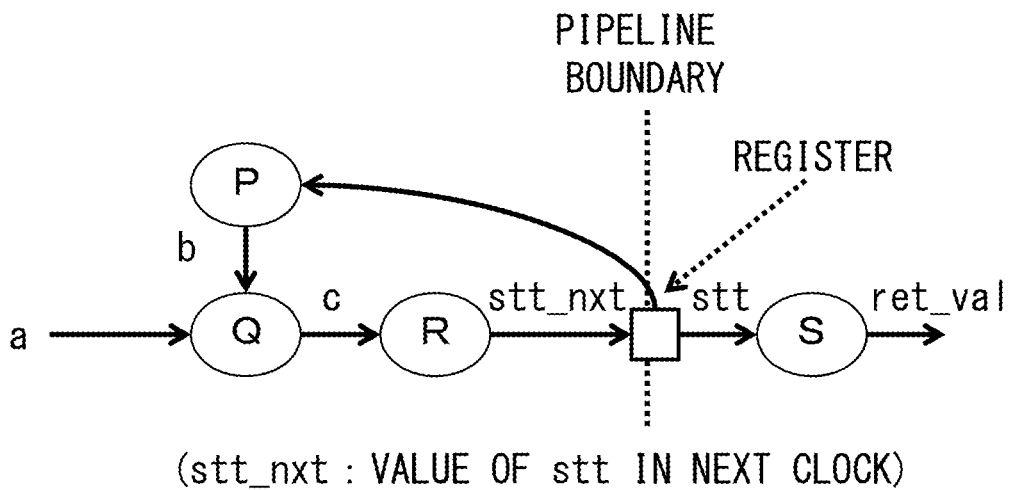
FIG. 33 is a diagram illustrating a data flow graph that represents a pipeline circuit generated from the program of FIG. 32.

With reference to FIG. 32 and FIG. 33, processing of allocating a reference instruction to a pipe stage will be explained using a concrete example. FIG. 32 illustrates an example of a program including a before-assignment reference instruction P and an after-assignment reference instruction S, of a register variable. FIG. 33 illustrates a pipeline arrangement in a pipeline circuit that is generated from the program of FIG. 32. In this example, the pipeline constraint extraction unit 321 allocates, a before-assignment reference instruction (P), an assignment instruction (R) to a variable stt, and an instruction (Q) present on a (P)→(R) path of the data flow graph Fdfg, to the same pipe stage.

Next, the pipeline constraint extraction unit 321 performs processing of grouping a register variable update instruction node group. As described above, a before-assignment reference instruction to a register variable is allocated to the same pipe stage as an assignment instruction, thereby reading data before the assignment instruction is executed, that is, data one clock before. However, the before-assignment instruction cannot be allocated to a pipe stage forward from the same pipe stage. This is because if a before-assignment reference instruction is allocated to a pipe stage forward from the pipe stage of the assignment instruction, reference data to be read is assignment data before 2 clocks or more, which fails to implement a circuit with an operation that the program intends (in other words, operation that refers to assignment data before one clock). Moreover, all the instructions present on a data flow graph path from the before-assignment reference instructions to an assignment instruction (which corresponds to a path of (P)→(Q)→(R) in FIG. 33) also need to be allocated to the same pipe stage. Therefore, the pipeline constraint extraction unit 321 converts the data flow graph Fdfg into a structure in which these instructions are ensured to be allocated to the same pipe stage, by processing which is explained next.

All the instruction node groups on a data flow graph path from a before-assignment reference instruction node to a register variable to an assignment instruction node to the same variable is called a register variable update instruction node group. Further, as for a before-assignment reference instruction node in which a data flow graph path to the assignment instruction node is not present, only this before-assignment reference instruction node is included in the register variable update instruction node group. The pipeline constraint extraction unit 321 performs data flow graph conversion processing of replacing a register variable update instruction node group with a register variable update degenerate instruction node that is degenerated to one instruction node. More specifically, all directed edges that connect together instruction nodes included in the register variable update instruction node group are removed. Further, a directed edge that connects the instruction node included in the register variable update instruction node group to an external instruction node is reconnected to a register variable update degenerate instruction node. Note that, this data flow graph conversion processing removes all the data flow graph directed edges in the reverse direction that connect the assignment instruction to the before-assignment reference instruction (in other words, a directed edge that forms a loop).

Figure 34:
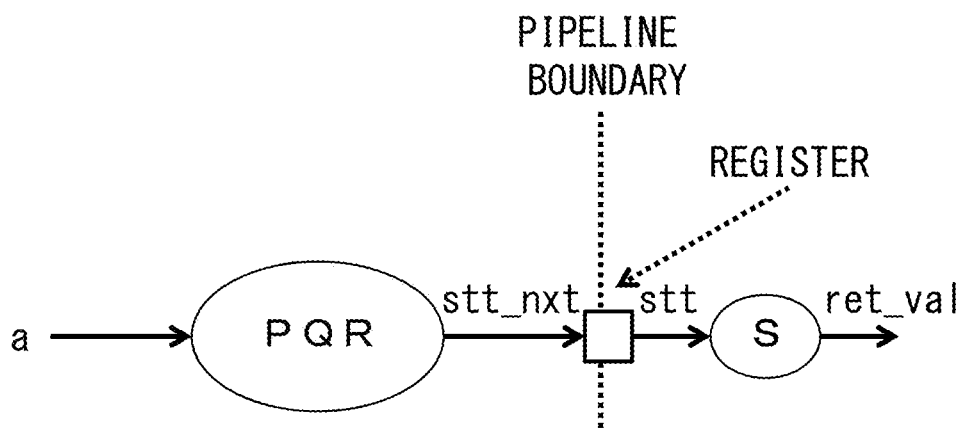
FIG. 34 is a diagram illustrating a data flow graph as a result in which register variable update instruction node group grouping processing is performed on the data flow graph of FIG. 33.

FIG. 34 illustrates the data flow graph Fdfg as a result of performing register variable update instruction node group grouping processing on the data flow graph Fdfg of FIG. 33. In FIG. 33, all the instruction node groups (P), (Q), and (R) on the data flow graph path from the before-assignment reference instruction node (P) to a register variable stt to the assignment instruction node (R) to the same variable are set as one register variable update instruction node group. The pipeline constraint extraction unit 321 replaces this register variable update instruction node group with a register variable update degenerate instruction node illustrated as (P) (Q) (R) in FIG. 34.

Next, the pipeline constraint extraction unit 321 performs processing of adding a pipeline boundary attribute to the data flow graph directed edge. A pipeline boundary needs to be present between the assignment instruction (R) to a register variable and the after-assignment reference instruction (S) to the same variable for implementing a register output delay time of one clock. Therefore, the pipeline constraint extraction unit 321 performs pipe stage allocation in which the pipeline boundary attribute is added to a data flow graph directed edge that connects these instructions, and this directed edge intersects the pipeline boundary.

Moreover, a reference instruction to a memory array variable is subdivided into an assignment instruction to a read address variable, and an array reference instruction using the read address variable as an array index, in the afore-mentioned register/memory array access instruction decomposition unit 25. Herein, as described in the foregoing, for implementing a data read delay time of one clock in the synchronous type memory, a pipeline boundary needs to be present also between these two instructions. Therefore, the pipeline constraint extraction unit 321 performs pipe stage allocation in which the pipeline boundary attribute is added to a data flow graph directed edge that connects these instructions and corresponds to the read address variable, and this directed edge intersects the pipeline boundary.

Figure 35:
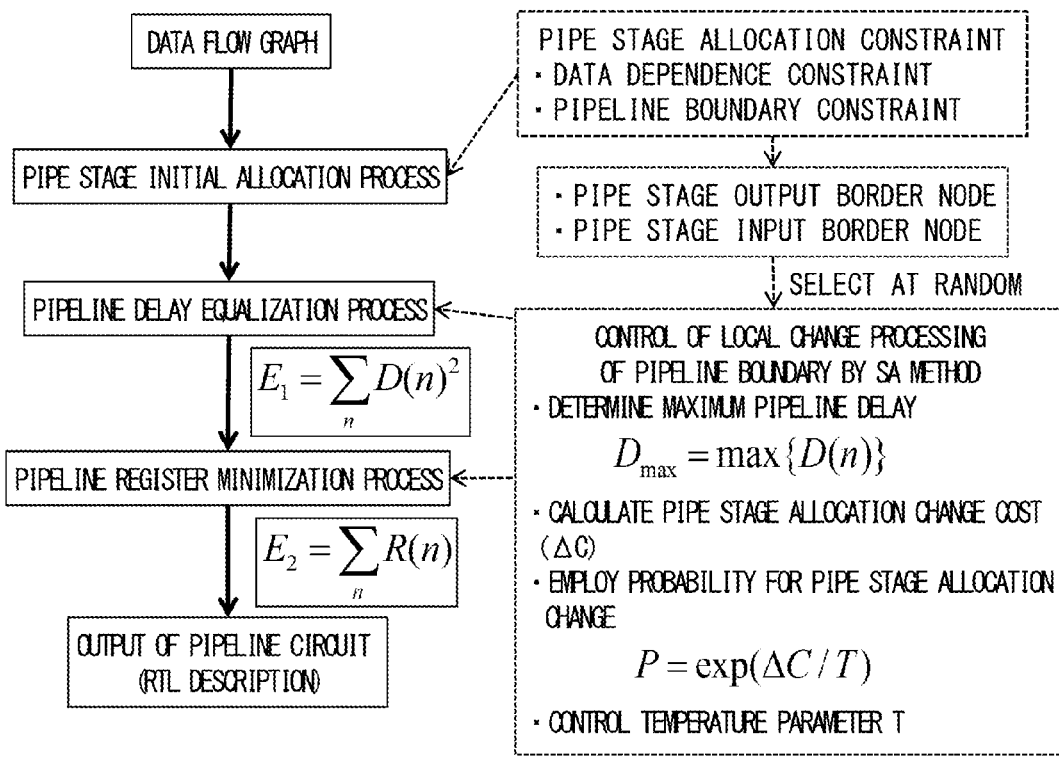
FIG. 35 is a flowchart illustrating a flow of pipeline circuit synthesis processing, in the logic circuit generation device and the method of the present invention.

As described above, synthesizing a pipeline circuit equivalent to performing pipe stage allocation to each instruction node of the data flow graph. The pipeline circuit synthesis unit 323 performs pipe stage initial allocation that satisfies a pipe stage allocation constraint, which is explained next, and thereafter, performs a pipeline delay equalization process of equalizing signal propagation times (hereinafter, is also called "pipeline delay") of the stages, while changing the pipe stage allocation to each instruction node of the data flow graph Fdfg, and a pipeline register-number minimization process of minimizing the number of registers that are arranged in the pipeline boundary, thereby synthesizing a clock synchronous type pipeline circuit data Fplc from the data flow graph Fdfg. FIG. 35 illustrates a flow of these processes in the pipeline circuit synthesis unit 323. Hereinafter, these processes will be explained more specifically. Note that, in the explanation hereinafter, a pipe stage at a start point node of a data flow graph directed edge is called a "start point pipe stage" of the directed edge, and a pipe stage at an end point node thereof is called an "endpoint pipe stage" of the directed edge.

A pipe stage allocation constraint to each instruction node of the data flow graph Fdfg includes a data dependence constraint and a pipeline boundary constraint, which are explained next.

The data flow graph directed edge expresses a data dependence between the start point node (assignment instruction node to a variable) and the end point node (reference instruction node to the variable). Herein, a start point pipe stage of the directed edge needs to be allocated to the same as an end point pipe stage thereof, or the start point pipe stage needs to be allocated so as to be a pipe stage forward of the endpoint pipe stage. This constraint is referred to as a data dependence constraint.

A data flow graph directed edge to which the pipeline boundary attribute is added is called a pipeline boundary edge. As for the pipeline boundary edge, the start point pipe stage needs to be allocated so as to be a pipe stage forward of the end point pipe stage, and cannot be allocated to the same pipe stage. This is referred to as a pipeline boundary constraint.

Moreover, out of the pipeline boundary edges, when the start point pipe stage and the end point pipe stage are adjacent to each other (in other words, a pipe stage rearward by one from the start point pipe stage is the end point pipe stage), this directed edge is called a critical pipeline boundary edge. This is not a pipe stage allocation constraint itself, but is an attribute for determining whether a pipeline boundary constraint is satisfied when the pipe stage allocation is changed.

Figure 36:
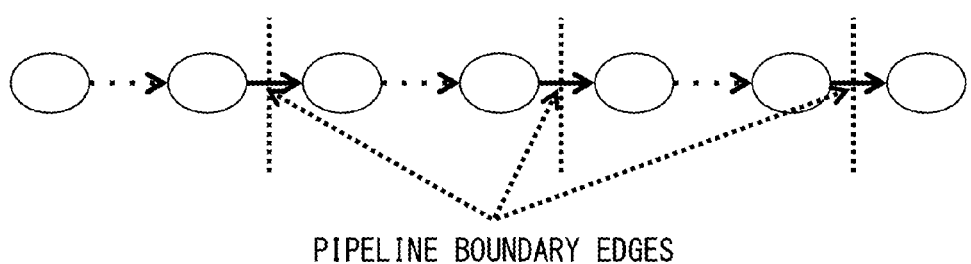
FIG. 36 is a diagram schematically illustrating an example of a data flow graph in which three pipeline boundary are present on one path.

When a pipeline boundary edge is present, at least two pipe stages sandwiching the pipeline boundary are necessary. When multiple pipeline boundary edges are present on one data flow graph path, those pipeline boundary edges on the data flow graph path need to intersect pipeline boundaries different from one another. The minimum necessary number of pipeline stages that is decided based on the pipeline boundary constraint in this manner is called a pipeline stage-number lower limit value. For example, as illustrated in FIG. 36, when three pipeline boundary edges are present on one data flow graph path, the pipeline stage-number lower limit value is 4. The number of pipeline stages decision unit 322 decides the maximum one between the calculated pipeline stage-number lower limit value and a pipeline stage-number based on designation by a circuit designer, which is explained next, as a final pipeline stage-number.

The circuit designer who uses the logic circuit generation device 1 in the embodiment can designate a clock cycle of a logic circuit to be generated, or can designate a pipeline stage-number of a logic circuit to be generated. When the circuit designer designates a clock cycle, a pipeline stage-number calculated from the clock cycle is set as a pipeline stage-number based on the designation by the circuit designer. When the circuit designer designates a pipeline stage-number, the pipeline stage-number is set as a pipeline stage-number based on the designation by the circuit designer.

More specifically, when the circuit designer designates a clock cycle, a pipeline stage-number is calculated such that the maximum signal propagation time of each the pipe stages is the designated clock cycle or less. When the maximum signal propagation time of the entire data flow graph Fdfg before the pipeline division is set as Dtotal and the designated clock cycle is set as Dspec, a calculation value PSspec of the pipeline stage-number is calculated as $PSspec=ceil(Dtotal/Dspec)$.

Moreover, when the circuit designer designates a pipeline stage-number, the designate value is set as PSspec. In any of the cases, when a pipeline stage-number lower limit value is set as PSmin, a final pipeline stage-number PS is calculated as, $PS=max(PSspec, PSmin)$.

The pipeline circuit synthesis unit 323 firstly performs pipe stage initial allocation processing of allocating pipe stages to the instructions so as to satisfy the pipe stage allocation constraint. The allocation of pipe stages to instructions in this processing is referred to as pipe stage initial allocation. This processing is implemented by simple processing in which pipe stages are successively allocated from a forward pipe stage while following the instructions on the data flow graph path in the forward direction (in other words, direction from the input side to output side).

Next, the pipeline circuit synthesis unit 323 performs a pipeline delay equalization process and a pipeline register minimization process. In these processes, processing of locally changing a pipeline boundary decided from the pipe stage allocation (in other words, the pipe stage allocation to one instruction node is changed) is repeated. An instruction node capable of changing the pipe stage allocation while satisfying the pipe stage allocation constraint is limited to a pipe stage output border node and a pipe stage input border node, which are explained next.

The pipe stage output border node indicates such an instruction node that: in a given instruction node, (1) end point pipe stages of all the data flow graph directed edges having the instruction node as a start point are positioned rearward of a pipe stage of the instruction node (in other words, start point pipe stages of the directed edges); and (2) a critical pipeline boundary edge having the instruction node as a start point is not present. The pipe stage output border node can be moved to a rearward pipe stage.

The pipe stage input border node indicates such an instruction node that: in a given instruction node, (1) start point pipe stages of all the data flow graph directed edges having the instruction node as an end point are positioned forward of a pipe stage of the instruction node (in other words, end point pipe stages of the directed edges); and (2) a critical pipeline boundary edge having the instruction node as an end point is not present. The pipe stage input border node can be moved to a forward pipe stage.

An objective function for determining whether an individual local change is "valuable" in the local change processing of a pipeline boundary will be explained. This objective function is defined as follows depending on the objective of the local change processing of a pipeline boundary.

An objective of the pipeline delay equalization processing is to equalize a signal propagation time in each pipe stage, thereby maximizing the operation clock frequency of the entire circuit. Herein, when a maximum signal propagation time in an n-th pipe stage is set to D(n), an objective function $E_1$ of the pipeline delay equalization processing is defined by the following expression.

$E_1 = \Sigma_n D(n)^2$

In other words, the objective function herein is the sum of the squares of the maximum signal propagation time of the individual pipe stage. The pipeline circuit synthesis unit 323 adjusts the pipeline boundary so as to minimize this objective function, thereby equalizing the maximum signal propagation time in each of the pipe stages. In the present embodiment, the maximum signal propagation time D(n) in the pipe stages is calculated based on the circuit delay of the computing element evaluated by the computing element circuit delay and circuit scale evaluation unit 31.

Moreover, an objective of number of pipeline registers minimization processing is to minimize the number of registers that are inserted into data flow graph directed edges that intersect respective pipeline boundaries, thereby minimizing the circuit area. Herein, the bit width of a variable corresponding to a data flow graph directed edge is called a weight of the directed edge. When a total number of weights of data flow graph directed edges that intersect an output side pipeline boundary in an n-th pipe stage is set to R(n), an objective function $E_2$ is defined by the following formula.

$E_2 = \Sigma_n R(n)$

In other words, the objective function herein is the total number of weights of data flow graph directed edges that intersect the pipeline boundaries. The pipeline circuit synthesis unit 323 adjusts the pipeline boundaries so as to minimize this objective function, thereby minimizing the number of pipeline registers.

Further, in addition to the objective functions $E_1$ and $E_2$ in the pipeline delay equalization processing and the number of pipeline registers minimization processing, an evaluation function in the following expression that eventually decides an operation clock frequency of the entire pipeline circuit is defined.

$D_{max} = \max\{D(n) | n \in \text{all the pipe stages}\}$

Local change in the pipeline boundary that increases this $D_{max}$ is prohibited.

Figure 37:
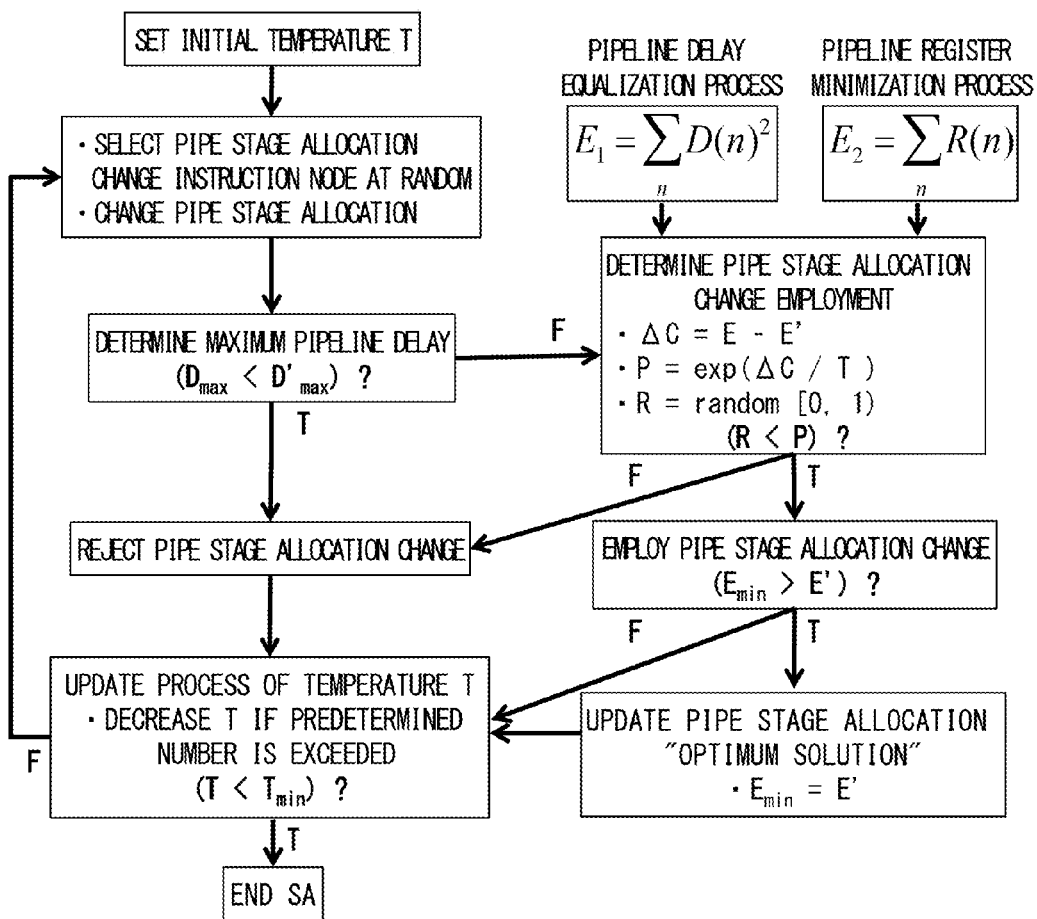
FIG. 37 is a flowchart illustrating a flow of control of local change processing of a pipeline boundary using an SA method, in the logic circuit generation device and the method of the present invention.

In the present embodiment, as a method of controlling the local change processing of a pipeline boundary, a simulated annealing method (in the present description, is also called "SA method") is used. With reference to FIG. 37, the SA method performed by the pipeline circuit synthesis unit 323 will be explained more specifically.

Firstly, a suitable initial value is set to a temperature T that is a parameter in the SA method. The meaning of the temperature T is described later.

Next, out of a pipe stage output border node and a pipe stage input border node, one instruction node is selected at random, and change in allocation of a pipe stage is performed in the movable direction. Herein, as for a maximum pipeline delay $D_{max}$ (described in the foregoing) before the pipe stage allocation change and a maximum pipeline delay $D'_{max}$ after the pipe stage allocation change, if $D_{max} < D'_{max}$, the pipe stage allocation change is rejected, and the pipe stage allocation before the change is recovered. If $D_{max} >= D'_{max}$, the following processing is proceeded.

Next, using the objective function ($E_1$ or $E_2$) defined in the foregoing, a pipe stage allocation change cost $\Delta C$ that is a difference between an objective function value E before the pipe stage allocation change and an objective function value E' after the change is calculated. In other words, $\Delta C = E - E'$ is obtained.

Next, an employment threshold value for stochastically determining whether a pipe stage allocation change is employed or not from the pipe stage allocation change cost AC is defined by the following expression.

$$P = \exp(\Delta C/T)$$

In this expression, T is a parameter that is called "temperature" for controlling the employment probability of the allocation change in the SA method and takes a positive real value.

Next, a random number R not less than 0 and less than 1 is generated for eventually determining whether the pipe stage allocation change is employed, and any of the following is executed in accordance with a relation between P and R.

(1) If R<P, the pipe stage allocation change is employed. Moreover, the minimum evaluation values Emin and E' of the objective functions of the preceding pipe stage allocation are compared, and if $E_{min}$>E', $E_{min}$=E' is set, and an optimum solution of the pipe stage allocation is updated.

(2) If R>=P, the pipe stage allocation change is rejected, and the state before the pipe stage allocation change is recovered.

Note that, in a case of a pipe stage allocation change in where the objective function value decreases, that is, in a case of $\Delta C = E = E' < 0$, an employment threshold value P is more than 1, so that the above-mentioned (1) is certainly executed, and the pipe stage allocation change is employed.

Next, the temperature T is updated. The temperature T is set to a relatively large (that is, "hot") value at an initial stage to increase a probability that a pipe stage allocation change that causes the objective function value to increase is employed, thereby resulting in an easy escape from the local optimum solution of the pipe stage arrangement. As the allocation change processing proceeds, the temperature T is gradually decreased (that is, "cool"), thereby controlling such that the temperature can approach a global optimum solution of the pipe stage arrangement.

The above-mentioned processes from the selection of a node to the update of the temperature T are repeated until the temperature T becomes less than a predetermined value. The above-mentioned optimum solution when the temperature T becomes less than the predetermined value is a result of the pipeline delay equalization processing and the pipeline register minimization process by the SA method.

[RTL Description Output Unit 33]

The pipeline circuit data Fplc outputted by the pipeline boundary arrangement unit 32 is then inputted into the RTL description output unit 33. The logic circuit generation device 1 in the present embodiment outputs the generated logic circuit in the format of the RTL description. Therefore, the RTL description output unit 33 converts the inputted pipeline circuit data Fplc into the RTL description. The representation of a logic circuit by the RTL description is a publicly known technique, and thus, a specific explanation thereof is omitted herein. Meanwhile, the pipeline circuit data Fplc is a data flow graph as described above, and the data flow graph corresponds to the circuit structure of the logic circuit, so that it is possible to represent this in RTL description without any change. Note that, in order to attain the objective of the present invention, the output form of the logic circuit generation device 1 is not limited to the form of the RTL description, but may be any suitable form that describes the logic circuit. In other words, the logic circuit generation device 1 in the present invention is generally provided with a logic circuit description output unit, and the logic circuit description output unit in the present embodiment is the RTL description output unit 33 that outputs the RTL description.

The RTL description that is converted by the RTL description output unit 33 is outputted as the logic circuit description D, from the logic circuit generation device 1. The foregoing is the explanation of the units of the logic circuit generation device 1 in the present embodiment.

Next, with reference to FIG. 38 to FIG. 44, some examples of embodiments of the logic circuit generation device 1 in the present invention will be explained.

Figure 38:
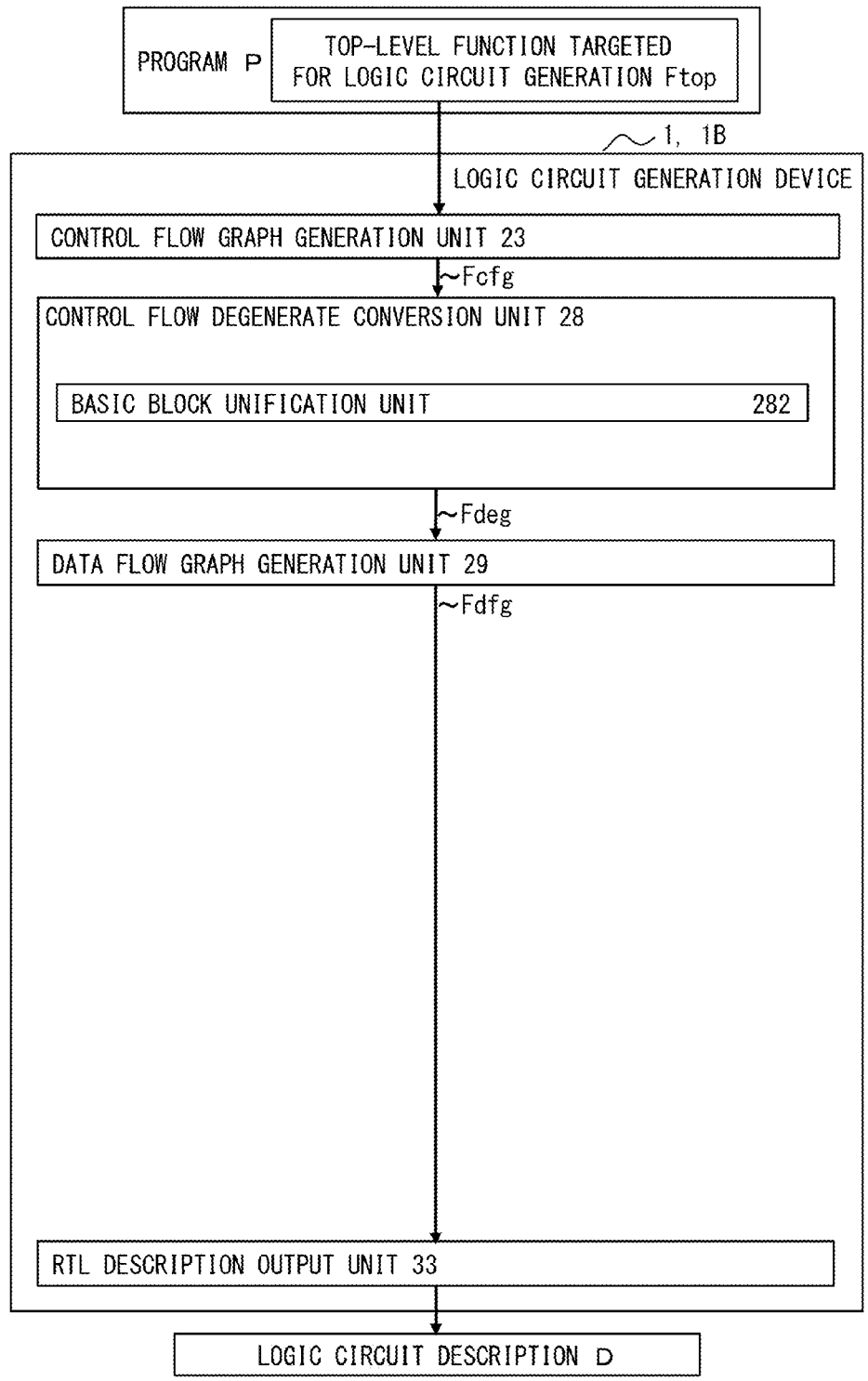
FIG. 38 is a diagram illustrating one embodiment of a logic circuit generation device according to the present invention.

A logic circuit generation device 1B in an embodiment illustrated in FIG. 38 is provided with the control flow graph generation unit 23, the control flow degenerate conversion unit 28, the data flow graph generation unit 29, and the RTL description output unit (logic circuit description output unit) 33. The control flow degenerate conversion unit 28 includes the basic block unification unit 282. The logic circuit generation device 1B in this embodiment receives an input of the program P that is described in a static single assignment form including no function call instruction and no loop processing part, and no array access instruction that uses a variable as an index, and outputs the logic circuit description D. An input signal and an output signal of the logic circuit can be explicitly designated in the program P.

Figure 39:
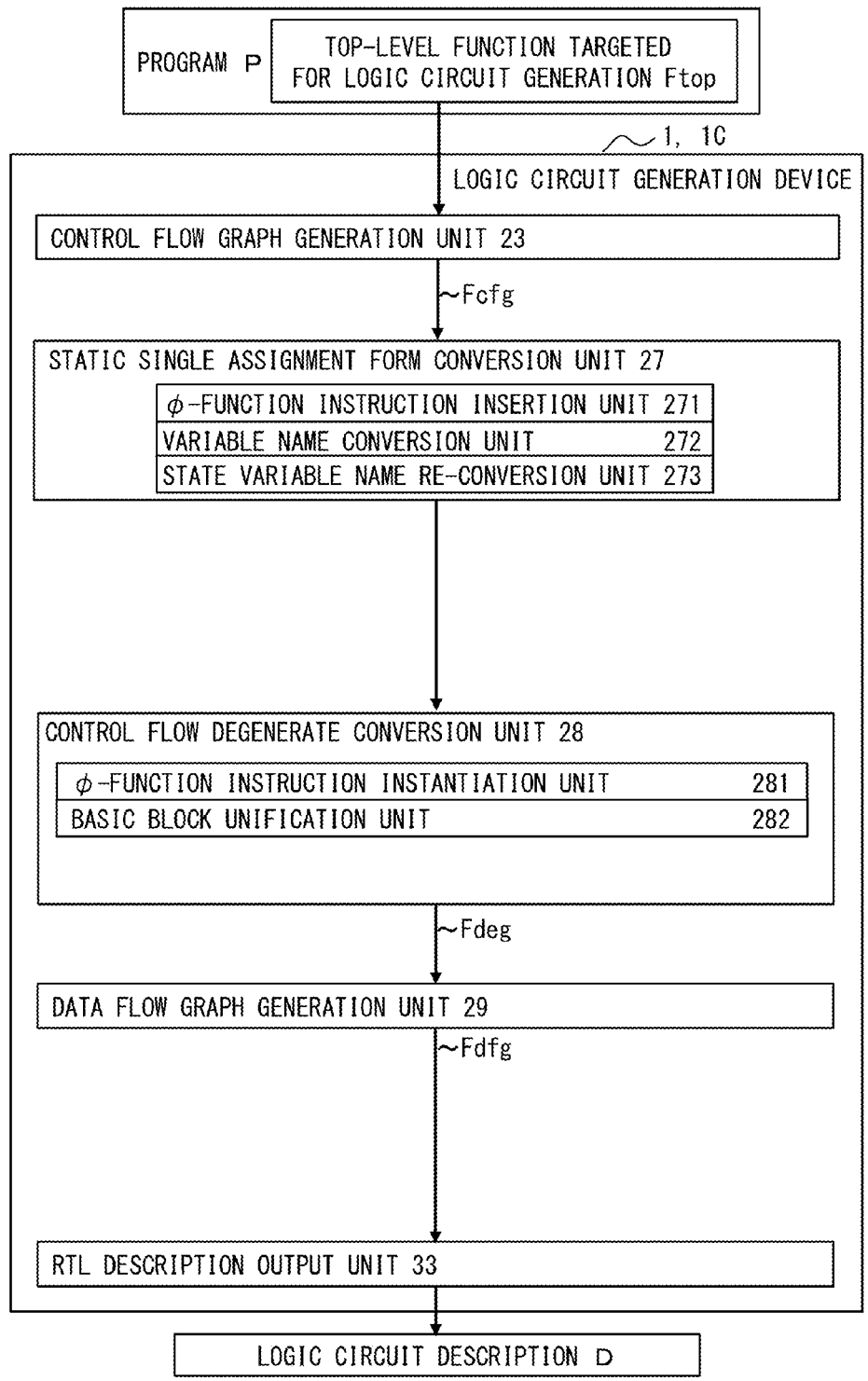
FIG. 39 is a diagram illustrating one embodiment of a logic circuit generation device according to the present invention.

The logic circuit generation device 1C in an embodiment illustrated in FIG. 39 is further provided with the static single assignment form conversion unit 27, in addition to the embodiment of FIG. 38. Moreover, the control flow degenerate conversion unit 28 further includes a φ-function instruction instantiation unit 281. The logic circuit generation device 1C according to the embodiment coverts the inputted program P into a static single assignment form in the inside thereof, so that the program P that the logic circuit generation device 1C receives as an input is not necessarily described in a static single assignment form.

Figure 40:
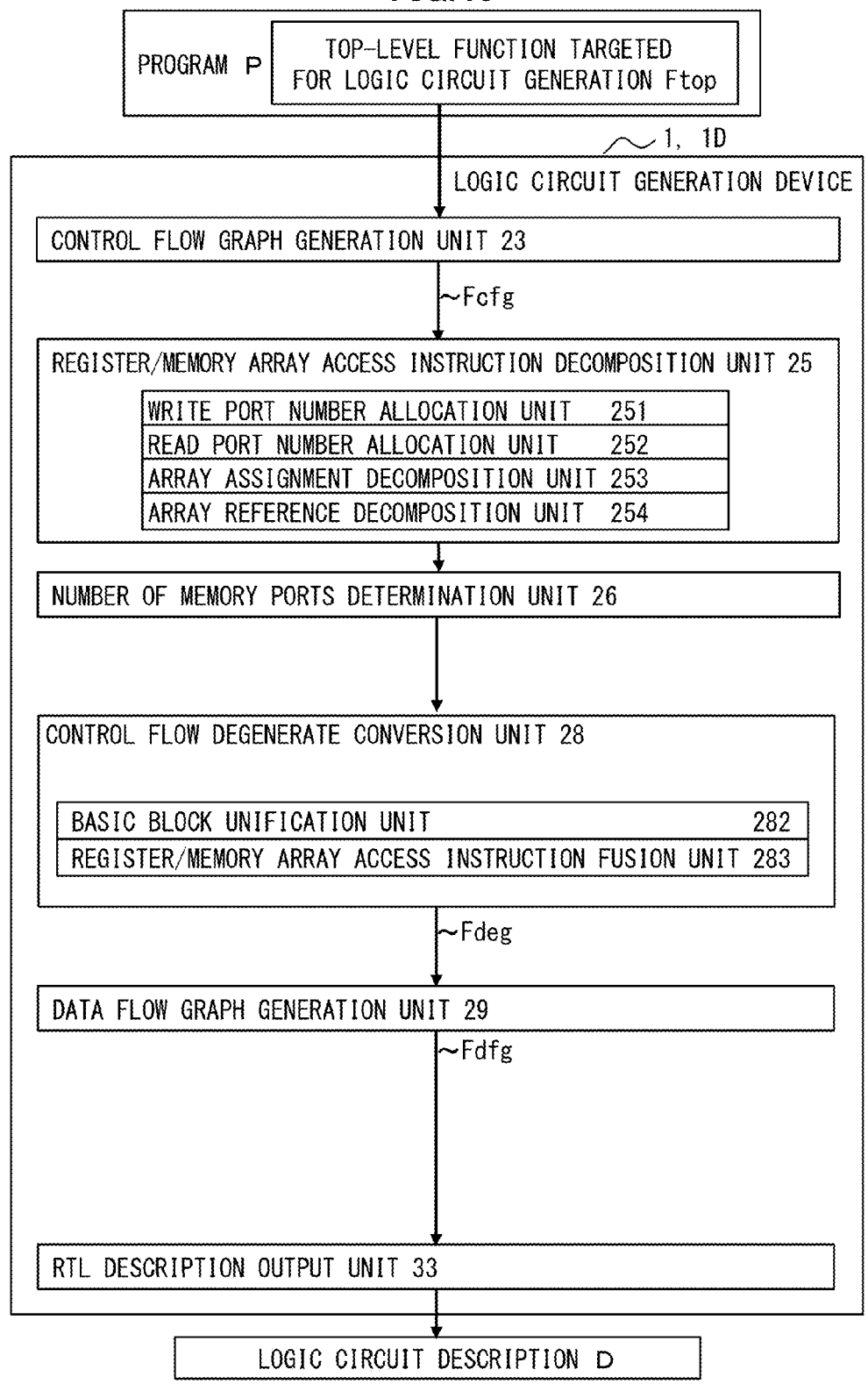
FIG. 40 is a diagram illustrating one embodiment of a logic circuit generation device according to the present invention.

A logic circuit generation device 1D in an embodiment illustrated in FIG. 40 is further provided with the register/memory array access instruction decomposition unit 25 and the number of memory ports determination unit 26, in addition to the embodiment of FIG. 38. Moreover, the control flow degenerate conversion unit 28 further includes the register/memory array access instruction fusion unit 283. The logic circuit generation device 1D according to the embodiment can receive an input of the program P including an array access instruction that uses a variable as an index, and can generate the logic circuit description D that represents a logic circuit including a multi-port register file and a multi-port memory.

Figure 41:
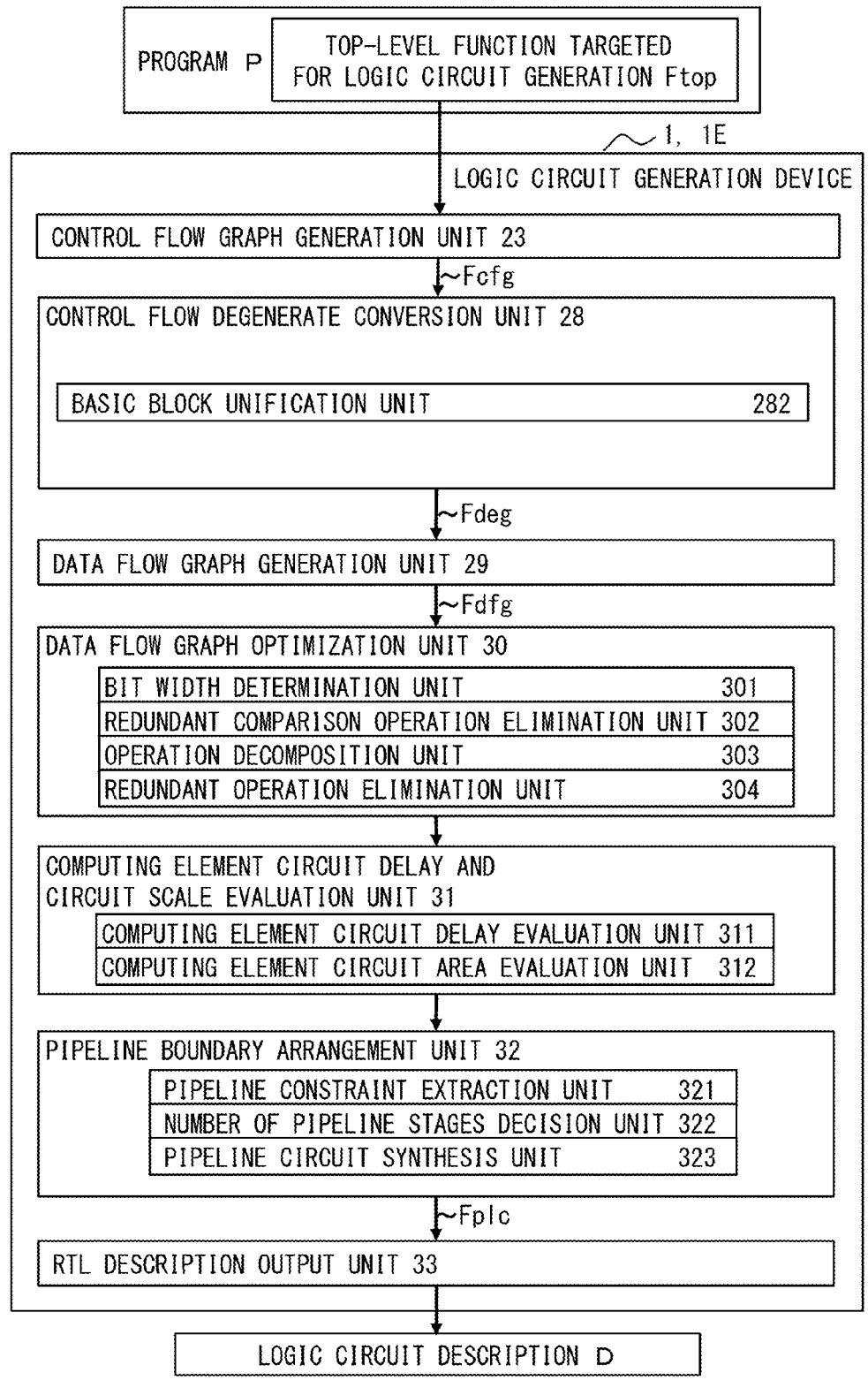
FIG. 41 is a diagram illustrating one embodiment of a logic circuit generation device according to the present invention.

A logic circuit generation device 1E in an embodiment illustrated in FIG. 41 is further provided with the data flow graph optimization unit 30, the computing element circuit delay and circuit scale evaluation unit 31, and the pipeline boundary arrangement unit 32, in addition to the embodiment of FIG. 38. The logic circuit generation device 1E according to the embodiment can output an optimized pipeline circuit description. Moreover, the logic circuit generation device 1E according to the embodiment can calculate estimations of the circuit delay and the circuit scale of a logic circuit to be generated.

Figure 42:
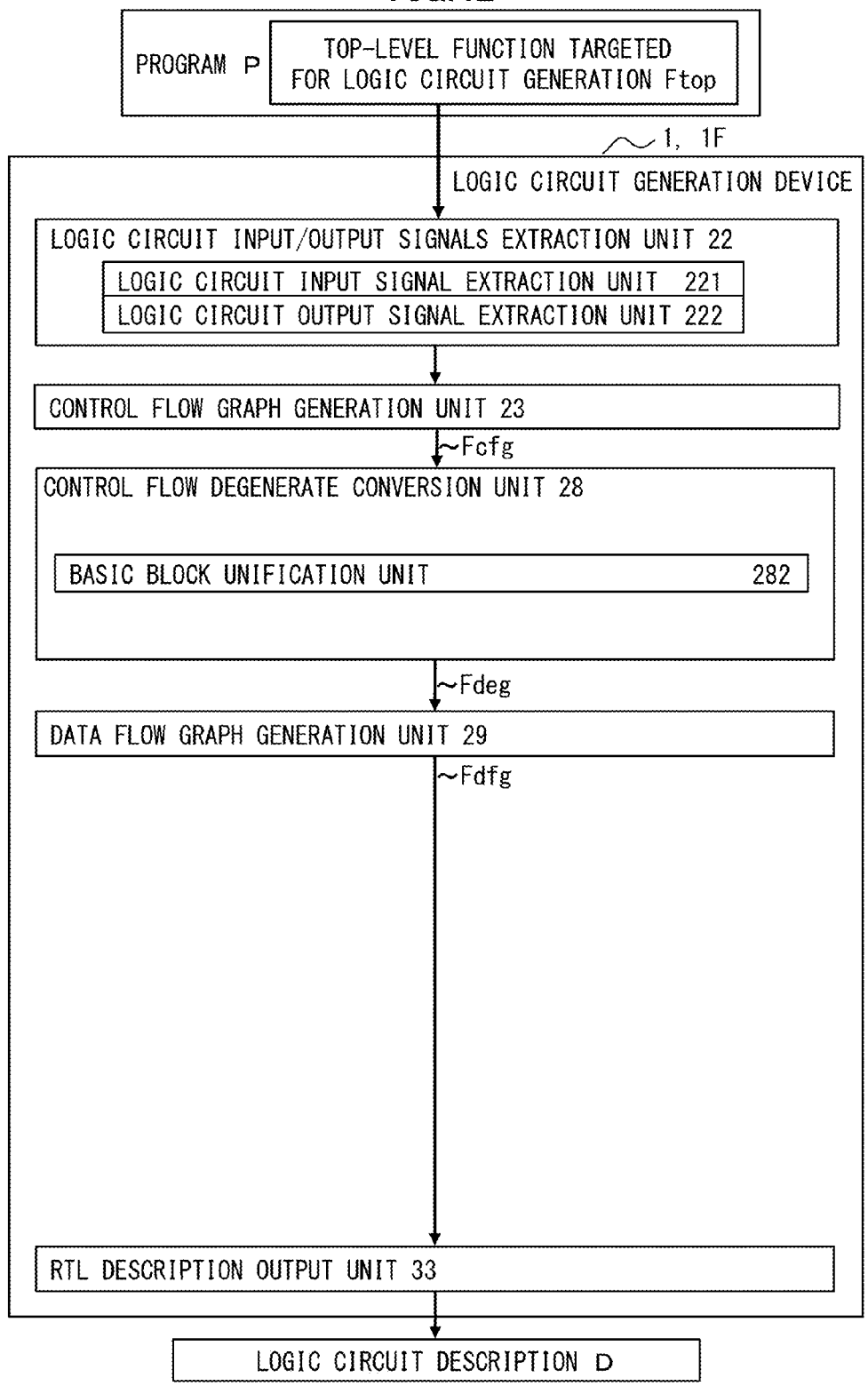
FIG. 42 is a diagram illustrating one embodiment of a logic circuit generation device according to the present invention.

A logic circuit generation device 1F in an embodiment illustrated in FIG. 42 is further provided with the logic circuit input/output signals extraction unit 22, in addition to the embodiment of FIG. 38. The logic circuit generation device 1F according to the embodiment extracts an input signal and an output signal of a logic circuit to be generated, and thus, these signals need not be explicitly designated from the outside of the logic circuit generation device 1F.

Figure 43:
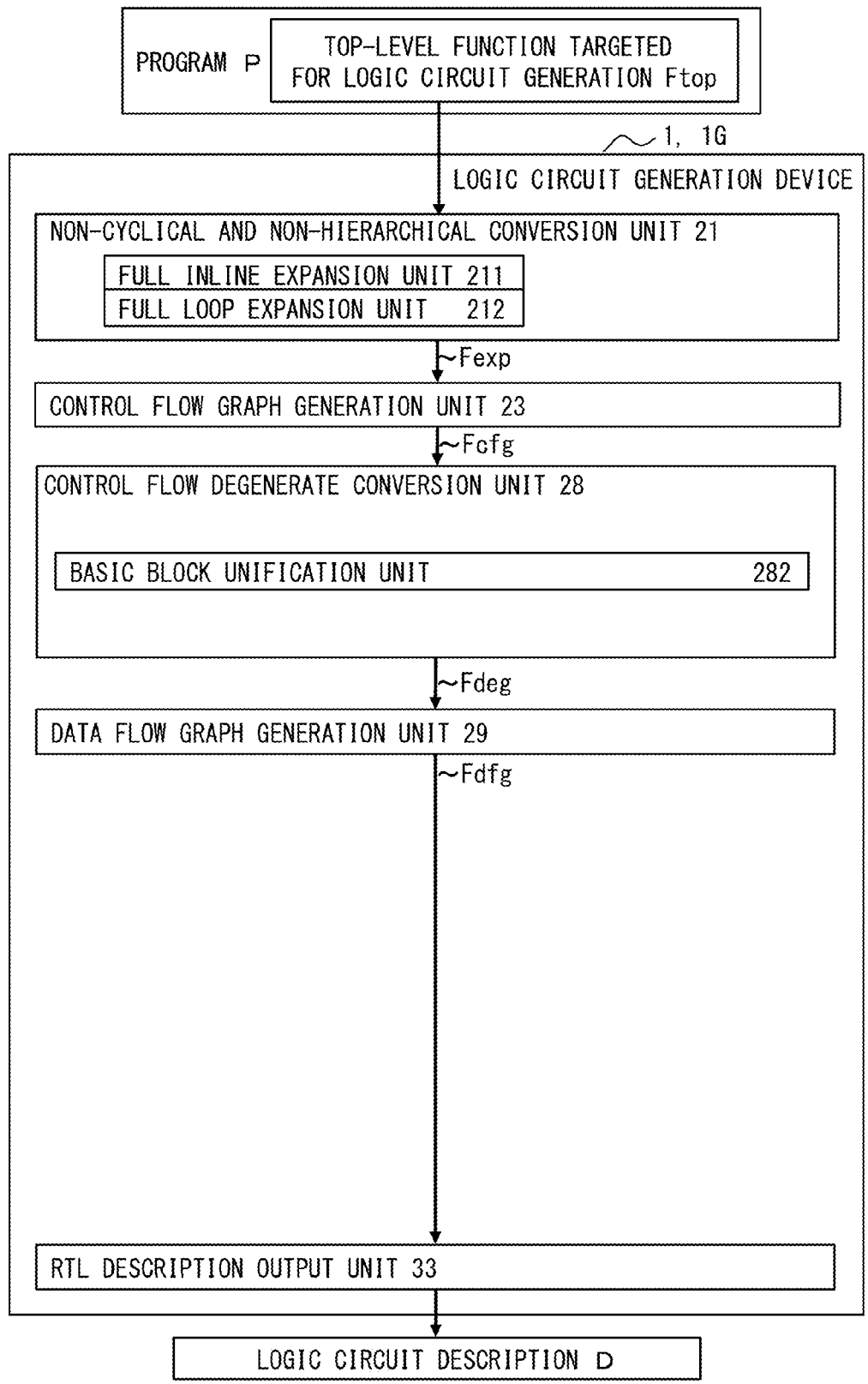
FIG. 43 is a diagram illustrating one embodiment of a logic circuit generation device according to the present invention.

A logic circuit generation device 1G in an embodiment illustrated in FIG. 43 is further provided with the non-cyclical and non-hierarchical conversion unit 21, in addition to the embodiment of FIG. 38. The logic circuit generation device 1G according to the embodiment coverts the top-level function Ftop included in the inputted program P into the non-cyclical type lowermost function Fexp in the inside thereof, and thus, the top-level function Ftop included in the inputted program P need not be a necessarily non-cyclical type lowermost function.

Figure 44:
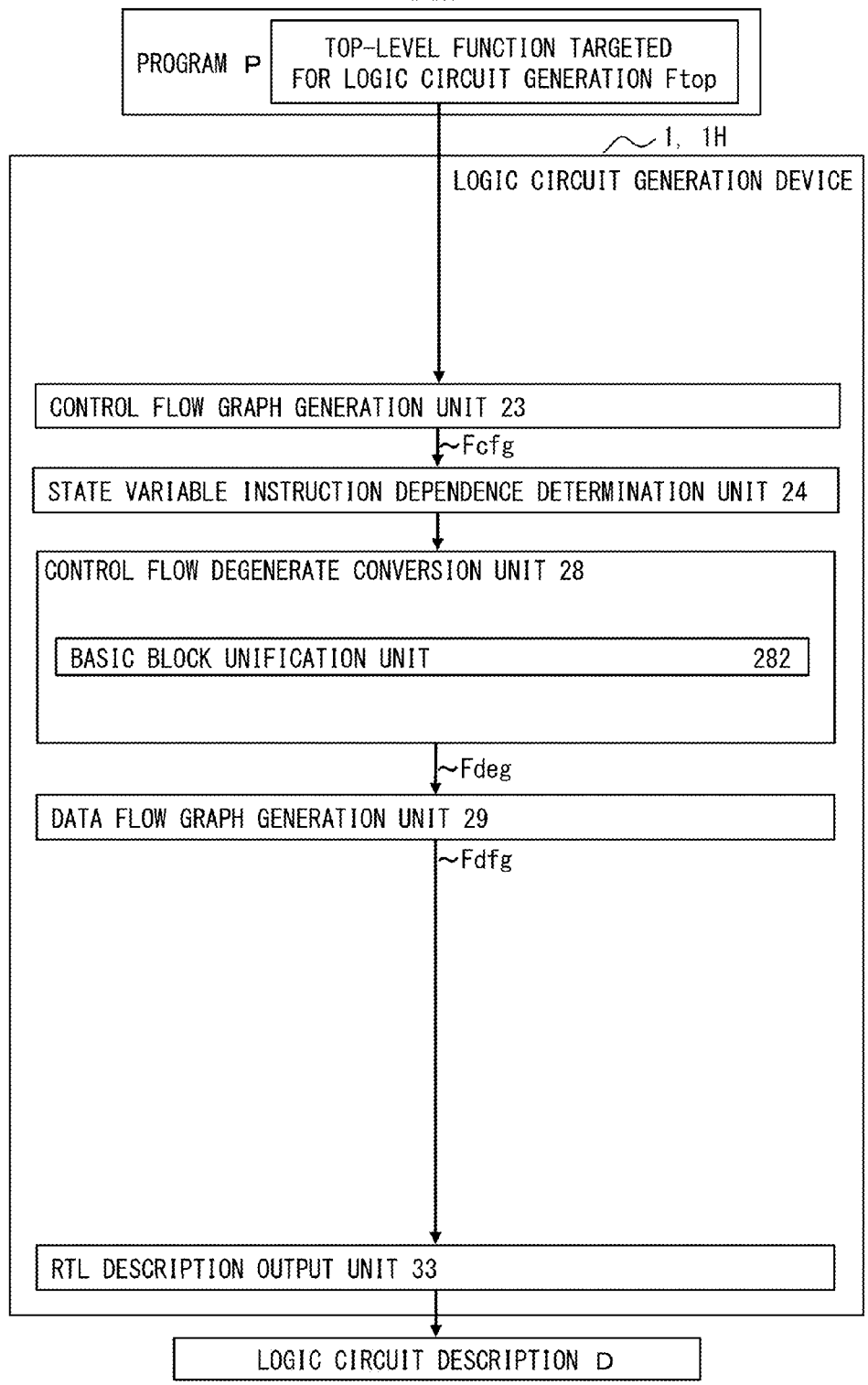
FIG. 44 is a diagram illustrating one embodiment of a logic circuit generation device according to the present invention.

A logic circuit generation device 1H in an embodiment illustrated in FIG. 44 is further provided with the state variable instruction dependence determination unit 24, in addition to the embodiment of FIG. 38. The logic circuit generation device 1H according to the embodiment stops processing of generating a logic circuit description, when the program P in which an assignment instruction, a reference instruction, and an assignment instruction are continuously executed for the same state variable in this order is inputted.

REFERENCE SIGNS LIST 1 logic circuit generation device
21 non-cyclical and non-hierarchical conversion unit
211 full inline expansion unit
212 full loop expansion unit
22 logic circuit input/output signals extraction unit
221 logic circuit input signal extraction unit
222 logic circuit output signal extraction unit
23 control flow graph generation unit
24 state variable instruction dependence determination unit
25 memory array access instruction decomposition unit
251 write port number allocation unit
252 read port number allocation unit
253 array assignment instruction decomposition unit
254 array reference instruction decomposition unit
26 number of memory ports determination unit
27 static single assignment form conversion unit
271 φ-function instruction insertion unit
272 variable name conversion unit
273 state variable name re-conversion unit
28 control flow degenerate conversion unit
281 φ-function instruction instantiation unit
282 basic block unification unit
283 register/memory array access instruction fusion unit
29 data flow graph generation unit
30 data flow graph optimization unit
301 bit width determination unit
302 redundant comparison operation elimination unit
303 operation decomposition unit
304 redundant operation elimination unit
31 circuit scale evaluation unit
311 computing element circuit delay evaluation unit
312 computing element circuit area evaluation unit
32 pipeline boundary arrangement unit
321 pipeline constraint extraction unit
322 number of pipeline stages decision unit
323 pipeline circuit synthesis unit
33 RTL description output unit
Fdeg control flow degenerate program
Fdfg data flow graph
Fplc pipeline circuit data
Ftop top-level function
Fcfg control flow graph
Fexp non-cyclical type lowermost function

The invention claimed is:

1. A logic circuit generation device that receives a program in which an operation description, indicating a flow of a series of processes of hardware for a circuit design, is written using a procedural software programming language, the program including a top-level function of a logic circuit generation target, and generates a logic circuit description, the logic circuit generation device comprising: a processor,
wherein the processor is configured to execute:
a non-cyclical and non-hierarchical conversion process including:
a full inline expansion process that, when the top-level function includes a function call instruction, subjects each function call instruction to inline expansion to convert the top-level function into a lowermost function including no function call instruction; and
a full loop expansion process that, when the lowermost function converted by the full inline expansion process includes a loop processing part of a fixed repeat count, subjects each loop processing part of the fixed repeat count to loop expansion to convert the lowermost function into a non-cyclical type lowermost function including no loop processing part,
a control flow graph generation process that generates a control flow graph from the top-level function;
a control flow degeneration process that generates a control flow degenerated program that is a program having a control flow which is degenerated by removing all condition branch instructions from the control flow graph that includes, for each variable, a single assignment instruction to the each variable
a data flow graph generation process that generates a data flow graph from the control flow degenerated program, by using each instruction in the control flow degenerated program as a node, and adding a directed edge from an assignment instruction to each variable to an instruction that refers to the variable; and
a logic circuit description output process that generates the logic circuit description expressing a sequential circuit which has wiring of a logic circuit corresponding to the directed edge of the data flow graph, and a computing element of the logic circuit corresponding to the node of the data flow graph,
wherein a program inputted into the logic circuit generation device is converted into a non-cyclical type lowermost function by the non-cyclical and non-hierarchical conversion process, and then is inputted into the control flow graph generation process,
wherein
the program inputted into the logic circuit generation device comprises a data flow lacking a timing definition among elements of the sequential circuit and includes a state variable expressing a state of the sequential circuit representing a local variable of a high-order hierarchy function calling the top-level function or a static variable,
wherein the current state of the sequential circuit corresponds to a value reference of the state variable occurring before its assignment instruction, and
wherein the next state of the sequential circuit corresponds to a value reference of the state variable occurring after its assignment instruction.

2. The logic circuit generation device according to claim 1,
wherein the processor is further configured to execute a static single assignment form conversion process that converts, when the top-level function is not of a static single assignment form which includes, for each variable, only a single assignment instruction to the each variable, the control flow graph into the static single assignment form, before the control flow degenerated process, wherein the static single assignment form conversion process unit includes:
- a φ-function instruction insertion process that inserts, into a position in the control flow graph where a plurality of value definitions of the same variable join, a φ-function instruction that selects a variable definition on an actually executed path out of all the variable definitions that join at the position;
- a variable name conversion process that converts, by converting names of the variables included in the control flow graph to other names different among the assignment instructions to the variables, the control flow graph into a static single assignment form in which only a single assignment instruction is included for each variable after the name conversion; and
- a state variable name re-conversion process that re-converts, for the state variable after the name conversion, the variable names so as to match a variable name in a start point block and a variable name reaching an end point block of the control flow graph, and the control flow degenerated process includes a φ-function instruction instantiation process that converts the φ-function instruction into a specific operation instruction.

3. The logic circuit generation device according to claim 1, wherein
the program to be inputted includes an attribute description for giving an attribute to each variable, the attribute including:
- a bit width attribute that designates a bit width of data of a variable;
- a register attribute that designates a value of a variable to be held in a register; and
- a memory attribute that designates a value of an array element of an array variable to be held in a memory, and wherein the processor is further configured to generate the logic circuit description including a sequential circuit in which a state is represented using the variable to which the register attribute or the memory attribute is given as the state variable.

4. The logic circuit generation device according to claim 3, wherein the processor is further configured to execute
- a bit width determination process that calculates, for variables included in the data flow graph, a bit width of each of the variables, from a bit width of a variable and/or a constant to be referred in an assignment instruction to the variable and a type of operation to be executed in the assignment instruction;
- a computing element circuit delay evaluation process that calculates a signal propagation delay time of a computing element, based on the bit width calculated for the variable included in the data flow graph; and
- a pipeline boundary arrangement process that includes a pipeline constraint extraction process and a pipeline stage count decision process, wherein
the pipeline constraint extraction process adds a pipeline boundary attribute to a directed edge between a computing element that executes an assignment instruction to the state variable in the data flow graph and a computing element that executes a reference instruction to the state variable, and the pipeline stage count decision process decides the number of pipeline stages that is used for generating a circuit description of a clock synchronous type pipeline circuit, in accordance with a pipeline stage-number lower limit value that is a minimum necessary number of pipeline stages determined by a constraint based on the pipeline boundary attribute, and the number of pipeline stages that is calculated from a designated clock cycle or the number of pipeline stages that is designated in advance.

5. The logic circuit generation device according to claim 1, wherein the processor is further configured to execute
- a logic circuit input signal extraction process that extracts an input signal of a circuit to be described by the circuit description, from an argument and a global variable of the top-level function; and
- a logic circuit output signal extraction process that extracts an output signal of the circuit to be described by the circuit description, from the argument, a return value, and the global variable of the top-level function.

6. The logic circuit generation device according to claim 1, wherein
in a case where the function call instruction is not fully expanded even with a predetermined number of repetitions of the inline expansion of the inputted function, the full inline expansion process is configured to determine that the function is inconvertible into a lowermost function, and terminates the processing, when the inputted function includes a loop processing part in which a repeat count is not a constant, the full loop expansion process is configured to determine that the function is inconvertible into a non-cyclical type lowermost function, and terminates the processing, and wherein the processor is further configured to stop processing of generating a logic circuit description when the full inline expansion process terminates the processing or the full loop expansion process terminates the processing.

7. The logic circuit generation device according to claim 1, wherein the processor is further configured to execute a state variable instruction dependence determination process that determines whether there is an "μl-formed dependence" case, in the control flow graph, where an assignment instruction, a reference instruction, and an assignment instruction are continuously executed in this order for the same state variable, wherein the processor is further configured to stop processing of generating a logic circuit description when the state variable instruction dependence determination process makes "ill-formed dependence" determination.

8. The logic circuit generation device according to claim 1, wherein the processor is further configured to execute a register/memory array access instruction decomposition process including:
- an array assignment instruction decomposition process that, when the top-level function includes an array assignment instruction that is a write processing instruction to an array variable, adds a write data variable and a write address variable to the control flow graph, for each array variable, and decomposes each array assignment instruction into an instruction to assign an assignment value to an array element to the write data variable, an instruction to assign an array index value to the write address variable, and an instruction to assign a value of the write data variable to an array element decided by using the write address variable as an array index; and an array reference instruction decomposition process that, when the top-level function includes an array reference instruction that is a read processing instruction from an array variable, adds a read address variable to the control flow graph for each array variable, and decomposes each array reference instruction into an instruction to assign an array index value to the read address variable, and an instruction to refer to an array element decided by using the read address variable as an array index, wherein a memory for holding data of array elements in the logic circuit is configured such that the write data variable corresponds to a write data port of the memory, the write address variable corresponds to a write address port of the memory, and the read address variable corresponds to a read address port of the memory, and the control flow graph generated by the control flow graph generation process is processed by the register/memory array access instruction decomposition process, and then is processed by the control flow degenerated process.

9. The logic circuit generation device according to claim 8, wherein the register/memory array access instruction decomposition process further includes:

a write port number allocation process that allocates, as for the array assignment instructions to each array variable in the control flow graph, a maximum value of the count of executions of array assignment instructions to the array variable from a start point block over the array assignment instructions, as a write port number, to the array assignment instruction; and a read port number allocation process that allocates, as for the array reference instructions to the array variable in the control flow graph, a maximum value of the count of executions of array reference instructions to the array variable from the start point block over the array reference instructions, as a read port number, to the array reference instruction, the array assignment instruction decomposition process adds the write data variable and the write address variable for each array variable, for every write port number to the control flow graph, and adds the read address variable for every read port number to the control flow graph, and the memory for holding data of array elements has write ports the number of which is equal to the number of the write port numbers allocated to the assignment instruction of the array variable, and read ports the number of which is equal to the number of the read port numbers allocated to the reference instruction of the array variable.

10. The logic circuit generation device according to claim 9, wherein the processor is further configured to execute a memory port count determination process that determines whether the number of the write port numbers allocated by the write port number allocation process is equal to or less than a threshold value of the number of write memory ports set in advance, and determines whether the number of the read port numbers allocated by the read port number allocation process is equal to or less than a threshold value of the number of read memory ports set in advance, wherein the processor is further configured to stop the processing of generating a logic circuit description when the number of the write port numbers is more than the threshold value of the number of the write memory ports set in advance, or the number of the read port numbers is more than the threshold value of the number of the read memory ports set in advance.

11. A logic circuit generation method for using a logic circuit generation device that receives a program in which an operation description, indicating a flow of a series of processes of hardware for a circuit design, is written using a procedural software programming language, the program including a top-level function of a logic circuit generation target, and generates a logic circuit description, wherein the logic circuit generation device includes: a processor, the method comprising:

generating a control flow graph from the top-level function generating a control flow degenerated program that is a program having a control flow which is degenerated by removing all condition branch instructions from the control flow graph that includes, for each variable, a single assignment instruction to the each variable generating a data flow graph from the control flow degenerated degenerate program, by using each instruction in the control flow degenerated program as a node, and adding a directed edge from an assignment instruction to each variable to an instruction that refers to the variable;

generating the logic circuit description expressing a sequential circuit which has wiring of a logic circuit corresponding to the directed edge of the data flow graph, and a computing element of the logic circuit corresponding to the node of the data flow graph, and a non-cyclical and non-hierarchical conversion step before the step of generating the control flow graph, when the top-level function includes a function call instruction, and/or the top-level function includes a loop processing part of a fixed repeat count, wherein the non-cyclical and non-hierarchical conversion step includes:

a full inline expansion step of converting, by subjecting each function call instruction to inline expansion, the top-level function into a lowermost function including no function call instruction; and a full loop expansion step of converting, by subjecting each loop processing part of the fixed repeat count to loop expansion, the lowermost function into a non-cyclical type lowermost function including no loop processing part, wherein, the program inputted into the logic circuit generation device comprises a data flow lacking a timing definition among elements of the sequential circuit and includes a state variable expressing a state of the sequential circuit representing a local variable of a high-order hierarchy function calling the top-level function or a static variable, wherein the current state of the sequential circuit corresponds to a value reference of the state variable occurring before its assignment instruction, and wherein the next state of the sequential circuit corresponds to a value reference of the state variable occurring after its assignment instruction.

12. The logic circuit generation method according to claim 11, further comprising a static single assignment form conversion step of converting, when the top-level function is not of a static single assignment form which includes, for each variable, only a single assignment instruction to the each variable, the control flow graph into the static single assignment form, before the step of generating a control flow degenerated program, wherein the static single assignment form conversion step includes:
a φ-function instruction insertion step of inserting, into a position in the control flow graph where a plurality of value definitions of the same variable join, a φ-function instruction that selects a variable definition on an actually executed path out of all the variable definitions that join at the position;
a variable name conversion step of converting, by converting names of the variables included in the control flow graph to other names different among the assignment instructions to the variables, the control flow graph into a static single assignment form in which only a single assignment instruction is included for each variable after the name conversion; and
a state variable name re-conversion step of re-converting, for the state variable after the name conversion, the variable names so as to match a variable name in a start point block and a variable name reaching an end point block of the control flow graph, and
wherein the step of generating the control flow degenerated program further includes a φ-function instruction instantiation step of converting the φ-function instruction into a specific operation instruction.

13. The logic circuit generation method according to claim 11, wherein
the program to be inputted includes an attribute description for giving an attribute to each variable, the attribute including:
a bit width attribute that designates a bit width of data of a variable;
a register attribute that designates a value of a variable to be held in a register; and
a memory attribute that designates a value of an array element of an array variable to be held in a memory, and
wherein the method generates a logic circuit description including a sequential circuit in which a state is represented using the variable to which the register attribute or the memory attribute is given as the state variable.

14. The logic circuit generation method according to claim 13, wherein the method further comprising:
a bit width determination step of calculating, for variables included in the data flow graph, a bit width of each of the variables, from a bit width of a variable and/or a constant to be referred in an assignment instruction to the variable and a type of operation to be executed in the assignment instruction;
a computing element circuit delay evaluation step of calculating a signal propagation delay time of a computing element, based on the bit width calculated for the variable included in the data flow graph; and
a pipeline boundary arrangement step including a pipeline constraint extraction step and a pipeline stage count decision step, wherein
the pipeline constraint extraction step is to add a pipeline boundary attribute to a directed edge between a computing element that executes an assignment instruction to the state variable in the data flow graph and a computing element that executes a reference instruction to the state variable, and
the pipeline stage count decision step is to decide the number of pipeline stages that is used for generating a circuit description of a clock synchronous type pipeline circuit, in accordance with a pipeline stage-number lower limit value that is a minimum necessary number of pipeline stages determined by a constraint based on the pipeline boundary attribute, and the number of pipeline stages that is calculated from a designated clock cycle or the number of pipeline stages that is designated in advance.

15. The logic circuit generation method according to claim 11, wherein the method further comprising:
before the step of generating the control flow graph,
a logic circuit input signal extraction step of extracting an input signal of a circuit to be described by the circuit description, from an argument and a global variable of the top-level function; and
a logic circuit output signal extraction step of extracting an output signal of a circuit to be described in the circuit description, from argument, a return value, and the global variable of the top-level function.

16. The logic circuit generation method according to claim 11, wherein
in a case where the function call instruction is not fully expanded even with a predetermined number of repetitions of the inline expansion of the inputted function, the full inline expansion step is configured to determine that the function is inconvertible into a lowermost function, and terminates the processing,
when the inputted function includes a loop processing part in which a repeat count is not a constant, the full loop expansion step is configured to determine that the function is inconvertible into a non-cyclical lowermost function, and terminates the processing, and
when the processing is terminated in the full inline expansion step or when the processing is terminated in the full loop expansion step, the method stops the processing of generating a logic circuit description.

17. The logic circuit generation method according to claim 11, wherein the method further comprising a state variable instruction dependence determination step of determining whether there is an "ill-formed dependence" case, in the control flow graph, where an assignment instruction, a reference instruction, and an assignment instruction are continuously executed in this order for the same state variable, wherein
the method stops processing of generating a logic circuit description when "μl-formed dependence" determination is made in the state variable instruction dependence determination step.

18. The logic circuit generation method according to claim 11, wherein the method further comprising a register/memory array access instruction decomposition step of decomposing before the step of generating the control flow degenerated program step, when the top-level function includes array assignment instructions that are write processing instructions to an array variable and/or when the top-level function includes array reference instructions that are read processing instructions from an array variable, the array assignment instructions and/or the array reference instructions of the control flow graph, wherein
the register/memory array access instruction decomposition step includes:
an array assignment instruction decomposition step of adding a write data variable and a write address variable to the control flow graph for each array variable, and decomposing each array assignment instruction into an instruction to assign an assignment value to an array element to the write data variable, an instruction to assign an array index value to the write address variable, and an instruction to assign a value of the write data variable to an array element decided by using the write address variable as an array index; and an array reference instruction decomposition step of adding a read address variable to the control flow graph, for each array variable, and decomposing each array reference instruction into an instruction to assign an array index value to the read address variable, and an instruction to refer to an array element decided by using the read address variable as an array index, and a memory for holding data of array elements in the logic circuit is configured such that the write data variable corresponds to a write data port of the memory, the write address variable corresponds to a write address port of the memory, and the read address variable corresponds to a read address port of the memory.

19. The logic circuit generation method according to claim 18, wherein the register/memory array access instruction decomposition step further includes:

a write port number allocation step of allocating, as for the array assignment instructions to each array variable in the control flow graph, a maximum value of the count of executions of array assignment instructions to the array variable from a start point block over the array assignment instructions, as a write port number, to the array assignment instruction; and a read port number allocation step of allocating, as for the array reference instructions to the array variable in the control flow graph, a maximum value of the count of executions of array reference instructions to the array variable from the start point block over the array reference instructions, as a read port number, to the array reference instruction, the array assignment instruction decomposition step includes a step of adding the write data variable and the write address variable for each array variable, for every write port number to the control flow graph, and adds the read address variable for every read port number to the control flow graph, and a description of the memory for holding data of array elements having write ports the number of which is equal to the number of the write port numbers allocated to the assignment instruction of the array variable, and read ports the number of which is equal to the number of the read port numbers allocated to the reference instruction of the array variable is generated.

20. The logic circuit generation method according to claim 19, wherein the method further comprising a memory port count determination step, wherein the memory port count determination step further includes:

a step of determining whether the number of the write port numbers allocated in the write port number allocation step is equal to or less than a threshold value set in advance; and a step of determining whether the number of the read port numbers allocated in the read port number allocation step is equal to or less than a threshold value set in advance; and wherein the method stops the processing of generating a logic circuit description when the number of the write port numbers or the number of the read ports exceeds a threshold value.

21. A non-transitory computer-readable storage medium that stores therein a logic circuit generation computer program for causing a computer to execute each step in the logic circuit generation method according to claim 11.

* * * * *